(12) United States Patent
Fukano

(10) Patent No.: US 6,917,032 B2
(45) Date of Patent: *Jul. 12, 2005

(54) SEMICONDUCTOR PHOTO-DETECTOR, SEMICONDUCTOR PHOTODETECTION DEVICE, AND PRODUCTION METHODS THEREOF

(75) Inventor: Hideki Fukano, Shinjuku-ku (JP)

(73) Assignee: Nippon Telegraph and Telephone Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/702,577

(22) Filed: Nov. 5, 2003

(65) Prior Publication Data

US 2004/0144912 A1 Jul. 29, 2004

Related U.S. Application Data

(62) Division of application No. 10/005,705, filed on Dec. 4, 2001, now Pat. No. 6,770,945, which is a division of application No. 09/184,218, filed on Nov. 2, 1998, now Pat. No. 6,353,250.

(30) Foreign Application Priority Data

| Nov. 7, 1997 | (JP) | 9-305148 |
| Nov. 7, 1997 | (JP) | 9-305149 |
| Dec. 3, 1997 | (JP) | 9-332587 |
| Jan. 5, 1998 | (JP) | 10-000098 |
| Jan. 7, 1998 | (JP) | 10-001466 |
| Jan. 20, 1998 | (JP) | 10-008236 |
| Jul. 8, 1998 | (JP) | 10-192793 |

(51) Int. Cl.$^7$ .................... H01L 31/00; H01L 31/0232
(52) U.S. Cl. .................... 250/214.1; 257/432; 257/446; 257/499; 385/49; 385/51
(58) Field of Search .................... 250/214.1; 257/98, 257/432, 466, 449; 385/14, 48, 49, 51, 88, 89, 92, 94, 129–131

(56) References Cited

U.S. PATENT DOCUMENTS

| 4,784,452 A | * 11/1988 | Hodge et al. | 385/48 |
| 6,770,945 B2 | * 8/2004 | Fukano | 257/432 |

* cited by examiner

*Primary Examiner*—David Porta
*Assistant Examiner*—Suezu Ellis
(74) *Attorney, Agent, or Firm*—Ostrolenk, Faber, Gerb & Soffen LLP

(57) ABSTRACT

A semiconductor photodetection device includes a light incident facet for receiving light from an optical waveguide. Light received at the light incident facet is refracted through a photo-absorption layer to register photonic events. A material may be introduced between the optical waveguide and the light incident facet to improve responsiveness of the device. The light incident facet may be at an angle to the direction of the light emitted from the optical waveguide to cause the incident light to be refracted through several layers of the semiconductor photodetection device.

16 Claims, 37 Drawing Sheets

SEMICONDUCTOR PHOTO-DETECTOR, SEMICONDUCTOR PHOTODETECTION DEVICE, AND PRODUCTION METHODS THEREOF

CROSS REFERENCE TO RELATED APPLICATIONS

This is a divisional of U.S. patent application Ser. No. 10/005,705, filed Dec. 4, 2001 now U.S. Pat. No. 6,770,945 in the name a of Hideki Fukaho and entitled SEMICONDUCTOR PHOTO-DETECTOR, SEMICONDUCTOR PHOTODETECTION DEVICE, AND PRODUCTION METHODS THEREOF which is a divisional of U.S. patent application Ser. No. 09/184,218, filed Nov. 2, 1998 now U.S. Pat. No. 6,353,250 in the name a of Hideki Fukaho and entitled SEMICONDUCTOR PHOTO-DETECTOR, SEMICONDUCTOR PHOTODETECTION DEVICE, AND PRODUCTION METHODS THEREOF.

This application is based on Japanese Patent Application Nos. 9-305148 (1997) filed Nov. 7, 1997, 9-305149 (1997) filed Nov. 7, 1997, 9-332587 (1997) filed Dec. 3, 1997, 10-98 (1998) filed Jan. 5, 1998, 10-1466 (1998) filed Jan. 7, 1998, 10-8236 filed Jan. 20, 1998, 10-192793 (1998) filed Jul. 8, 1998, the contents of which are incorporated hereinto by reference.

BACKGROUND OF THE INVENTION

1. Field of the Invention

The present invention relates to a refraction type semiconductor photo-detector, a semiconductor photo-detection device comprising the semiconductor photo-detector combined with an optical waveguide, and production methods thereof.

2. Description of the Related Art

Conventional refraction type semiconductor photo-detectors have a structure in which, as shown in FIG. 1A, a light incident angled facet 21a is formed across a photo-absorption layer 23a from the top surface, or, as shown in FIG. 1B, an angle begins from a layer right beneath a photo-absorption layer 23b while contacting with the photo-absorption layer 23b (for example, Japanese Patent Application 9-52760 (1997)).

In FIG. 1A, numeral 21a indicates a light incident facet, 22a is a p-InP layer, 23a is an InGaAs photo-absorption layer, 24a is an n-InP layer, 25a is an n-InP layer, 26a is a p electrode, and 27a is an n electrode.

Further, in FIG. 1B, numeral 21b indicates a light incident facet, 22b is a p-InP layer, 23b is an InGaAs photo-absorption layer, 24b is an n-InP layer, 25b is an n-InP substrate, 26b is a p electrode, and 27b is an n-electrode.

Still further, in FIGS. 1A and 1B, numeral 28 indicates an optical fiber as an example of an optical waveguide for conducting the incident light. This optical waveguide 28 is combined with a semiconductor photo-detector shown in FIG. 1A or 1B to construct a semiconductor photo-detection device.

In the production process of above described photo-detector, when forming the reverse-mesa optical incident facet by using wet etching with bromine-methanol or the like, in etching including the photo-absorption layer 23a as a narrow gap or where the photo-absorption layer 23a exists close to the etching, the photo-absorption layer 23a as a narrow-gap is relatively fast in etching speed and, since side etching is liable to occur, an etching irregularity such as uneven side etching tends to generate during deep etching, resulting in a problem of generating fine irregularities or waves on the etching surface.

When the spot size of incident light is large, effect of irregularities or waves is small. However, when an optical beam is focused and applied using a tapered fiber or a lens, this effect becomes conspicuous, the beam is diffused, and focusing of the beam is degraded.

Further, in the prior art structure, in order to obtain a high-speed response, the incident position must be set at the top surface side as possible so that the photo-absorption area is the smallest, when the incident light position is moved down to the substrate side, the photo-absorption part is required to be increased in length to make photo-absorption possible.

As a result, the photo-absorption area is increased resulting in degraded high-speed response characteristics.

Still further, in the above-described prior art semiconductor photo-detector, the chip is formed by using cleavage or the like from the vicinity of the light incident angled facet.

Thus, the chip does not have a guide structure for optical-connection with an optical waveguide such as an optical fiber.

At the time to connect the optical fiber with the photo-detector optically, when the optical beam center of the optical fiber is fitted to the center of the optical-absorption area of the photo-detector, the responsivity becomes maximum, and when the optical beam center of the optical fiber is shifted from the center of the optical-absorption area of the photo-detector, the optical-absorption amount of the photo-detector is decreased, thereby the responsivity is deteriorated.

Although permissible range of the shifting depends on size of the photo-detector and a direction of the shifting, etc., the permissible range is usually several $\mu$m in the minimum direction.

As a result, in optical coupling with fibers or the like, fine mechanical adjustment of fiber optical end with an accuracy of several microns is required to a position where the responsivity is the maximum.

Therefore, there is a problem in that when fabricating a module (semiconductor photo-detection device) by combining a photo-detector with a fiber, a very precise positioning technique is necessary, and even a small deviation generates a degraded responsivity or a degraded response speed.

Therefore, in general, one or two lenses are inserted between the photo-detector and the fiber to moderate the positioning accuracy.

However, there is a problem in that the insertion of such a lens system leads to increases in the number of parts or fabrication steps resulting in an increase in module cost.

Further, there is a report of a structure in which to perform good optical coupling with the fiber without using the above lens system, the photo-detector is mounted on an optical fiber holding substrate having a V-shaped groove comprising silicon or the like. However, in this construction, it is required that the optical fiber holding substrate and the photo-detector be connected in high mechanical precision, which requires a high-precision positioning technique, and a small deviation generates reduction of responsivity or response speed.

Still further, even when the lens system is inserted as described above, there is some distance deviation between the device and the lens system during positioning, which is a cause of deviation in responsivity in a device with a small misalignment tolerance.

Yet further, in the above-described prior art semiconductor photo-detector, the electrodes 26a and 26b of the upper layer are, in general, alloyed with the semiconductor layer by heat treating metals such as AuZnNi for the case of p-type or AuGeNi for the case of n-type to form ohmic electrodes.

By virtue of such alloying, fine irregularities are generated between the electrodes 26a and 26b and the p-InP layers 22a and 22b as semiconductor, even if refracted light reaches here, it is diffuse reflected or absorbed by the electrode metal itself, and the electrode part is small in light reflectivity.

Therefore, although the thicknesses of the photo-absorption layers 23a and 23b can be reduced by increasing the effective absorption length through which the refracted light transits diagonally with respect to the layer thickness direction which is a characteristic of the refraction type semiconductor photo-detector, to obtain a sufficiently large responsivity, refracted light to the photo-absorption layers 23a and 23b is required to be sufficiently absorbed by one transit, there has been a limitation in reducing the thickness of the photo-absorption layers 23a and 23b.

As a result, a transit time of carriers transitting the photo-absorption layers 23a and 23b is a limitation factor of response speed of the semiconductor photo-detector, and there is a problem in that an ultra-high speed and high responsivity device cannot be fabricated.

Yet further, in the prior art refraction type semiconductor photo-detection device, for example, as shown in FIG. 1A, the light incident facet 21a of the refraction type semiconductor photo-detector and an optical waveguide such as a single mode optical fiber are disposed in opposition, and a gas such as air or an inert gas is filled in between.

Here, since the gas has a refractive index of nearly 1 and the refractive index of the photo-detector material is constant, the refraction angle at the light incident facet 21a is determined only by the reverse-mesa angle.

In general, in the production process of refraction type semiconductor photo-detector, when fabrication is made by determining the reverse-mesa angle, mesa angles of devices in the same wafer become all in line with each other.

Since the refraction type semiconductor photo-detector utilizes an increase in effective absorption length by transiting light the optical absorption layer by refraction, the refraction angle is determined equally in the prior art, and the effective absorption length is also constant.

Therefore, there is a problem in that to change the effective absorption length according to various applications, wafers of different mesa angles or different absorption layer thicknesses are required to be prepared to change the refraction angle.

SUMMARY OF THE INVENTION

A first object of the present invention is, in a refraction type photo-detector, to provide a refraction type semiconductor photo-detector and a production method thereof which has a very flat angled light incident facet even to a fine size light beam.

A second object of the present invention is, in a refraction type photo-detector, to provide a semiconductor photo-detector, a semiconductor photo-detection device and production methods thereof which are capable of easily making high precision optical coupling when making optical coupling with fibers.

Further, a third object of the present invention is, in a refraction type photo-detector, to provide a semiconductor photo-detector which can provide a high responsivity even with a thin optical absorption layer and is capable of making ultra-high-speed operation.

Still further, a fourth object of the present invention is, in a semiconductor photo-detection device comprising a refraction type semiconductor photo-detector and an optical waveguide disposed in opposition to the photo-detector, to provide a semiconductor photo-detection device which is capable of making adjustment of responsivity according to the application using refraction type semiconductor photo-detectors of the same layer structure and the same mesa angles.

A semiconductor photo-detector according to of the present invention which attains the above object is characterized in that: a first semiconductor layer having a first conduction type, a second semiconductor layer having a second conduction type, and a photo-absorption part comprising a photo-absorption layer sandwiched between the first semiconductor layer and the second semiconductor layer are disposed on a substrate: at least the photo-absorption layer is formed at a position apart inside by a finite length from an end surface of the substrate; the end surface of the second semiconductor layer and the substrate or the end surface of the substrate is provided with a light incident facet angled inwardly as it separates from the surface of the second semiconductor or the surface of the substrate; and light incident to the light incident facet is refracted at the light incident facet and transits the photo-absorption layer diagonally with respect to the layer thickness direction.

Further, a production method of the semiconductor photo-detector according to the present invention which attains the above object is characterized in that: a first semiconductor layer having an intrinsic or a first conduction type, a second semiconductor layer having the same first conduction type, and a growth layer comprising a photo-absorption part including a photo-absorption layer sandwiched between the first semiconductor layer and the second semiconductor layer are disposed on a substrate; a main inside part of the first semiconductor layer at the surface side, or the inside part and part of photo-absorption layer is converted selectively to a second conduction type by diffusion of an impurity; and an end surface of the substrate side growth layer except for the photo-absorption layer or the substrate is provided with a light incident facet angled inwardly as it separates from the surface side from a position apart by a finite length in a direction parallel to the substrate surface with respect to the photo-absorption part comprising the photo-absorption layer, whereby obtaining a semiconductor photo-detector in which incident light is refracted at the light incident facet and transits the photo-absorption layer diagonally with respect to the layer thickness direction.

Still further, a production method of the semiconductor photo-detector according to the present invention which attains the above object is characterized in that: a first semiconductor layer having an intrinsic or a first conduction type, a second semiconductor layer having the same first conduction type, and a growth layer comprising a photo-absorption part including a photo-absorption layer sandwiched between the first semiconductor layer and the second semiconductor layer are disposed on a substrate; a main inside part of the first semiconductor layer at the surface side, or the inside part and part of photo-absorption layer is converted selectively to a second conduction type by ion implantation and subsequent anneal; an end surface of the substrate side growth layer except for the photo-absorption layer or the substrate is provided with a light incident facet angled inwardly as it separates from the surface side from a position apart by a finite length in a direction parallel to the substrate surface with respect to the photo-absorption part comprising the photo-absorption layer, whereby obtaining a semiconductor photo-detector in which incident light is refracted at the light incident facet and transits the photo-absorption layer diagonally with respect to the layer thickness direction.

Yet further, a semiconductor photo-detector according to the present invention which attains the above object is characterized in that: a first conduction type semiconductor layer, a photo-absorption layer comprising an intrinsic or a first conduction type semiconductor layer, or a superlattice semiconductor layer or a multiple quantum well semiconductor layer, and a schottky electrode are disposed on a substrate; a semiconductor multilayered structure of large schottky-barrier height having a schottky barrier higher in schottky barrier height than the schottky barrier between the photo-absorption layer and the schottky electrode is formed between the photo-absorption layer and the schottky electrode; and an end surface of the substrate side growth layer except for the photo-absorption layer or the substrate is provided with a light incident facet angled inwardly as it separates from the surface side from a position apart by a finite length in a direction parallel to the substrate surface with respect to the photo-absorption part comprising the photo-absorption layer, wherein incident light is refracted at the light incident facet and transits the photo-absorption layer diagonally with respect to the layer thickness direction.

Yet further, a semiconductor photo-detector according to the present invention which attains the above object is provided, wherein the semiconductor layer of large schottky-barrier height is $In_{1-x-y}Ga_xAl_yAs$ ($0 \leq x \leq 1$, $0 \leq y \leq 1$).

Yet further, a semiconductor photo-detector according to the present invention which attains the above object is provided, wherein the semiconductor layer of large schottky-barrier height comprises $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, a semiconductor photo-detector according to the present invention which attains the above object is provided, wherein a compositionally graded or step-graded layer from the same composition as the photo-absorption layer to the same composition as the semiconductor layer of large schottky-barrier height is disposed between the photo-absorption layer and the semiconductor layer of large schottky-barrier height.

The semiconductor photo-detector according to the present invention is characterized in that the-light incident facet can be formed very flat and stable as compared with the prior art.

Here, since the light incident facet is formed on the substrate side growth layer except for the photo-absorption layer or on the substrate part from a position apart by a finite length with respect to the photo-absorption part comprising the photo-absorption layer, etching is prevented to the narrow-gap photo-absorption layer which is relatively higher in etching speed during formation of the light incident facet, generation of etching irregularity is almost eliminated, and a flat light incident facet can be formed with good yield.

Therefore, in the present invention, a narrow-gap photo-absorption layer is not included in the semiconductor layer forming the light incident facet, and the narrow-gap photo-absorption layer part does not contact the light incident facet, there is almost no generation of etching irregularity such as uneven side etching during deep etching, thereby obtaining a very flat light incident facet.

As a result, diffusion on the facet is prevented for a light beam focused using a tapered fiber or a lens, beam focusing is maintained, light can be absorbed by a small photo-absorption area, and an ultrafast photo-detector can be fabricated.

Further, fabrication of the photo-absorption part apart by a finite length from the light incident facet means that the photo-absorption part can be fabricated completely independent of the light incident facet, therefore, when light is incident by focusing with a lens or the like, the photo-absorption part of the device can be decreased in size to the same level as the beam size of the focus, thereby enabling ultrafast response.

Still further, since, even when the light incident position is moved down with respect to the top surface, the photo-absorption part can be set at an optimum position without increasing the photo-absorption area in consideration of refraction accordingly, and flexible construction is possible such as in hybrid integration on a silica-based lightwave circuit or the like.

Yet further, a semiconductor photo-detector according to the present invention which attains the above object is characterized in that: a photo-absorption part comprising a semiconductor multilayer structure including a photo-absorption layer is provided on a substrate, an end surface is provided with a light incident facet angled inwardly as it separates from the surface side, and a V- or U-shaped groove is provided in opposition to the light incident facet, whereby light incident from an optical fiber disposed in the groove is refracted at the light incident facet and transits the photo-absorption layer diagonally with respect to the layer thickness direction.

Yet further, a production method of semiconductor photo-detector according to the present invention which attains the above object is provided, wherein the light incident facet and the V- or U-shaped groove are formed simultaneously by etching.

Yet further, a semiconductor photo-detector according to the present invention which attains the above object is provided, wherein the light incident facet and its vicinity are buried in an organic substance.

Yet further, a production method of semiconductor photo-detection device according to the present invention which attains the above object is fabricated, with the light incident facet and its vicinity are buried in an organic substance, and after making optical coupling with an optical waveguide, by removing the organic substance.

Yet further, a production method of semiconductor photo-detection device according to the present invention which attains the above object is characterized in that the light incident facet and its vicinity are buried in an organic substance, and, after making optical coupling with an optical waveguide, space between the semiconductor photo-detector and the optical waveguide is buried in with an organic substance.

In the semiconductor photo-detection device according to the present invention, the device has a groove in opposition to the light incident facet to be a fiber guide for conducting incident light, which part acts as a fiber guide, and high precision positioning is possible only by setting the fiber.

Further, by using a monolithic construction in which the present devices are arranged in parallel on a single chip, optical coupling is possible with multiple fibers collectively with high precision.

Still further, this device has a V- or U-shaped groove in opposition to the light incident facet, and the light incident facet part and its vicinity are buried in an organic substance.

Therefore, the V- or U-shaped groove part acts as a guide of optical waveguide such as a fiber or the like, and, since the light incident facet is protected with the organic substance, high precision optical coupling is possible by butting.

Yet further, by using a monolithic construction in which the present devices are arranged in parallel on a single chip, optical coupling is possible with multiple fibers collectively with high precision.

Yet further, a semiconductor photo-detector according to the present invention which attains the above object is characterized in that: a photo-absorption part comprising a semiconductor multilayer structure including a photo-absorption layer is provided on a substrate; an end surface is provided with a light incident facet angled inwardly as it separates from the surface side, the substrate is protruded by a finite length from a tip part of the end surface, and light incident from an optical waveguide, precisely positioned by contacting against the protruded part of the substrate, is refracted at the light incident facet and transits the photo-absorption layer diagonally with respect to the layer thickness direction.

Since in the device of the invention according described above, part of substrate is protruded by a finite length from the tip of the light incident facet, this part acts as a stopper when a fiber is brought close from a far end in the optical axis direction, and the fiber tip will never contact against the important light incident facet to be damaged.

With the present invention, as compared with the prior art, optical coupling in the optical axis direction with a fiber or the like can be achieved precisely without delicate mechanical positioning.

Yet further, a semiconductor photo-detector according to the present invention which attains the above object is characterized in that: a photo-absorption part comprising a semiconductor multilayer structure including a photo-absorption layer is provided on a substrate; an end surface is provided with a light incident facet angled inwardly as it separates from the surface side, a main reaching area of refracted incident light at the semiconductor layer above the photo-absorption layer is terminated with a substance having a smaller refractive index than the semiconductor layer, incident light is refracted at the light incident facet and transits the photo-absorption layer diagonally with respect to the layer thickness direction, and the transit light is total reflected by the substance of small refractive index on the semiconductor layer above the photo-absorption layer.

In the semiconductor photo-detector device of the present invention according, a main reaching area of refracted incident light at the semiconductor layer above the photo-absorption layer is terminated with a substance having a smaller refractive index than the semiconductor layer, light is completely total reflected on the upper surface, the refracted light transits two times the photo-absorption layer, and the effective absorption length is increased to two times.

Therefore, thickness of the photo-absorption layer to obtain a high responsivity can be considerably reduced.

Due to the remarkable decrease in the photo-absorption layer thickness, ultrafast operation of the device is possible while maintaining a high responsivity.

A semiconductor photo-detection device according to the present invention which attains the above object is characterized by comprising a refraction type semiconductor photo-detector comprising a photo-absorption part including a semiconductor multilayer structure including a photo-absorption layer disposed on a substrate and an end surface provided with a light incident facet angled inwardly as it separates from the surface side, and an optical waveguide disposed in opposition to the device; space between the refraction type semiconductor photo-detection device and the optical waveguide is buried in a solid or liquid; whereby light incident to the light incident facet of the photo-detection device from the optical waveguide is refracted at the light incident facet and transits the photo-absorption layer diagonally with respect to the layer thickness direction.

Since in the semiconductor photo-detection device of the present invention, space between the refraction type semiconductor photo-detector and the optical waveguide is buried in a solid or liquid having a refractive index of greater than 1, by appropriately selecting the solid or liquid used to change the refractive index, it is possible to change the refraction angle on the photo-detector incident facet even when using a refraction type semiconductor photo-detector cut from the same wafer having the same layer structure and the same mesa angle construction, thus the responsivity can be adjusted according to the application.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Embodiment 1

Figure 1A:
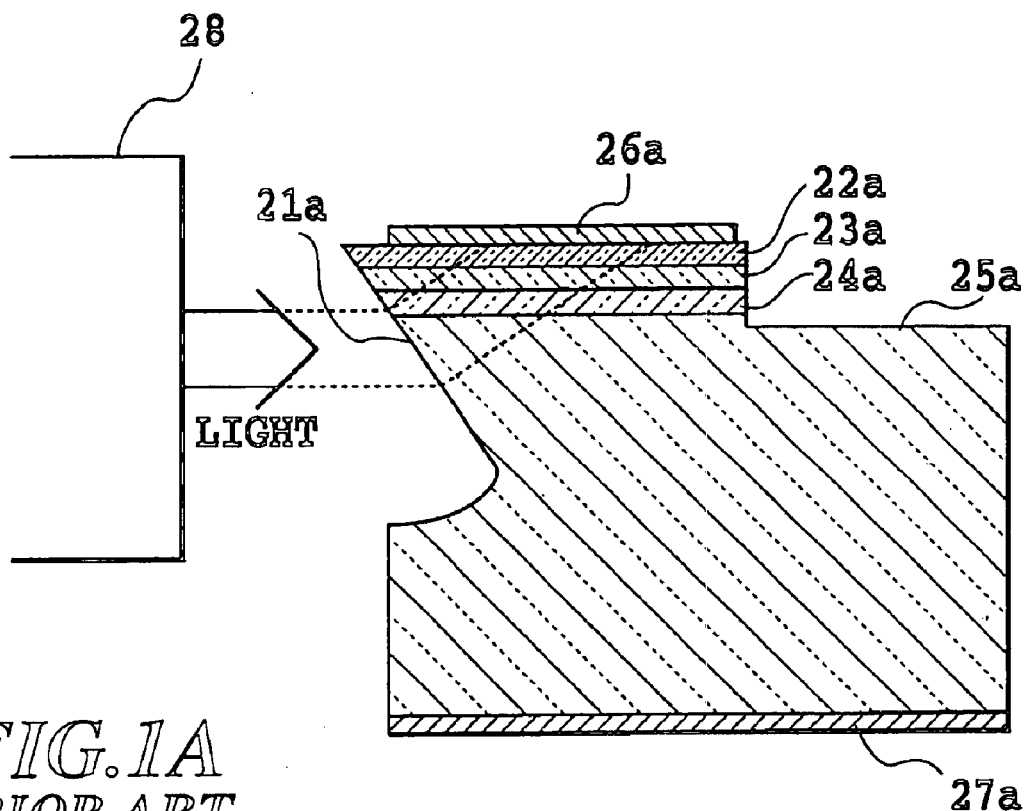
FIG. 1A is a sectional diagram showing an example of prior art semiconductor photo-detector.
Figure 1B:
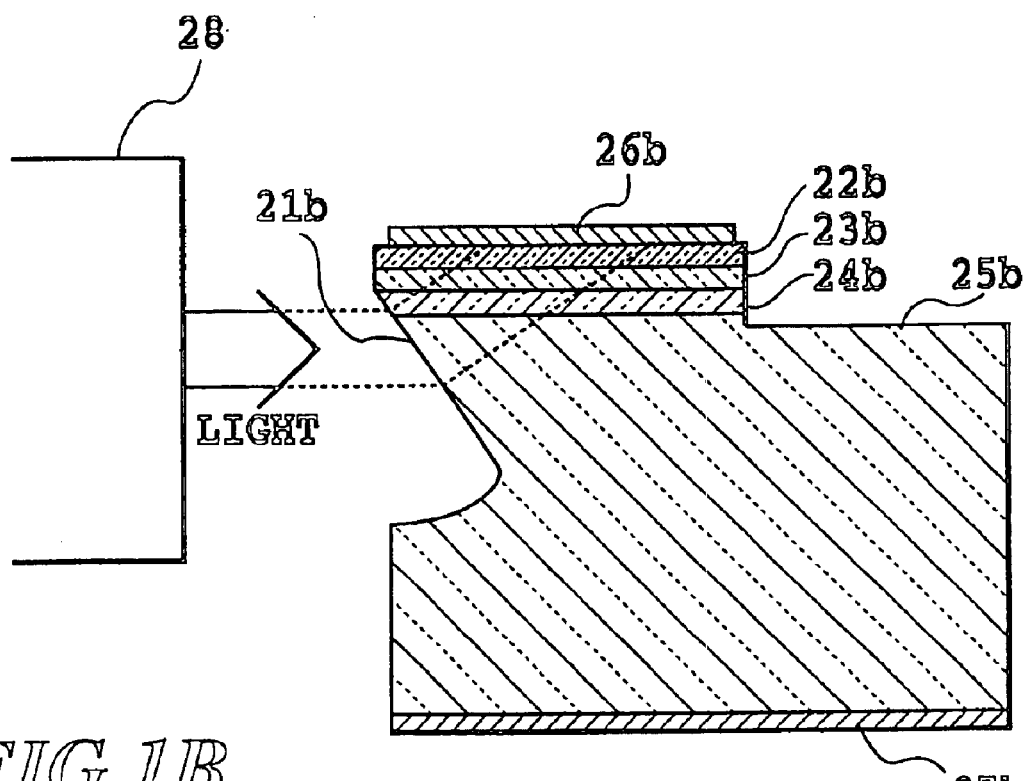
FIG. 1B is a sectional diagram showing another example of prior art semiconductor photo-detector.
Figure 2:
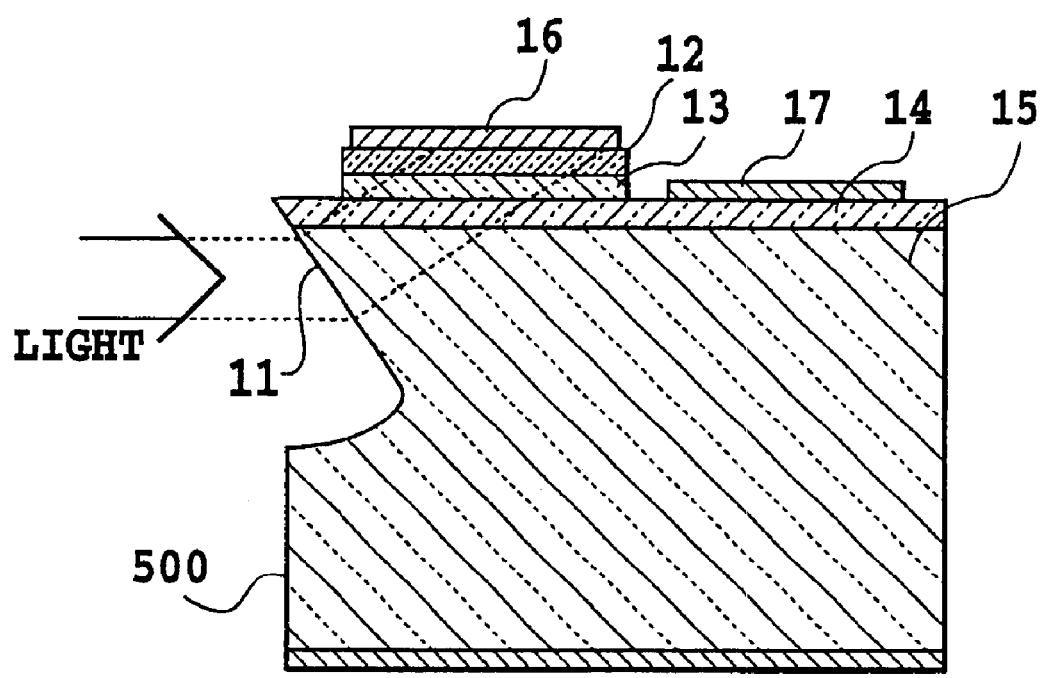
FIG. 2 is a sectional diagram showing a semiconductor photo-detector according to a first embodiment of the present invention.

A first embodiment of the present invention is shown in FIG. 2.

In FIG. 2, numeral 11 indicates a light incident facet, 12 is a 1 μm thick p-InP layer (first semiconductor layer), 13 is a 1.0 μm thick InGaAs photo-absorption layer, 14 is a 1 μm thick n-InP layer (second semiconductor layer), 15 is a semi-insulating InP substrate, 16 is a p-electrode, and 17 is an n-electrode. The device has a photo-absorption layer area of 10 $\mu m \times 20$ $\mu m$.

The p-InP layer 12 and the photo-absorption layer 13 are formed on a part which is separated inside by a finite length (5 $\mu m$ in this embodiment) in a direction parallel to the substrate surface from the n-InP layer 14 and an end surface 500 of the substrate. The light incident facet 11 is formed in a shape angled inwardly as it separates from the n-InP layer 14 or the surface of the substrate 15.

A production method of the photo-detector formed in the shape mentioned above will be described as follows.

In the present embodiment, the light incident facet 11 was formed by utilizing wet etching with bromine-methanol of a (001) surface wafer to expose a (111)A plane.

Since, in this case, reverse-mesa etching is performed on the n-InP layer 14 and the semi-insulating InP substrate which are comprised only InP, the uniform, flat angled light incident facet 11 can be formed with a good yield.

Further, an etching mask is formed at a position 8 $\mu m$ apart from the photo-absorption part including the photo-absorption layer 13, and deep reverse-mesa etching of about 30 $\mu m$ is performed, in this case, side etching of about 3 $\mu m$ occurs, however, in the photo-absorption part does not contact the side etching part, therefore, an abnormal side etching, etching irregularity or the like caused by relatively fast etching speed of the photo-absorption layer 13 will not generate. In addition, uniform devices with equal mesa angle can be fabricated.

Naturally, the reverse-mesa may be formed using another wet etching liquid or dry etching, or utilizing other crystal plane, or utilizing adhesion of the etching mask to control the angle.

By any method, since the etching object is only InP layer of uniform composition, etching irregularity is hard to occur, and a flat light incident facet 11 can be formed with a good yield.

Because a very flat light incident facet 11 can be formed as described above, by forming an anti-reflection coating film on the light incident facet 11, in light of 1.3 $\mu m$ in wavelength of focused beam diameter by a tapered fiber, the refracted light is introduced into the photo-absorption part with good focus without diffusion of the beam on the light incident facet 11, and a high responsivity of more than 0.8 A/W is obtained at an applied reverse bias of 1.5V.

Further, since photo-absorption can be achieved with such a small-sized photo-absorption area, high speed operation of a 3 dB bandwidth of 40 GHz was possible.

As described above, fabrication of the photo-absorption part apart from the light incident facet 11 means that the photo-absorption part can be fabricated completely independent of the light incident facet 11, therefore, when light is incident by focusing with a lens or the like, the photo-absorption part of the device can be small-sized to the same level as the beam size of focus, thereby enabling ultrafast response.

Still further, since, even when the light incident position is moved down to the substrate side relative to the top surface, the photo-absorption part can be set at an optimum position without increasing the photo-absorption area in consideration of refraction, in hybrid integration on a PLC (Planar Lightwave Circuit) which is a silica-based lightwave circuit, flexible construction is possible without degradation of high-speed performance due to a change of optical axis position.

The present embodiment is an example using an n-InP layer at the substrate side, however, a p-InP layer can be used by reversing the above p and n, and an n-InP or p-InP substrate can also be used for the fabrication.

Yet further, a uniform composition bulk is used here as the photo-absorption layer 13, however, it is needless to say that a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 2

Figure 3:
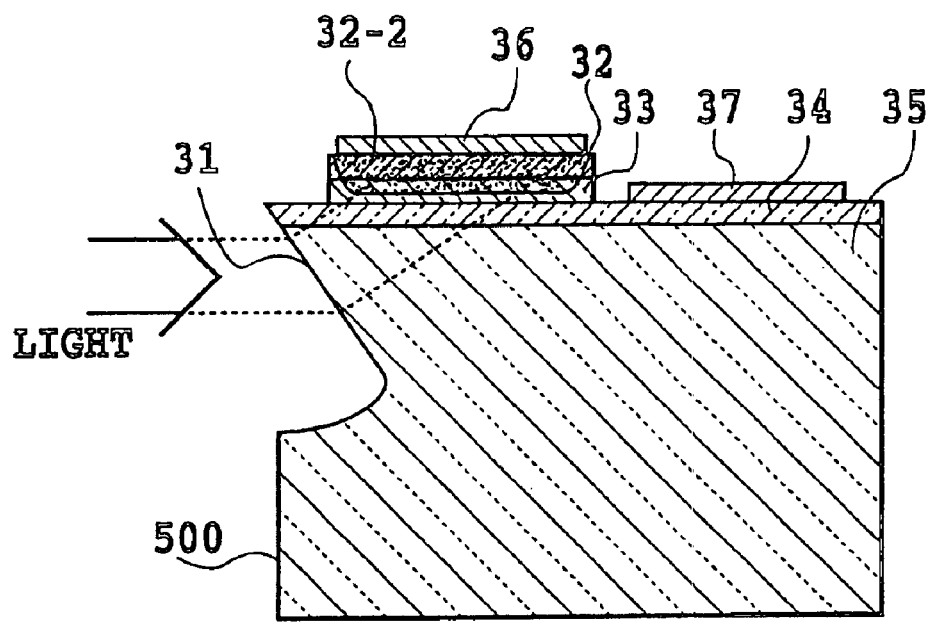
FIG. 3 is a sectional diagram showing a semiconductor photo-detector according to a second embodiment of the present invention.

A second embodiment of the present invention is shown in FIG. 3.

In FIG. 3, numeral 31 indicates a light incident facet, 32 is a 1 $\mu m$ thick InP layer (first semiconductor layer), 32-2 is a p-InP layer (first semiconductor layer) formed by Zn diffusion, 33 is a 1.0 $\mu m$ thick InGaAs photo-absorption layer, 34 is a 1 $\mu m$ thick n-InP layer (second semiconductor layer), 35 is a semi-insulating InP substrate, 36 is a p electrode, and 37 is an n electrode. The device has a photo-absorption layer area of 10 $\mu m \times 20$ $\mu m$.

Also in the construction shown in FIG. 3, configuration relation between the photo-absorption layer 33 and the light incident facet 31 is the same as in the above-described embodiment 1 (FIG. 2).

In the present embodiment, the light incident facet 31 was formed by utilizing wet etching of a (001) surface wafer using bromine-methanol to expose a (111)A plane.

Since, in this case, reverse-mesa etching is performed by wet etching to the n-InP layer 34 and the InP substrate 35 composed only of InP, a uniform angled light incident facet 31 of good flatness can be formed with a good yield.

Further, an etching mask is formed at a position 8 $\mu m$ apart from the photo-absorption part including the photo-absorption layer 33, and deep reverse-mesa etching of about 30 $\mu m$ is performed, in this case, side etching of about 3 $\mu m$ occurs, however, in the photo-absorption part does not contact the side etching part, therefore, an abnormal side etching, etching irregularity or the like caused by relatively fast etching speed of the photo-absorption layer 33 will not generate. In addition, uniform devices with equal mesa angle can be fabricated.

Naturally, the reverse-mesa may be formed using another wet etching liquid or dry etching, or utilizing other crystal plane, or utilizing adhesion of the etching mask to control the angle.

By any method, since the etching object is only InP layer of uniform composition, etching irregularity is hard to occur, and a flat light incident facet 31 can be formed with a good yield.

Because a very flat light incident facet 31 can be formed as described above, by forming an anti-reflection coating film on the light incident facet 31, in light of 1.3 $\mu m$ in wavelength of focused beam diameter by a tapered fiber, the refracted light is introduced into the photo-absorption part with good focus without diffusion of the beam on the light incident facet 31, and a high responsivity of more than 0.8 A/W was obtained at an applied reverse bias of 1.5V.

A dark current of a sufficiently small value of about 10 pA was obtained even after formation of the anti-reflection coating film.

Further, since photo-absorption can be achieved with such a small-sized photo-absorption area, high speed operation of a 3 dB bandwidth of 40 GHz was possible.

As described above, fabrication of the photo-absorption part apart from the light incident facet 31 means that the photo-absorption part can be fabricated completely independent of the light incident facet 31, therefore, when light is incident by focusing with a lens or the like, the photo-absorption part of the device can be small-sized to the same level as the beam size of focus, thereby enabling ultrafast response.

Still further, since, even when the light incident position is moved down to the substrate side relative to the top surface, the photo-absorption part can be set at an optimum position without increasing the photo-absorption area in consideration of refraction, in hybrid integration on a PLC which is a silica-based lightwave circuit, flexible construction is possible without degradation of high-speed performance due to a change of optical axis position.

In the present embodiment, the conduction type of semiconductor of the main part at the surface side is determined by Zn diffusion, however, alternatively, it may be determined by an ion implantation method and subsequent anneal.

The present embodiment is an example using an n-InP layer at the substrate side, however, a p-InP layer can be used by reversing the above p and n, and an n-InP or p-InP substrate can also be used for the fabrication.

Yet further, a uniform composition bulk is used here as the photo-absorption layer 33, however, it is needless to say that a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 3

Figure 4:
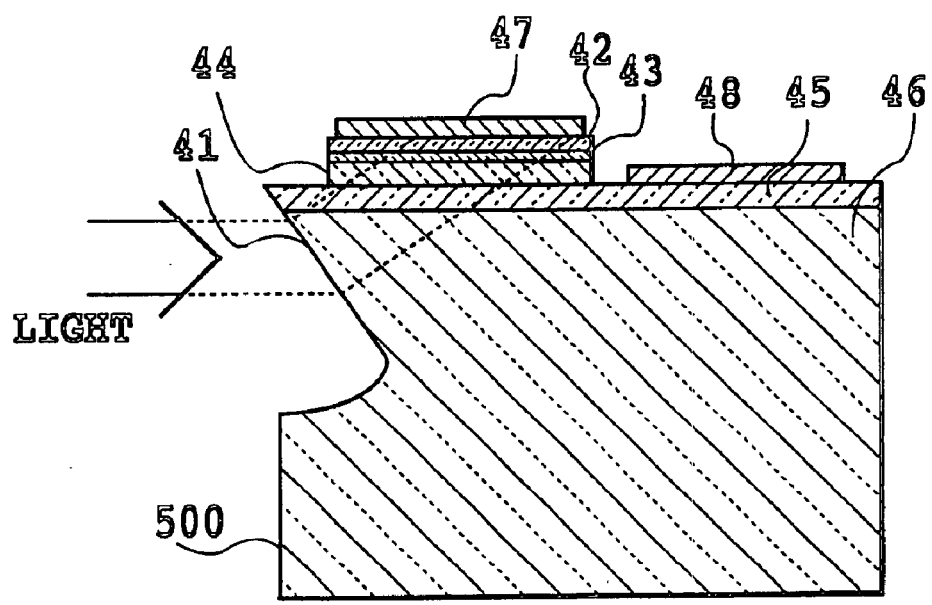
FIG. 4 is a sectional diagram showing a semiconductor photo-detector according to a third embodiment of the present invention.

A third embodiment of the present invention is shown in FIG. 4.

In FIG. 4, numeral 41 indicates a light incident facet, 42 is a 0.2 $\mu$m thick undoped or n⁻-InAlAs layer, 43 is a 0.1 $\mu$m thick undoped or n⁻-In$_{1-x-y}$Ga$_x$Al$_y$As ($0 \leq x \leq 1$, $0 \leq y \leq 1$) in which the composition is smoothly changed from InAlAs to InGaAs, 44 is a 1 $\mu$m thick undoped or n⁻-InGaAs photo-absorption layer, 45 is a 1 $\mu$m thick n-InP layer, 46 is a semi-insulating InP substrate, 47 is a Pt/Ti/Au schottky electrode, and 48 is an ohmic n electrode. The device has a photo-absorption layer area of 10 $\mu$m×20 $\mu$m.

Also in the construction shown in FIG. 4, configuration relation between the photo-absorption layer 44 and the light incident facet 41 is the same as in embodiment 1 described above (FIG. 2).

Because light transits obliquely with respect to the photo-absorption layer 44 due to refraction of light on the light incident facet 41, the effective absorption length is increased.

Further, because the schottky electrode 47 acts as a reflection mirror to refracted incident light so that the absorption length equivalently becomes further two times, by forming an anti-reflection coating film on the light incident facet 41 with a photo-absorption layer thickness of 1 $\mu$m, a large responsivity of more than 0.9 A/W at a wavelength of 1.3 $\mu$m was obtained at an applied reverse bias of 1.5V.

In the present embodiment, the light incident facet 41 was formed by utilizing wet etching of a (001) surface wafer using bromine-methanol to expose a (111)A plane.

Since, in this case, reverse-mesa etching is performed on the n-InP layer 45 and the InP substrate 46 which are composed only of InP, a uniform angled light incident facet 41 of good flatness can be formed with a good yield.

Further, an etching mask is formed at a position 8 $\mu$m apart from the photo-absorption part including the photo-absorption layer 44, and deep reverse-mesa etching of about 30 $\mu$m is performed, in this case, side etching of about 3 $\mu$m occurs, however, the photo-absorption part does not contact the side etching part, therefore, abnormal side etching, etching irregularity or the like caused by relatively fast etching speed of the photo-absorption layer 44 will not generate. In addition, uniform devices with equal mesa angle can be fabricated.

Naturally, the reverse-mesa may be formed using another wet etching liquid or a dry etching method, or utilizing other crystal plane, or utilizing adhesion of the etching mask to control the angle.

By any of the methods, since the etching object is only InP layer of uniform composition, etching irregularity is hard to generate, and a flat light incident facet 41 can be formed with a good yield.

Because a very flat light incident facet 41 can be formed as described above, by forming an anti-reflection coating film on the light incident facet 41, for light of 1.3 $\mu$m in wavelength of focused beam diameter by a tapered fiber, the refracted light is introduced into the photo-absorption part with good focus without diffusion of the beam on the light incident facet 41.

A dark current of a sufficiently small value of about 1 nA was obtained even after formation of the anti-reflection coating film.

Further, since photo-absorption can be achieved with such a small-sized photo-absorption area, high speed operation of a 3 dB bandwidth of 30 GHz was possible.

As described above, fabrication of the photo-absorption part apart from the light incident facet 41 means that the photo-absorption part can be fabricated completely independent of the light incident facet 41, therefore, when light is incident by focusing with a lens or the like, the photo-absorption part of the device can be small-sized to the same level as the beam size of focus, thereby enabling ultrafast response.

Still further, since, even when the light incident position is moved down to the substrate side relative to the top surface, the photo-absorption part can be set at an optimum position without increasing the photo-absorption area in consideration of refraction, in hybrid integration on a PLC which is a silica-based lightwave circuit, flexible construction is possible without degradation of high-speed performance due to a change of optical axis position.

In the present embodiment, for smooth connection of the conduction band as well as the valence band, a compositionally graded layer 43 is used in which composition is smoothly changed from InAlAs to InGaAs, however, as the layer 43, a quasi-graded layer may be used which is composed of a step-graded layer including multilayered semiconductor thin films of more than one layer.

Further, also between the layers 44 and 45, smooth connection of both the conduction band and valence band may be achieved using In$_{1-u}$Ga$_u$As$_{1-v}$P$_v$ ($0 \leq u \leq 1$, $0 \leq v \leq 1$) step-graded layer in which composition is changed from InGaAs to InP or a quasi-graded layer.

Yet further, as a semiconductor photo-detection device, on a semiconductor layer having a first conduction type, a multilayer structure having a large schottky-barrier height opposing a schottky electrode 47 which has a schottky-barrier higher than the schottky barrier between the photo-absorption layer 44 and the schottky electrode 47 may be constructed on the substrate, between the photo-absorption layer 44 comprising an intrinsic or first conduction type semiconductor layer, a superlattice semiconductor layer, or a multiple quantum well semiconductor layer and the schottky electrode 47.

Yet further, as the semiconductor layer of large schottky barrier height, $In_{1-x-y}Ga_xAl_yAs$ ($0 \leq x \leq 1$, $0 \leq y \leq 1$) can be used.

The present embodiment is an example using an n-InP layer at the substrate side, however, a p-InP layer can be used by reversing the above p and n, and an n-InP or p-InP substrate can also be used for the fabrication.

Yet further, a uniform composition bulk is used here as the photo-absorption layer 44, however, it is needless to say that a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 4

Figure 5:
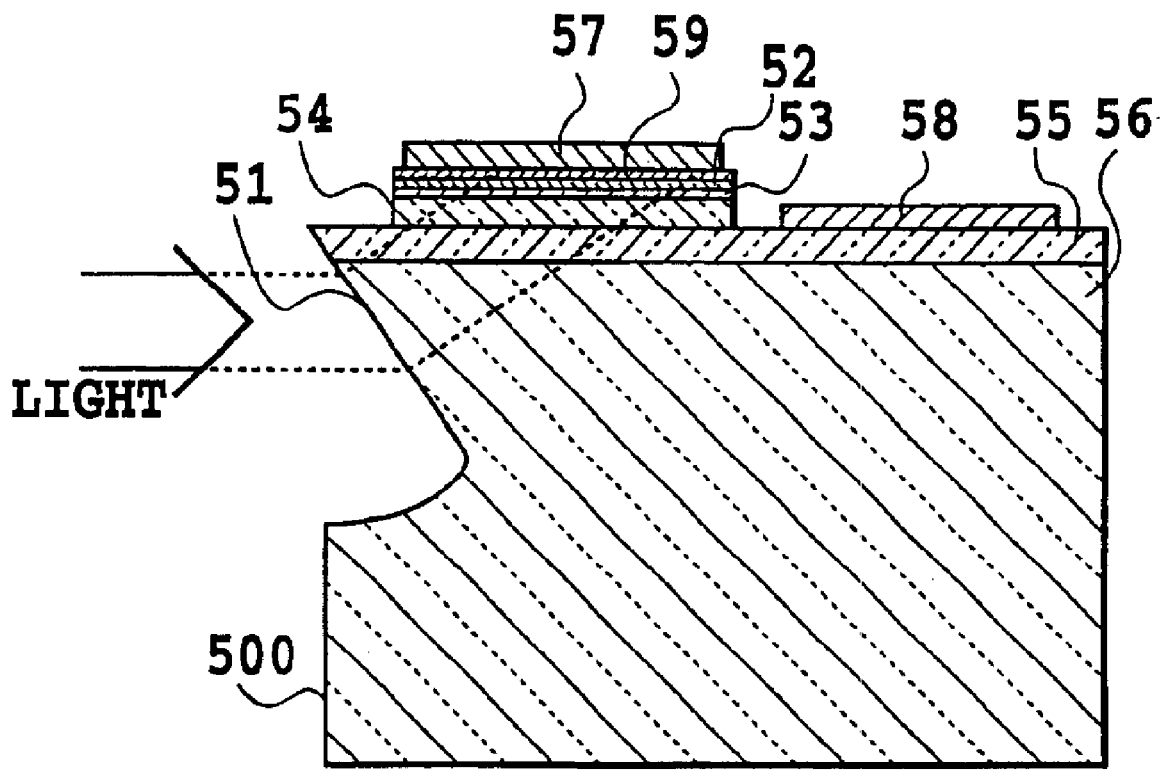
FIG. 5 is a sectional diagram showing a semiconductor photo-detector according to a fourth embodiment of the present invention.

A fourth embodiment of the present invention is shown in FIG. 5.

In FIG. 5, numeral 51 indicates a light incident facet, 59 is a 5 nm thick undoped or n⁻-InP layer, 52 is a 0.2 μm thick undoped or n⁻-InAlAs layer, 53 is a 0.1 μm thick undoped or n⁻-$In_{1-x-y}Ga_xAl_yAs$ ($0 \leq x \leq 1$, $0 \leq y \leq 1$) layer in which composition is smoothly changed from InAlAs to InGaAs, 54 is a 1 μm thick undoped or n-InGaAs photo-absorption layer, 55 is a 1 μm thick n-InP layer, 56 is a semi-insulating InP substrate, 57 is a Pt/Ti/Au schottky electrode, and 58 is an ohmic n electrode. The device has a photo-absorption layer area of 10 μm×20 μm.

Also in the construction shown in FIG. 5, configuration relation between the photo-absorption layer 54 and the light incident facet 51 is the same as in embodiment 1 described above (FIG. 2).

Since, in the present embodiment, a very thin InP layer 59 is used on the top surface, it has a high surface oxidation resistance as compared with InAlAs.

Because light transits obliquely with respect to the photo-absorption layer 54 due to reflection of light on the light incident facet 51, the effective absorption length is increased.

Further, because the schottky electrode 57 acts as a reflection mirror to refracted incident light so that the absorption length is increased equivalently by two times, by forming an anti-reflection coating film on the light incident facet 51 with a photo-absorption layer thickness of 1 μm, a large responsivity of more than 0.9 A/W at a wavelength of 1.3 μm was obtained at an applied reverse bias of 1.5V.

In the present embodiment, the light incident facet 51 was formed by utilizing wet etching of a (001) surface wafer using bromine-methanol to expose a (111)A plane.

Since, in this case, reverse-mesa etching is performed on the n-InP layer 55 and the InP substrate 56 which are composed only of InP, a uniform angled light incident facet 51 of good flatness can be formed with a good yield.

Further, an etching mask is formed at a position 8 μm apart-from the photo-absorption part including the photo-absorption layer 54, and deep reverse-mesa etching of about 30 μm is performed, in this case, side etching of about 3 μm occurs, however, the photo-absorption part does not contact the side etching part, therefore, abnormal side etching, etching irregularity or the like caused by relatively fast etching speed of the photo-absorption layer 54 will not generate. In addition, uniform devices with equal mesa angle can be fabricated.

Naturally, the reverse-mesa may be formed using another wet etching liquid or a dry etching method, or utilizing other crystal plane, or utilizing adhesion of the etching mask to control the angle.

By any of the methods, since the etching object is only InP layer of uniform composition, etching irregularity is hard to generate, and a flat light incident facet 51 can be formed with a good yield.

Because a very flat light incident facet 51 can be formed as described above, by forming an anti-reflection coating film on the light incident facet 51, for light of 1.3 μm in wavelength of focused beam diameter by a tapered fiber, the refracted light is introduced into the photo-absorption part with good focus without diffusion of the beam on the light incident facet 51.

A dark current of a sufficiently small value of about 1 nA was obtained even after formation of the anti-reflection coating film.

Further, since photo-absorption can be achieved with such a small-sized photo-absorption area, high speed operation of a 3 dB bandwidth of 30 GHz was possible.

As described above, fabrication of the photo-absorption part apart from the light incident facet 51 means that the photo-absorption part can be fabricated completely independent of the light incident facet 51, therefore, when light is incident by focusing with a lens or the like, the photo-absorption part of the device can be small-sized to the same level as the beam size of focus, thereby enabling ultrafast response.

Still further, since, even when the light incident position is moved down to the substrate side relative to the top surface, the photo-absorption part can be set at an optimum position without increasing the photo-absorption area in consideration of refraction, in hybrid integration on a PLC which is a silica-based lightwave circuit, flexible construction is possible without degradation of high-speed performance due to a change of optical axis position.

In the present embodiment, for smooth connection of the conduction band as well as the valence band, a compositionally graded layer 53 is used in which composition is smoothly changed from InAlAs to InGaAs, however, as the layer 53, a quasi-graded layer may be used which is composed of a step-graded layer including multilayered semiconductor thin films of more than one layer.

Further, also between the layers 54 and 55, smooth connection of both the conduction band and valence band may be achieved using $In_{1-u}Ga_uAs_{1-v}P_v$ ($0 \leq u \leq 1$, $0 \leq v \leq 1$) step-graded layer in which composition is changed from InGaAs to InP or a quasi-graded layer.

Yet further, as a semiconductor photo-detection device, on a semiconductor layer having a first conduction type, a multilayer structure having a large schottky-barrier height opposing a schottky electrode 57 which has a schottky-barrier higher than the schottky barrier between the photo-absorption layer 54 and the schottky electrode 57 may be constructed on the substrate, between the photo-absorption layer 54 comprising an intrinsic or first conduction type semiconductor layer, a superlattice semiconductor layer, or a multiple quantum well semiconductor layer and the schottky electrode 57.

Yet further, as the semiconductor layer of large schottky barrier height, $In_{1-x-y}Ga_xAl_yAs$ ($0 \leq x \leq 1$, $0 \leq y \leq 1$) can be used, and it may be constructed with a semiconductor comprising In$_{1-x-y}$Ga$_x$Al$_y$As (0≦x≦1, 0≦y≦1) and thin In$_{1-u}$Ga$_u$As$_{1-v}$P$_v$ (0≦u≦1, 0≦v≦1) disposed thereon.

The present embodiment is an example using an n-InP layer at the substrate side, however, a p-InP layer can be used by reversing the above p and n, and an n-InP or p-InP substrate can also be used for the fabrication.

Yet further, a uniform composition bulk is used here as the photo-absorption layer 54, however, it is needless to say that a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 5

Figure 6:
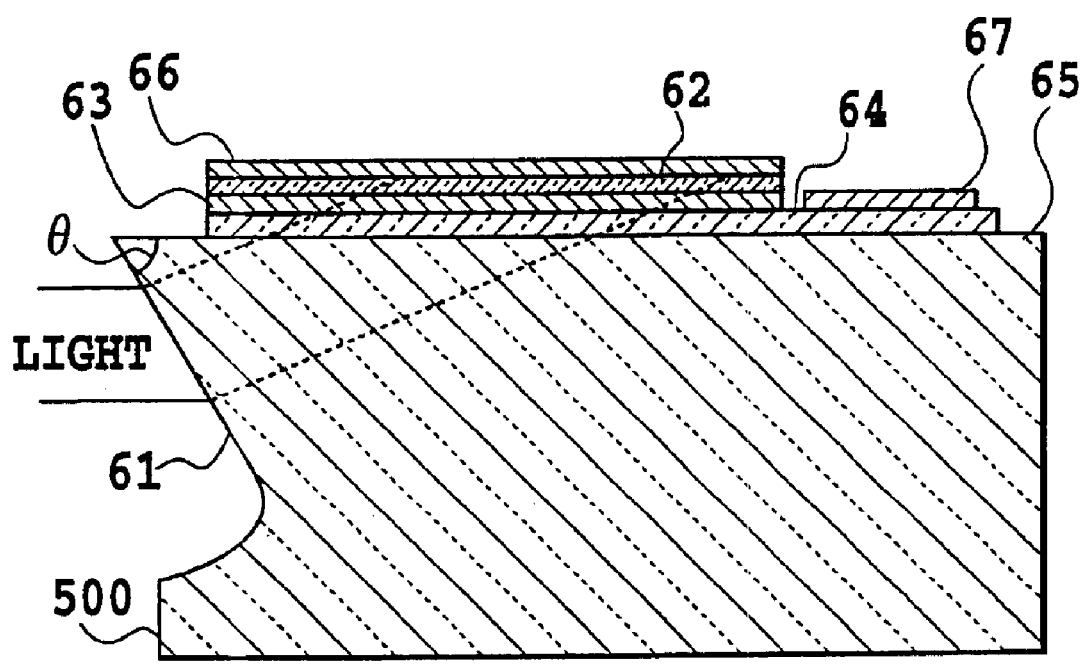
FIG. 6 is a sectional diagram showing a semiconductor photo-detector according to a fifth embodiment of the present invention.

A fifth embodiment of the present invention is shown in FIG. 6.

In FIG. 6, numeral 61 indicates a light incident facet, 62 (first semiconductor layer) is a p-type semiconductor layer composed of from the upper layer, a 0.1 μm thick p-InGaAs contact layer, a 1.3 μm thick p-InP layer, and a 0.2 μm thick p-InGaAsP layer (1.15 μm wavelength composition), 63 is a 1.0 μm thick InGaAs photo-absorption layer, 64 (second semiconductor layer) is an n-type semiconductor layer composed of from the upper layer, a 2 μm thick n-InGaAsP layer (1.15 μm wavelength composition) and 0.2 μm thick InP layer, 65 is a semi-insulating InP substrate, 66 is a p electrode, and 67 is an n electrode. The device has a photo-absorption layer area of 14 μm×20 μm.

Also in the construction shown in FIG. 6, configuration relation between the photo-absorption layer 63 and the light incident facet 61 is the same as in embodiment 1 described above (FIG. 2).

Figure 7:
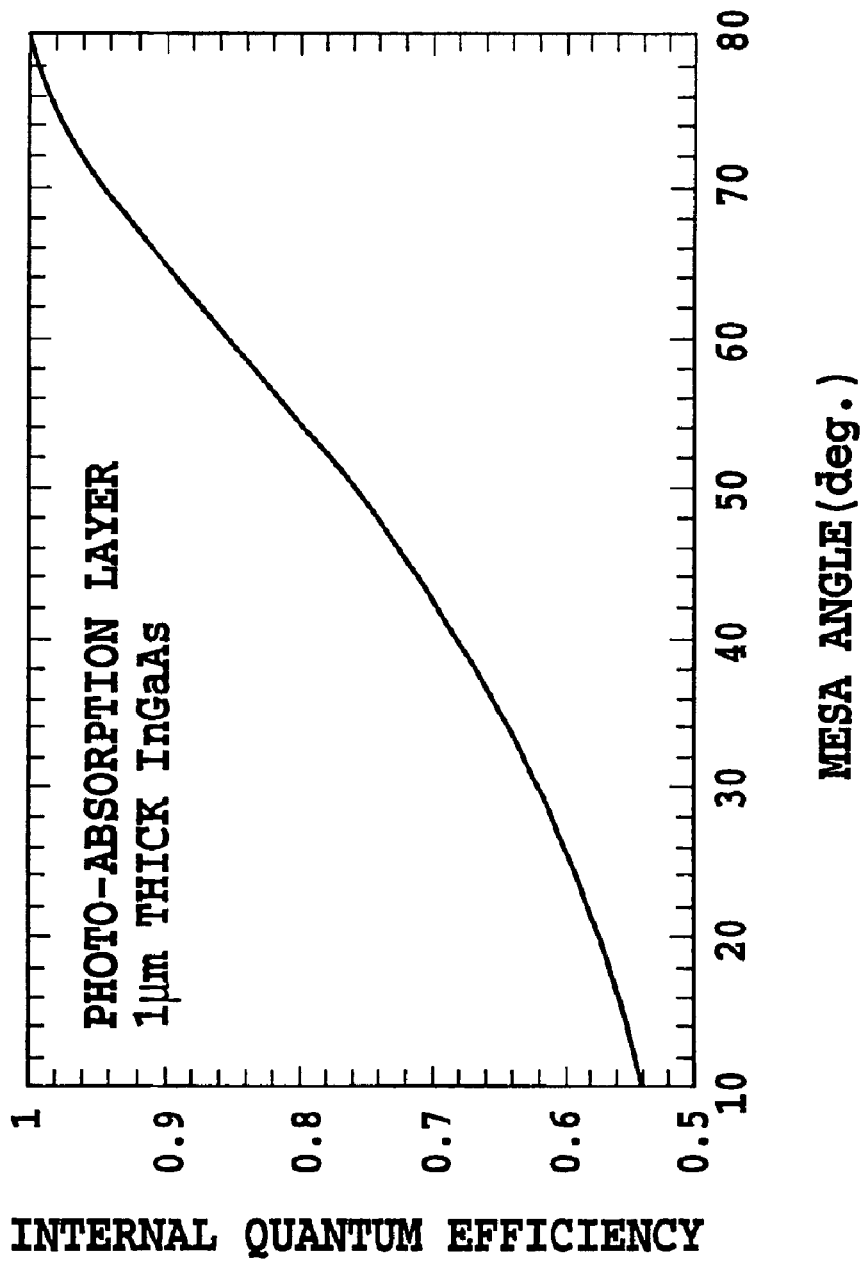
FIG. 7 is a graph showing a calculation result of reverse-mesa angle ($\theta$) dependence of internal quantum efficiency in a 1 $\mu$m thick InGaAs photo-absorption layer to wavelength 1.55 $\mu$m light in the fifth embodiment of the present invention.

FIG. 7 is a calculation result of reverse-mesa angle (θ) dependence of internal quantum efficiency in the 1 μm thick InGaAs photo-absorption layer to wavelength 1.55 μm light. As the reverse-mesa angle (θ) increases, the effective absorption length increases and the internal quantum efficiency increases.

Further, in the present embodiment, the light incident facet 61 was formed by utilizing wet etching of a (001) surface wafer using bromine-methanol to form a (111)A plane with an angle of 54°44' relative to the surface.

Since, in this case, reverse-mesa etching is performed on the InP substrate 65 which is composed only of InP, a uniform angled light incident facet of good flatness can be formed with a good yield.

Further, an etching mask is formed at a position 8 μm apart from the photo-absorption part including the photo-absorption layer 63, and deep reverse-mesa etching of about 30 μm is performed, in this case, side etching of about 3 μm occurs, however, the photo-absorption part does not contact the side etching part, therefore, abnormal side etching, etching irregularity or the like caused by relatively fast etching speed of the photo-absorption layer will not generate. In addition, uniform devices with equal mesa angle can be fabricated.

Naturally, the reverse-mesa may be formed using another wet etching liquid or a dry etching method, or utilizing other crystal plane, or utilizing adhesion of the etching mask to control the angle.

By any of the methods, since the etching object is only InP layer of uniform composition, etching irregularity is hard to generate, and a flat light incident facet 61 can be formed with a good yield.

Because a very flat light incident facet 61 can be formed as described above, by forming an anti-reflection coating film on the light incident facet, for light of 1.55 μm in wavelength of output light from the fiber with a spot-size diameter (2Ws) of 3.4 μm focused by a lens, the refracted light is introduced into the photo-absorption part with good focus without diffusion of the beam on the light incident facet, and a large responsivity value of 1.0 A/W was obtained at an applied reverse bias of 5V.

Figure 8A:
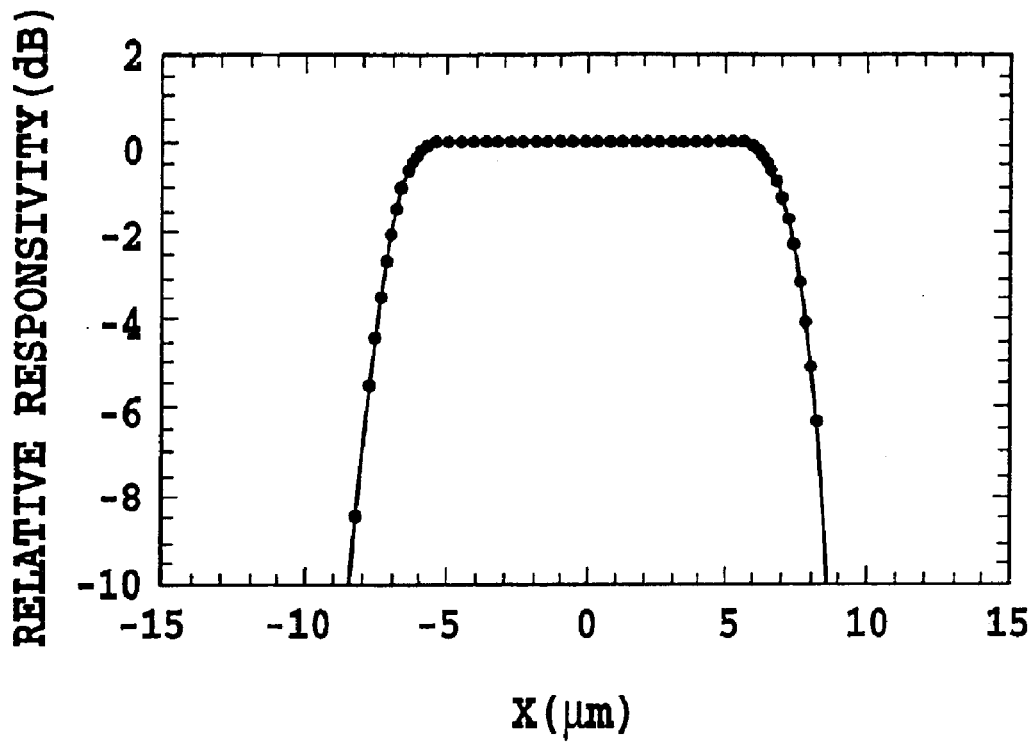
FIG. 8A is a graph showing a result of incident position dependence of responsivity measured when incident beam position is moved in a horizontal (X) direction in the semiconductor photo-detector of the fifth embodiment of the present invention.
Figure 8B:
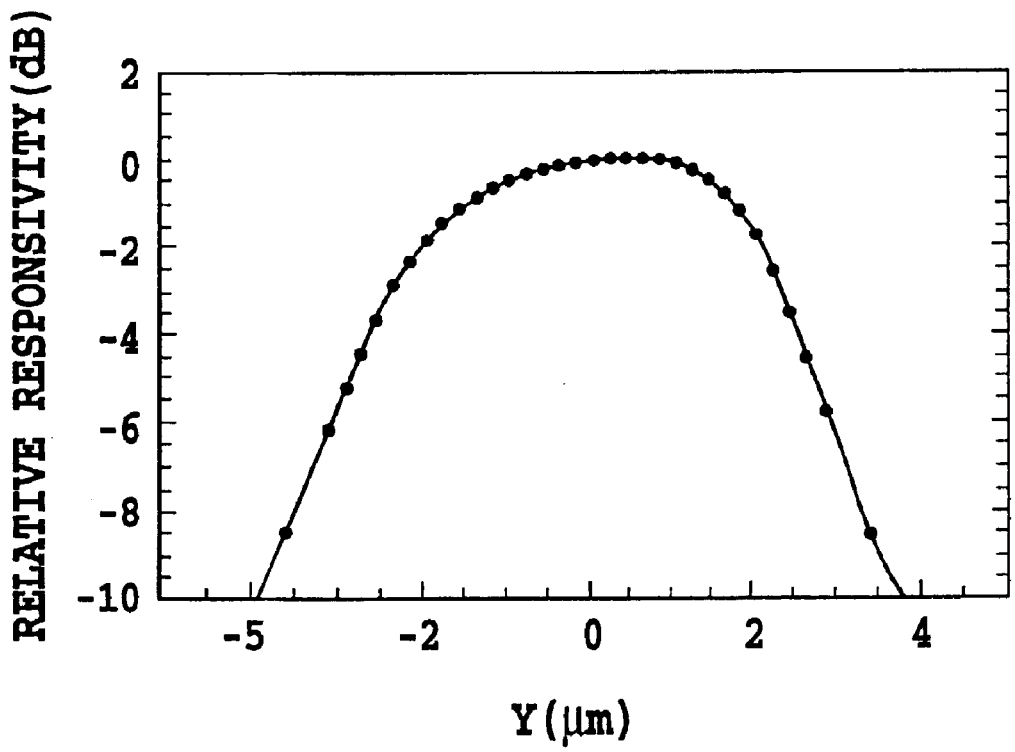
FIG. 8B is a graph showing a result of incident position dependence of responsivity measured when incident beam position is moved in a vertical (Y) direction in the semiconductor photo-detector of the fifth embodiment of the present invention.

Still further, the incident position of beam was moved in the horizontal (X) and vertical (Y) directions and measured for incident position dependence of responsivity. The measurement results are shown in FIGS. 8A and 8B. Optical axis misalignment tolerance of decreasing the responsivity by 1 dB is as large as 13.4 μm in the horizontal direction and 3.3 μm in the vertical direction. As a result, a photo-absorption module could be fabricated by a simple single-lens construction providing a cost reduction. Most of fabricated modules showed high responsivities of 0.8 to 1.0 A/W.

Figure 9:
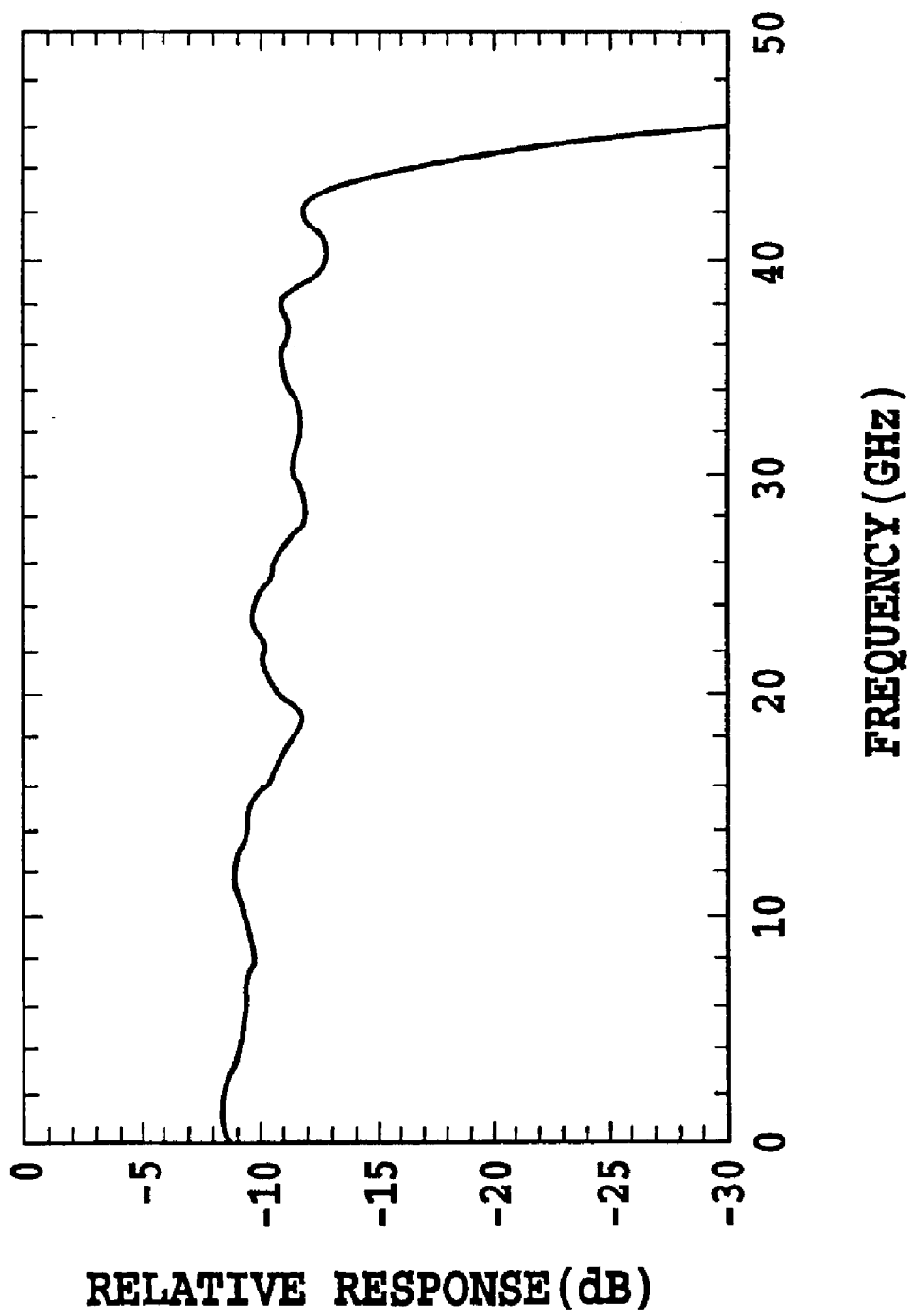
FIG. 9 is a graph showing frequency response characteristic of a module fabricated using the X semiconductor photo-detector of the fifth embodiment of the present invention at a bias voltage of 5V.

FIG. 9 shows frequency response characteristic of the fabricated module at a bias voltage of 5V. Since photo-absorption can be achieved with a small-sized photo-absorption area, high speed operation of a 3 dB bandwidth of 38 GHz was possible.

The present embodiment is an example using an n-type semiconductor layer at the substrate side, however, a p-type semiconductor layer can be used by reversing the above p and n, and an n-InP or p-InP substrate can also be used for the fabrication.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 6

Figure 10:
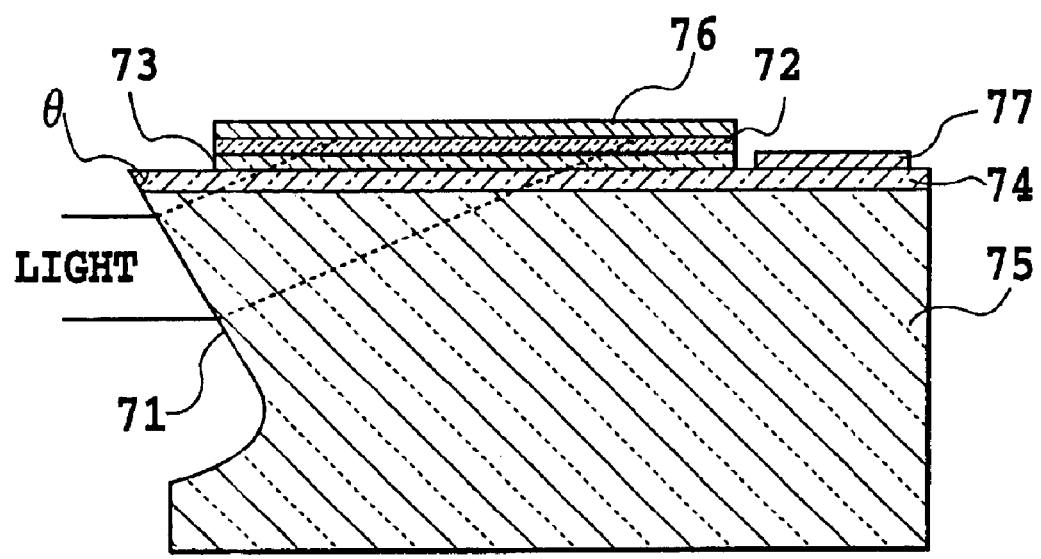
FIG. 10 is a sectional diagram showing a semiconductor photo-detector according to a sixth embodiment of the present invention.

A sixth embodiment of the present invention is shown in FIG. 10.

In FIG. 10, numeral 71 indicates a light incident facet, 72 is a p-type semiconductor layer (first semiconductor layer) composed of, from the upper layer, a 0.1 μm thick p-InGaAs contact layer, a 1.3 μm thick p-InP layer, and a 0.2 μm thick p-InGaAsP layer (1.15 μm wavelength composition), 73 is a 1.0 μm thick InGaAs photo-absorption layer, 74 is a 2 μm thick n-InP layer (second semiconductor layer), 75 is a semi-insulating InP substrate, 76 is a p electrode, and 77 is an n electrode. The device has a photo-absorption layer area of 14 μm×20 μm.

Also in the construction shown in FIG. 10, configuration relation between the photo-absorption layer 73 and the light incident facet 71 is the same as in embodiment 1 described above (FIG. 2).

Figure 11:
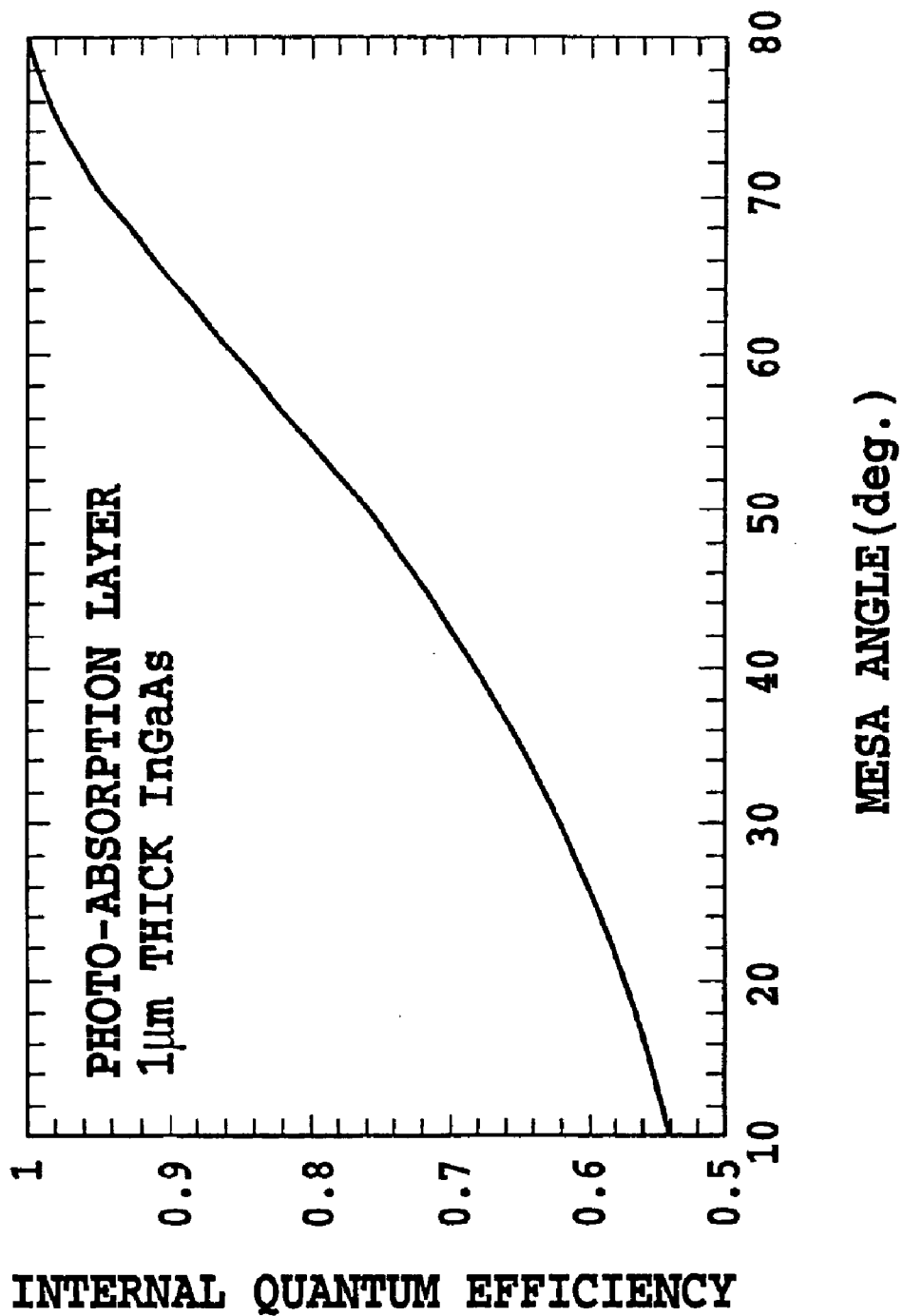
FIG. 11 is a graph showing a calculation result of reverse-mesa angle (θ) dependence of internal quantum efficiency in a 1 μm thick InGaAs photo-absorption layer to wavelength 1.55 μm light in the sixth embodiment of the present invention.

FIG. 11 is a calculation result of reverse-mesa angle (θ) dependence of internal quantum efficiency in the 1 μm thick InGaAs photo-absorption layer to wavelength 1.55 μm light. As the reverse-mesa angle (θ) increases, the effective absorption length increases and the internal quantum efficiency increases.

Further, in the present embodiment, the light incident facet 71 was formed by utilizing wet etching of a (001) surface wafer using bromine-methanol to form a (111)A plane with an angle of 54°44' relative to the surface.

Since, in this case, reverse-mesa etching is performed on a part including the InP substrate 75 which is composed only of InP, a uniform angled light incident facet 71 of good flatness can be formed with a good yield.

Further, an etching mask is formed at a position 8 μm apart from the photo-absorption part including the photo-absorption layer, and deep reverse-mesa etching of about 30 μm is performed, in this case, side etching of about 3 μm occurs, however, the photo-absorption part does not contact the side etching part, therefore, abnormal side etching, etching irregularity or the like caused by relatively fast etching speed of the photo-absorption layer will not generate. In addition, uniform devices with equal mesa angle can be fabricated.

Naturally, the reverse-mesa may be formed using another wet etching liquid or a dry etching method, or utilizing other crystal plane, or utilizing adhesion of the etching mask to control the angle. By any of the methods, since the etching object is only InP layer of uniform composition, etching irregularity is hard to generate, and a flat light incident facet 71 can be formed with a good yield.

Because a very flat light incident facet 71 can be formed as described above, by forming an anti-reflection coating film on the light incident facet, for light of 1.55 μm in wavelength of output light from the fiber with a spot-size diameter (2Ws) of 3.4 μm focused by a lens, the refracted light is introduced into the photo-absorption part with good focus without diffusion of the beam on the light incident facet, and a large responsivity value of 1.0 A/W was obtained at an applied reverse bias of 5V.

Figure 12A:
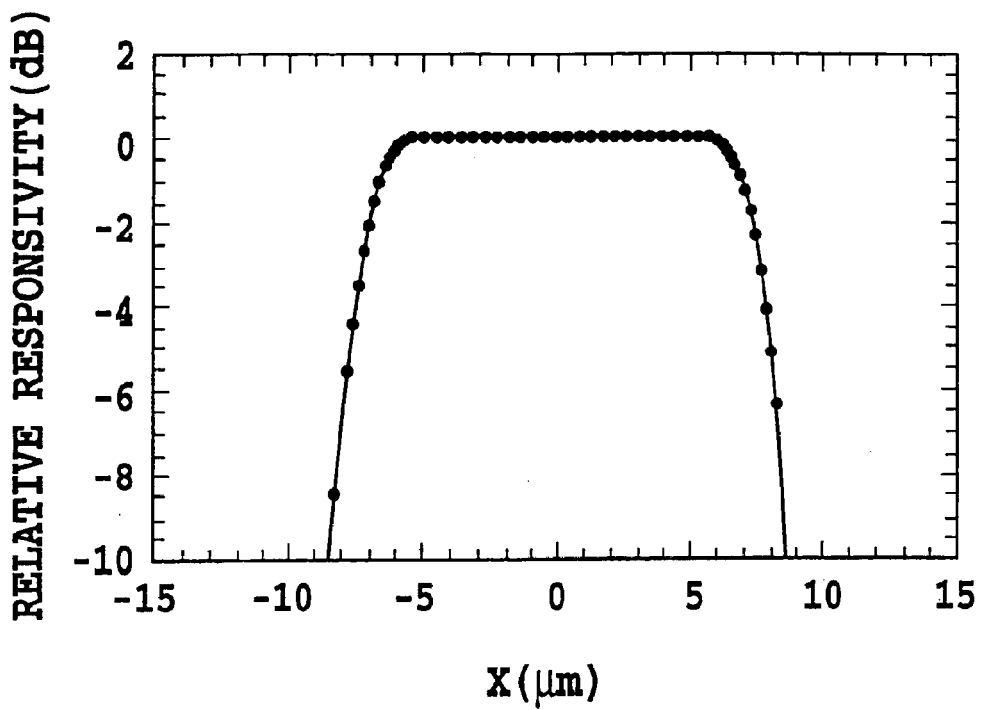
FIG. 12A is a graph showing a result of incident position dependence of responsivity measured when incident beam position is moved in a horizontal (X) direction in the semiconductor photo-detector of the sixth embodiment of the present invention.
Figure 12B:
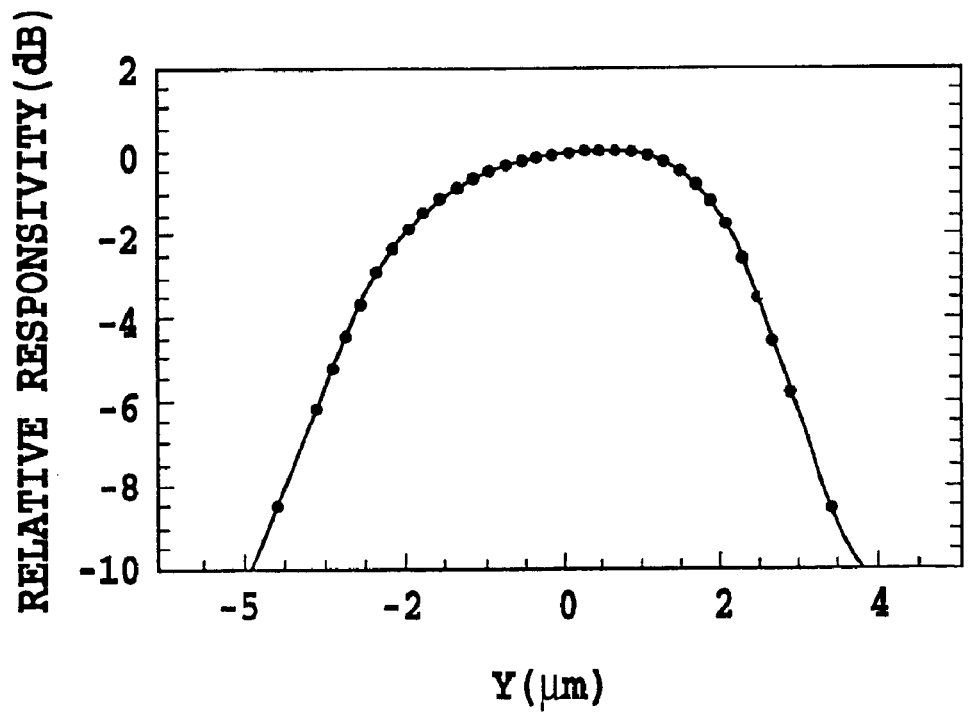
FIG. 12B is a graph showing a result of incident position dependence of responsivity measured when incident beam position is moved in a vertical (Y) direction in the semiconductor photo-detector of the sixth embodiment of the present invention.

Still further, the incident position of beam was moved in the horizontal (X) and vertical (Y) directions and measured for incident position dependence of responsivity. The measurement results are shown in FIGS. 12A and 12B. Optical axis misalignment tolerance of decreasing the responsivity by 1 dB is as large as 13.4 μm in the horizontal direction and 3.3 μm in the vertical direction. As a result, a photo-absorption module could be fabricated by a simple single-lens construction providing a cost reduction. Most of fabricated modules showed high responsivities of 0.8 to 1.0 A/W.

Figure 13:
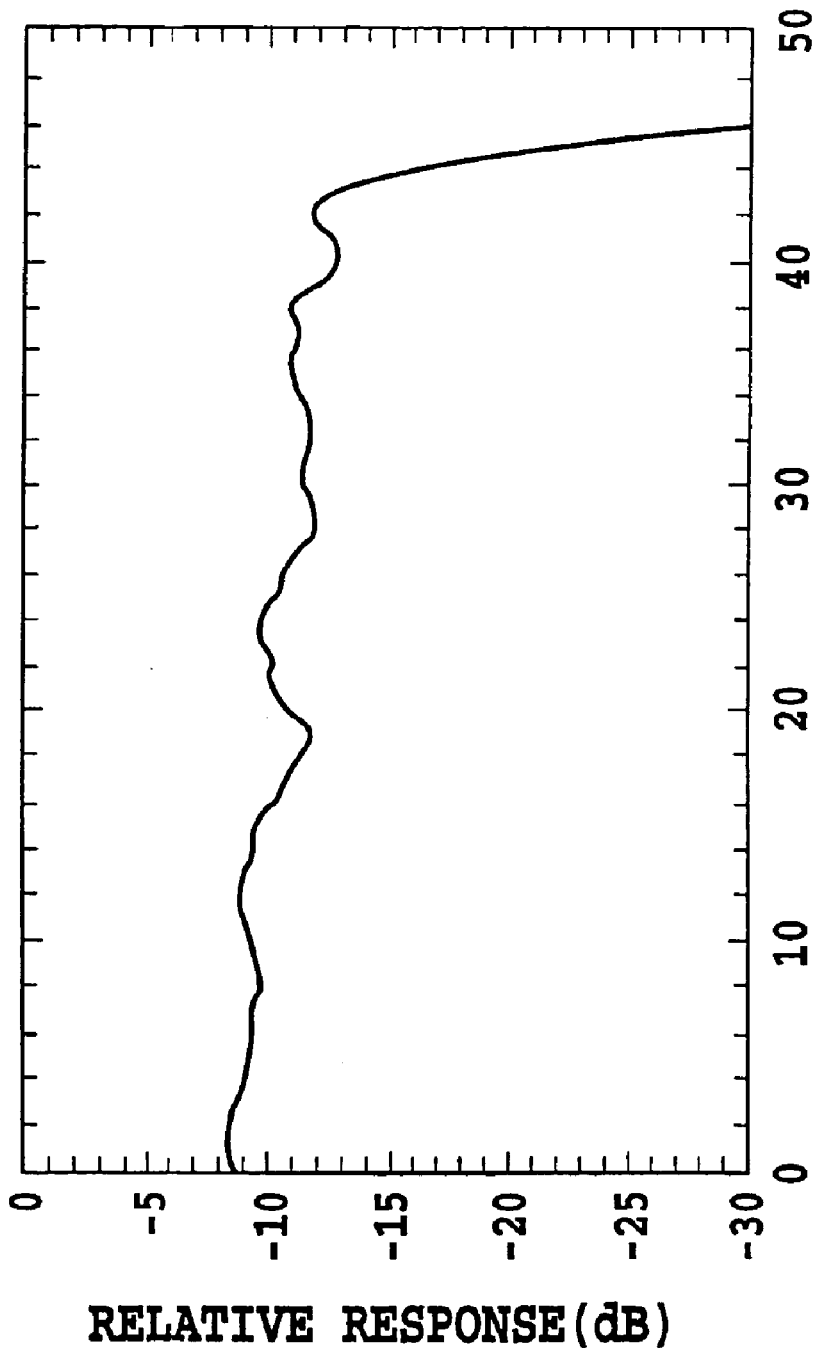
FIG. 13 is a graph showing frequency response characteristic of a module fabricated using the semiconductor photo-detector of the sixth embodiment of the present invention at a bias voltage of 5V.

FIG. 13 shows frequency response characteristic of the fabricated module at a bias voltage of 5V. Since photo-absorption can be achieved with a small-sized photo-absorption area, high speed operation of a 3 dB bandwidth of 38 GHz was possible.

The present embodiment is an example using an n-type semiconductor layer at the substrate side, however, a p-type semiconductor layer can be similarly used by reversing the above p and n, and an n-InP or p-InP substrate can also be used for the fabrication.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 7

Figure 14:
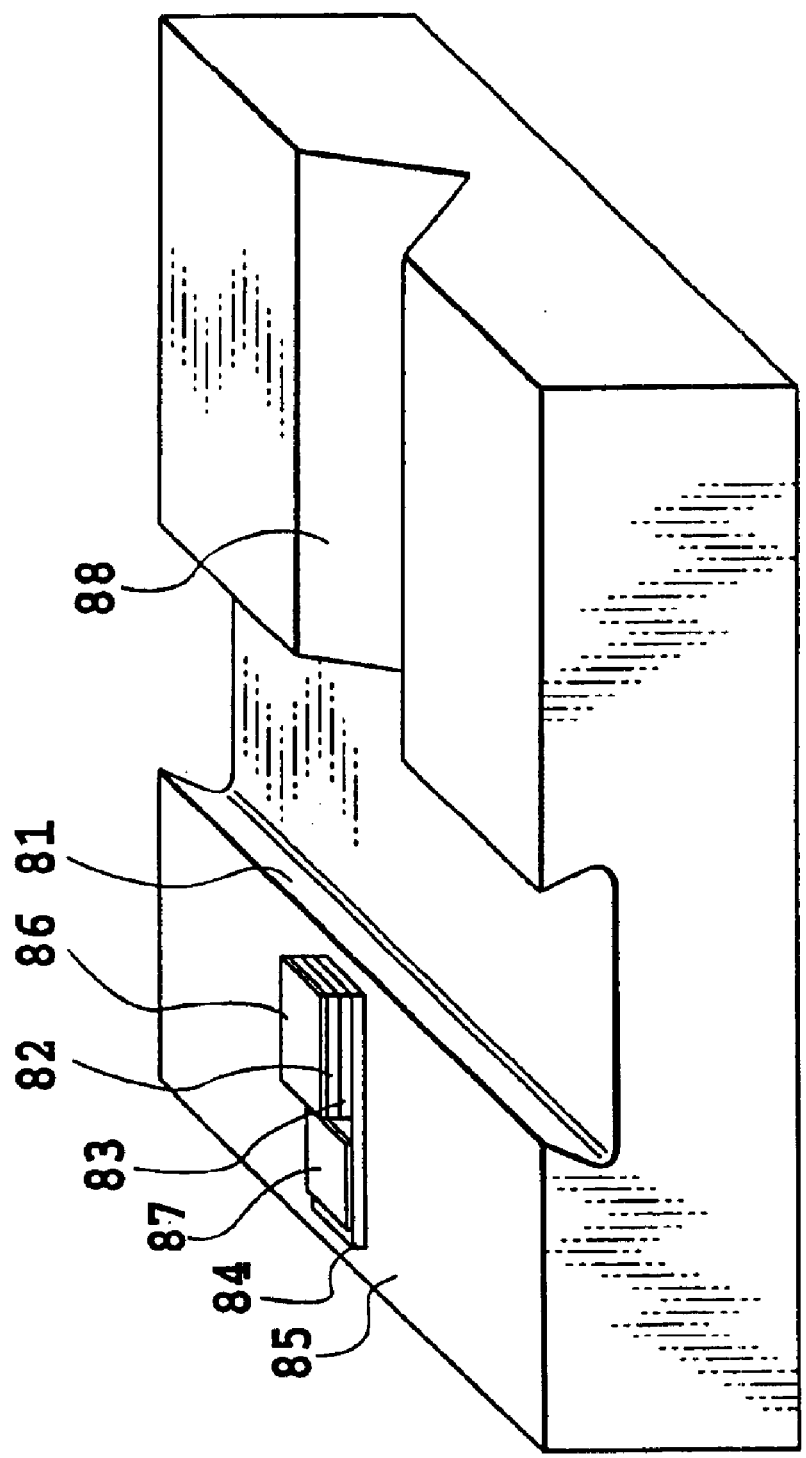
FIG. 14 is a perspective diagram showing a semiconductor photo-detector according to a seventh embodiment of the present invention.

A seventh embodiment of the present invention is shown in FIG. 14.

In FIG. 14, numeral 81 indicates a light incident facet, 82 is a 1 μm thick p-InP layer, 83 is a 1 μm thick InGaAs photo-absorption layer, 84 is a 1 μm thick n-InP layer, 85 is a semi-insulating InP substrate, 86 is a p electrode, 87 is an n electrode, and 88 is a V-shaped groove. The device has a photo-absorption layer area of 30 μm×50 μm.

The light incident facet 81 and the V-shaped groove 88 were simultaneously formed using a silicon nitride film mask having a T-shaped window by wet etching with bromine-methanol.

In this case, the light incident facet 81 and the V-shaped groove 88, in wet etching of a (001) surface wafer using bromine-methanol, were formed utilizing the property that the (111)A plane is formed in a reverse-mesa shape, and in a direction perpendicular thereto, the (−1−11) and (111) planes are formed in a forward mesa shape.

In this case, the V-shaped groove 88 is fabricated with good precision in the plane direction and, therefore, the depth can also be controlled with good controllability by the window width of the mask.

Naturally, the light incident facet (reverse-mesa part) 81 and the V-shaped groove 88 may be formed using another wet etching liquid or a dry etching method, or utilizing other crystal plane, or utilizing adhesion of the etching mask to control the angle.

Since the V-shaped groove is automatically formed by the fact that the right and left forward mesa surfaces go down with the passage of etching time until base lines of both sides are in line with each other, the depth can also be controlled with good controllability by the mask window width, however, before both base lines fall in line, the groove is in a so-called U shape. Therefore, by controlling the etching depth with time, a U-shaped groove can also be formed as necessary. Further, U-shaped grooves of different shapes can be formed by changing to another etching liquid in the course of etching.

When an anti-reflection coating film was formed on the light incident facet 81, a single mode fiber was guided by the V-shaped groove, and light of 1.3 μm was introduced, a large responsivity value of more than 0.8 A/W was obtained at an applied reverse bias of 1.5V.

Here, since the light incident position can be almost determined by the precision of the mask for forming the V-shaped groove 88, without positioning by mechanical movement of fiber, high precision positioning was possible.

Since high precision positioning is possible even when the beam size is decreased using a tapered fiber in place of the single mode fiber, the photo-absorption part of the device can be small-sized to the same level as the beam size of the focus.

Therefore, a device capable of achieving ultrafast response by size reduction can be realized in a high precision condition with the fiber.

With a device of a photo-absorption area of (10 μm×20 μm), high speed operation of a 3 dB bandwidth of 40 GHz was possible while maintaining a high responsivity.

As described above, since the photo-absorption part and the fiber can be coupled in high precision without a lens system, a module could also be easily fabricated.

In the present embodiment, the p-InP layer at the surface side is formed by a crystal growth method, however, alternatively, an undoped InP may be formed in crystal growth, and the conduction type of the main part at the surface side be determined by Zn diffusion or an ion implantation method and subsequent anneal.

Yet further, as a semiconductor photo-detector, on a semiconductor layer having a first conduction type, a multilayer structure having a large schottky-barrier height opposing a schottky electrode which has a schottky-barrier higher than the schottky barrier between the photo-absorption layer 83 and the schottky electrode may be constructed on the substrate 85, between the photo-absorption layer 83 comprising an intrinsic or first conduction type semiconductor layer, a superlattice semiconductor layer, or a multiple quantum well semiconductor layer and the schottky electrode.

Yet further, a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using semi-insulating InP as the substrate 85 and an n-InP layer at the substrate side, however, a p-InP layer can be used by reversing the above p and n, and an n-InP or p-InP substrate can also be used for the fabrication.

Yet further, a uniform composition bulk is used here as the photo-absorption layer 83, however, it is needless to say that a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 8

Figure 15:
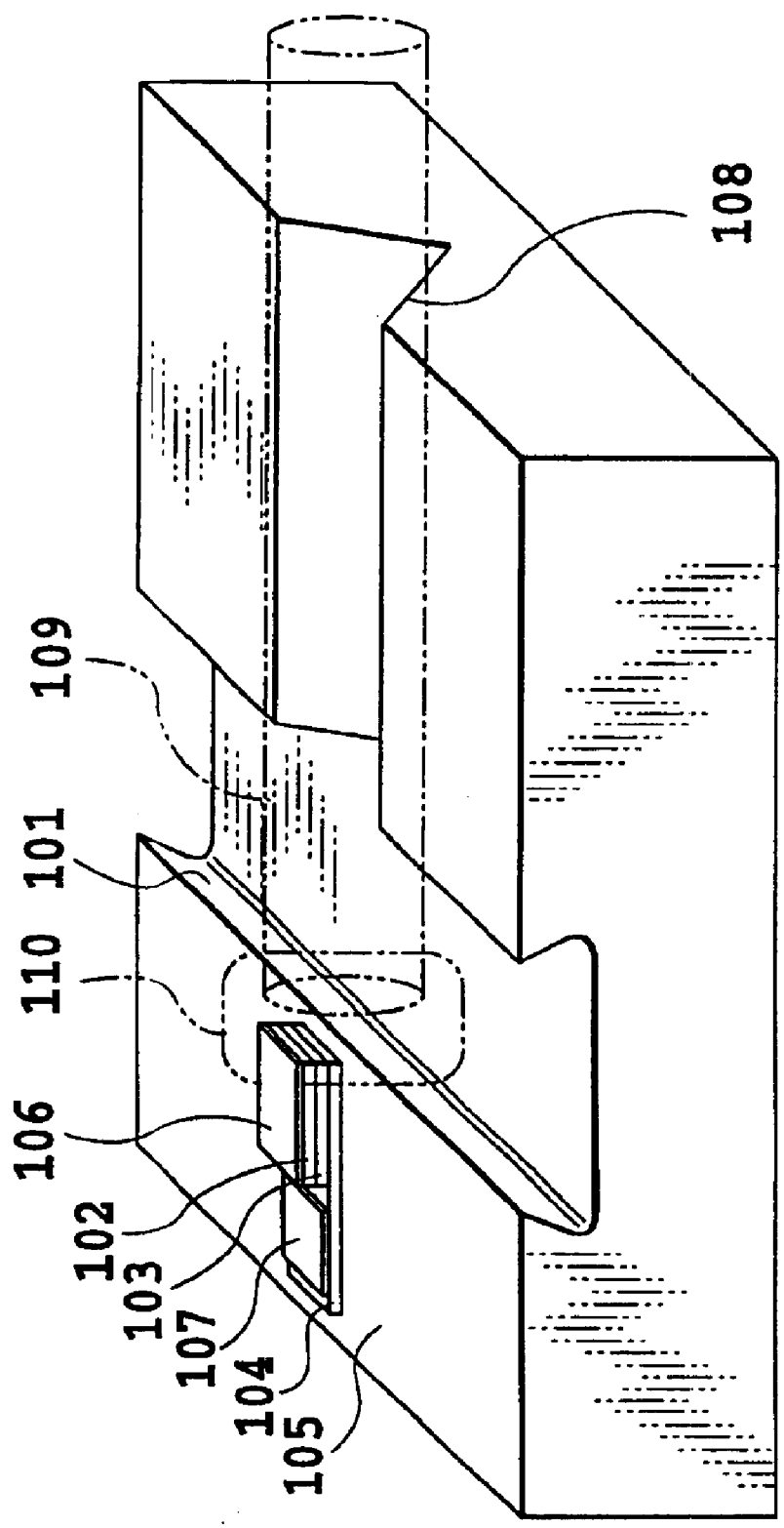
FIG. 15 is a perspective diagram showing a semiconductor photo-detector according to an eighth embodiment of the present invention.

FIG. 15 is a diagram for describing an eighth embodiment of the present invention. Numeral 101 indicates a light incident facet, 102 is a 1 μm p-InP layer, 103 is a 0.7 μm thick InGaAs photo-absorption layer, 104 is a 1 μm thick n-InP layer, 105 is a semi-insulating InP substrate, 106 is a p electrode, 107 is an n electrode, 108 is a V-shaped groove, 109 is an optical fiber, and 110 is polyimide. The device has a photo-absorption layer area of 30 μm×70 μm. The light incident facet and the V-shaped groove 108 were simultaneously formed by wet etching with bromine-methanol using a silicon nitride film mask having a T-shaped window. At this moment, the light incident facet 101 and the V-shaped groove 108 were formed utilizing the property that the (111)A plane is formed in reverse-mesa shape as shown in the figure and the (1–1–111) and (111) planes perpendicular thereto are formed in forward mesa shape in wet etching of a (001) surface wafer with bromine-methanol. In this case, the V shape is fabricated with good precision in the plane direction and, therefore, the depth can also be controlled with good controllability by the window width of the mask. Naturally, the reverse-mesa part and the V-shaped groove 108 may be formed using another wet etching liquid or a dry etching method, or utilizing other crystal plane, or utilizing adhesion of the etching mask to control the angle. Further, the V-shaped groove 108 can be formed in a U shape or the like by controlling the etching condition and the mask shape.

The single mode fiber 109 is guided by the V-shaped groove 108, disposed opposite to the light incident facet as shown in the figure, and the space is buried in polyimide having a refractive index of 1.7. The photo-detector and the fiber end surface are provided with anti-reflection coating films. When light of wavelength 1.55 μm was introduced by the single mode fiber 109, a large responsivity value of 1.0 A/W at an applied reverse bias of 1.5V is obtained. Here, since the light incident position can be almost determined by the precision of the mask for forming the V-shaped groove guide, without positioning by mechanical movement of fiber, high precision positioning was possible. Since, as shown above, the photo-absorption part and the fiber 109 can be coupled with high precision without a lens system, a module could be easily fabricated. Layer structure of the photo-detector of the present embodiment is designed for enabling high speed operation. That is, the photo-absorption layer is as thin as 0.7 μm to decrease the carrier transit time. Further, the refraction angle is the largest when the space between the device and the fiber is air, therefore, the device length required for receiving refracted light can be reduced, thereby reducing the device capacity which is determined by the device size. Since, even when a tapered fiber is used in place of the single mode fiber 109 to decrease the beam size, the photo-absorption part of the device can be small-sized to the same level as the focus beam size. Therefore, a device capable of making ultrafast response by size reduction can be realized with a high-coupling state with the fiber. With a device of a photo-absorption area of 10 μm×20 μm, high speed operation of more than a 3 dB bandwidth of 40 GHz was possible while maintaining high responsivity. However, with the device using air between the device and fiber, the responsivity was 0.8 A/W. This is because absorption in the photo-absorption layer is insufficient. Since high speed and responsivity are basically in a trade-off relation, a decrease in responsivity associated with high speed is inevitable to some extent, however, according to the present invention, it is possible to change the responsivity over a wide range even when the absorption layer is decreased in thickness for high speed operation. However, the operation speed is decreased to some extent by increasing the device capacity associated with an increase in photo-detector length.

Figure 16:
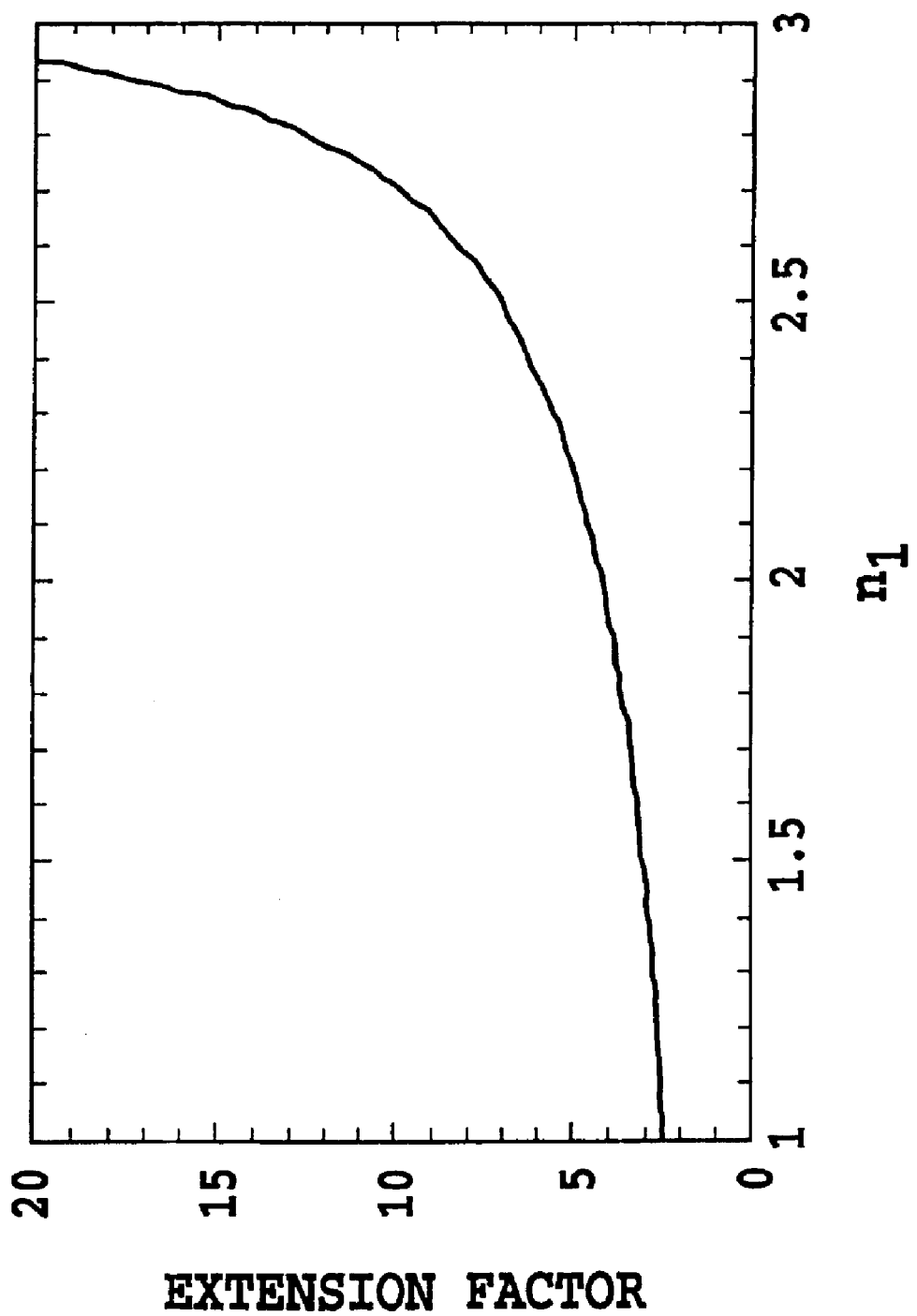
FIG. 16 is a graph showing a calculation result of extension factor to absorption layer thickness of effective absorption length relative to refractive index ($n_1$) of substance between the device and fiber when light of wavelength 1.55 μm is incident at a mesa angle of 55 degrees in a InP substrate of the semiconductor photo-detector in the eighth embodiment of the present invention.

FIG. 16 shows a calculation result in InP of extension factor to absorption layer thickness of effective absorption length relative to refractive index ($n_1$) of the substance between the device and fiber when light of wavelength 1.55 μm is incident at a mesa angle of 55 degrees. The extension factor can be substantially increased by using a material having a large $n_1$. In the present embodiment, polyimide having a refractive index of 1.7 is used, the extension factor in this case provides a 41% increase relative to air, as a result, the above increase in responsivity is obtained. It is needless to say that the substance between the device and fiber may be any one which has a good transmissivity to incident light and a relative index of more than 1, selected from organic substances such as various polyimides including fluorinated polyimides, various epoxies including epoxy resins, fluorinated epoxies, fluorinated epoxy acrylate resins, acrylics, metamorphic silicone resins, and inorganic substances such as chalcogenide glass having a refractive index of more than 2, or a liquid substance such as oil. By appropriately selecting such various substances, it is possible to change the refraction angle at the light incident facet of the photo-detector, even when using a refraction type semiconductor photo-detector cut from the same wafer having the same layer structure and the same mesa angle construction, and adjustment of responsivity according to the application is possible.

Further, as to the optical fiber, in the present embodiment, a single mode optical fiber or a tapered fiber is used, however, it is needless to say that one which is based on various organic substances such as a plastic fiber may be used.

In the present embodiment, the p-InP layer at the surface side is formed by a crystal growth, however, alternatively, an undoped InP may be formed in crystal growth, and the conduction type of the main part at the surface side be determined by Zn diffusion or an ion implantation method and subsequent anneal. Further, as the semiconductor photo-detector, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon. Yet further, the present embodiment is an example using semi-insulating InP as the substrate and an n-InP layer at the substrate side, however, a p-InP layer can be used by reversing the above p and n, and an n-InP or p-InP substrate can also be used for the fabrication. Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used. Yet further, it is needless to say that a material system other than InGaAsP/InP such as InGaAlAs/InGaAsP or AlGaAs/GaAs system or a material system including a strain may be used.

Embodiment 9

Figure 17:
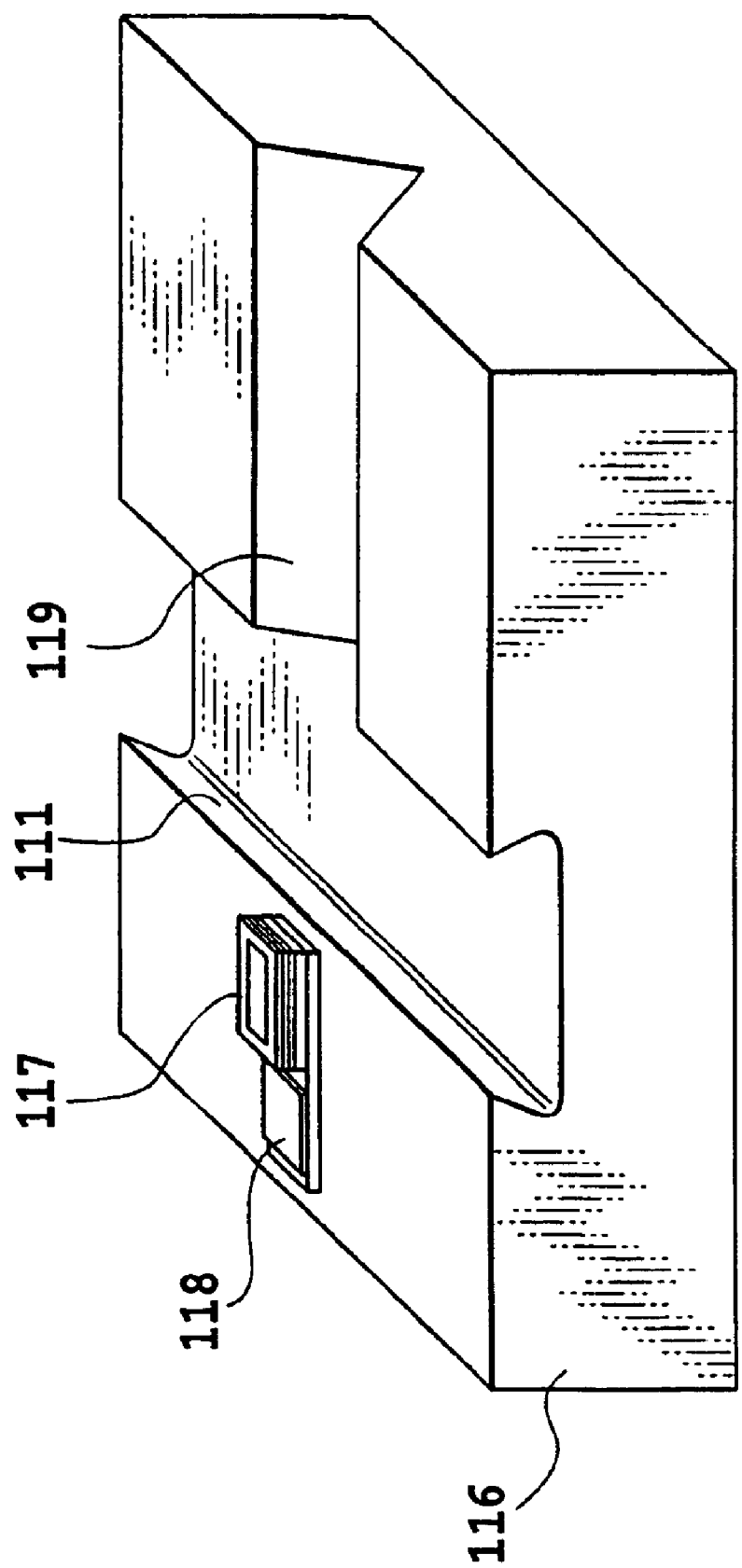
FIG. 17 is a perspective diagram showing a semiconductor photo-detector according to a ninth embodiment of the present invention.
Figure 18:
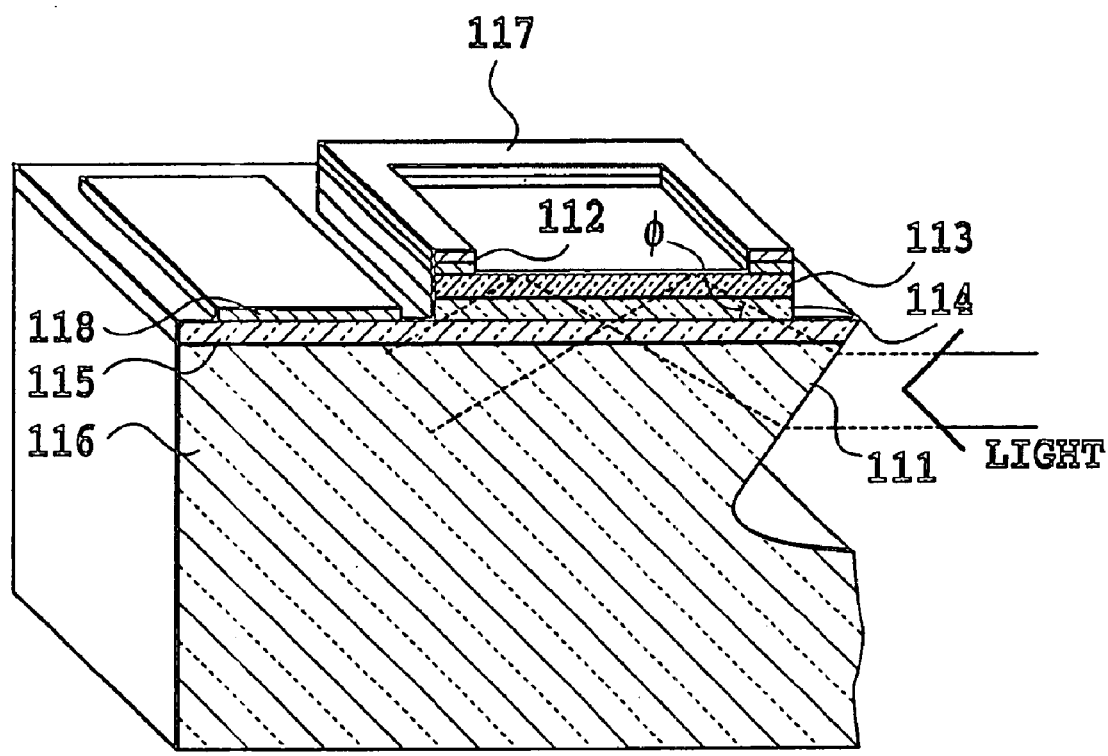
FIG. 18 is a sectional perspective diagram of a photo-absorption region of the semiconductor photo-detector according to the ninth embodiment of the present invention.

FIG. 17 is a diagram for describing a ninth embodiment of the present invention. FIG. 18 is a sectional perspective diagram of the photo-absorption region. Numeral 111 indicates a light incident facet, 112 is a 0.2 μm thick p+-InGaAsP (1.2 μm composition) layer, 113 is a 1 μm thick p-InP layer, 114 is a 0.5 μm thick InGaAs photo-absorption layer, 115 is a 1 μm thick n-InP layer, 116 is a semi-insulating InP substrate, 117 is a p electrode, 118 is an n electrode, and 119 is a V-shaped groove. A lead electrode and a pad electrode are omitted in this figure for simplicity since these parts are complicated in structure and intricate to be described. The device has a photo-absorption layer area of 30 μm×50 μm. The light incident facet 111 and the V-shaped groove 119 were simultaneously formed by wet etching with bromine-methanol using a silicon nitride film mask having a T-shaped window. At this moment, the light incident facet 111 and the V-shaped groove 119 were formed utilizing the property that the (111)A plane is formed in reverse-mesa shape as shown in the figure and the (1–1–111) and (111) planes perpendicular thereto are formed in forward mesa shape in wet etching of a (001) surface wafer with bromine-methanol. In this case, the V shape is fabricated with good precision in the plane direction and, therefore, the depth can also be controlled with good controllability by the window width of the mask.

Naturally, the reverse-mesa part and the V-shaped groove 119 may be formed using another wet etching liquid or a dry etching method, or utilizing other crystal plane, or utilizing adhesion of the etching mask to control the angle. Further, the V-shaped groove 119 can be formed in a U shape or the like by controlling the etching condition and the mask shape.

An anti-reflection coating film is formed on the light incident facet. Right above the main reaching area of refracted light is terminated with air, and the p electrode 117 is formed in outer peripheral part of the area. Incident light of wavelength 1.3 μm from the lateral side is refracted at the light incident facet and transmits at an angle of ø=24.7 degrees as shown in the figure relative to the upper surface. In this case, if the refractive index of the semiconductor is assumed as 3.209, total reflection occurs when ø is smaller than 71.8 degrees, and the present embodiment satisfies this condition. When the single mode fiber was guided by the V-shaped groove 119 and light of wavelength 1.3 μm was incident, a large responsivity value of more than 0.9 A/W was obtained at an applied reverse bias of 1.0V. In the case of prior art structure in which the p electrode is present on almost the entire surface of the upper surface, a value of only about 0.7 A/W was obtained. Here, since the light incident position can be almost determined by the precision of the mask for forming the V-shaped groove guide, without positioning by mechanical movement of the fiber, high precision positioning was possible. Since, even when a tapered fiber is used in place of the single mode fiber to decrease the beam size, the photo-absorption part of the device can be small-sized to the same level as the focus beam size. Therefore, a device capable of making ultrafast response by size reduction can be realized with a high-coupling state with the fiber. With a device of a photo-absorption area of 10 μm×20 μm, high speed operation of more than a 3 dB bandwidth of 40 GHz was possible while maintaining high responsivity. Since, as shown above, the photo-absorption part and the fiber can be coupled with high precision without a lens system, a module could be easily fabricated.

In the present embodiment, the p electrode is formed in a ring shape, however, it is needless to say that although the overall reflectivity is slightly decreased, it may be formed in any structure such as a reticulated electrode shape, or the upper InP/InGaAsP layer remained as a high-concentration doped layer to decrease the sheet resistance sufficiently, or the p electrode be formed in only one side part. In the present embodiment, right above the reaching area of incident light is terminated with air, it may be any of inorganic substances such as $SiO_2$ or SiNx or organic substances such as polyimide or epoxy, which has an appropriately smaller refractive index than the semiconductor and satisfies the total reflection condition ($\phi < \cos^{-1}(n_2/n_1)$; where $n_1$ is a refractive index of the semiconductor, and $n_2$ is a refractive index of the terminating substance). For example, when a polyimide of having a refractive index of 1.55 is used, ø may be smaller than 61.1 degrees.

In the present embodiment, the p-InP layer 113 at the surface side is formed by a crystal growth, however, alternatively, an undoped InP layer may be formed in crystal growth, and the conduction type of the main part at the surface side be determined by Zn diffusion or an ion implantation method and subsequent anneal. Further, as the semiconductor photo-detector, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon. Yet further, the present embodiment is an example using semi-insulating InP as the substrate and an n-InP layer at the substrate side, however, a p-InP layer can be used by reversing the above p and n, and an n-InP or p-InP substrate can also be used for the fabrication.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 10

Figure 19:
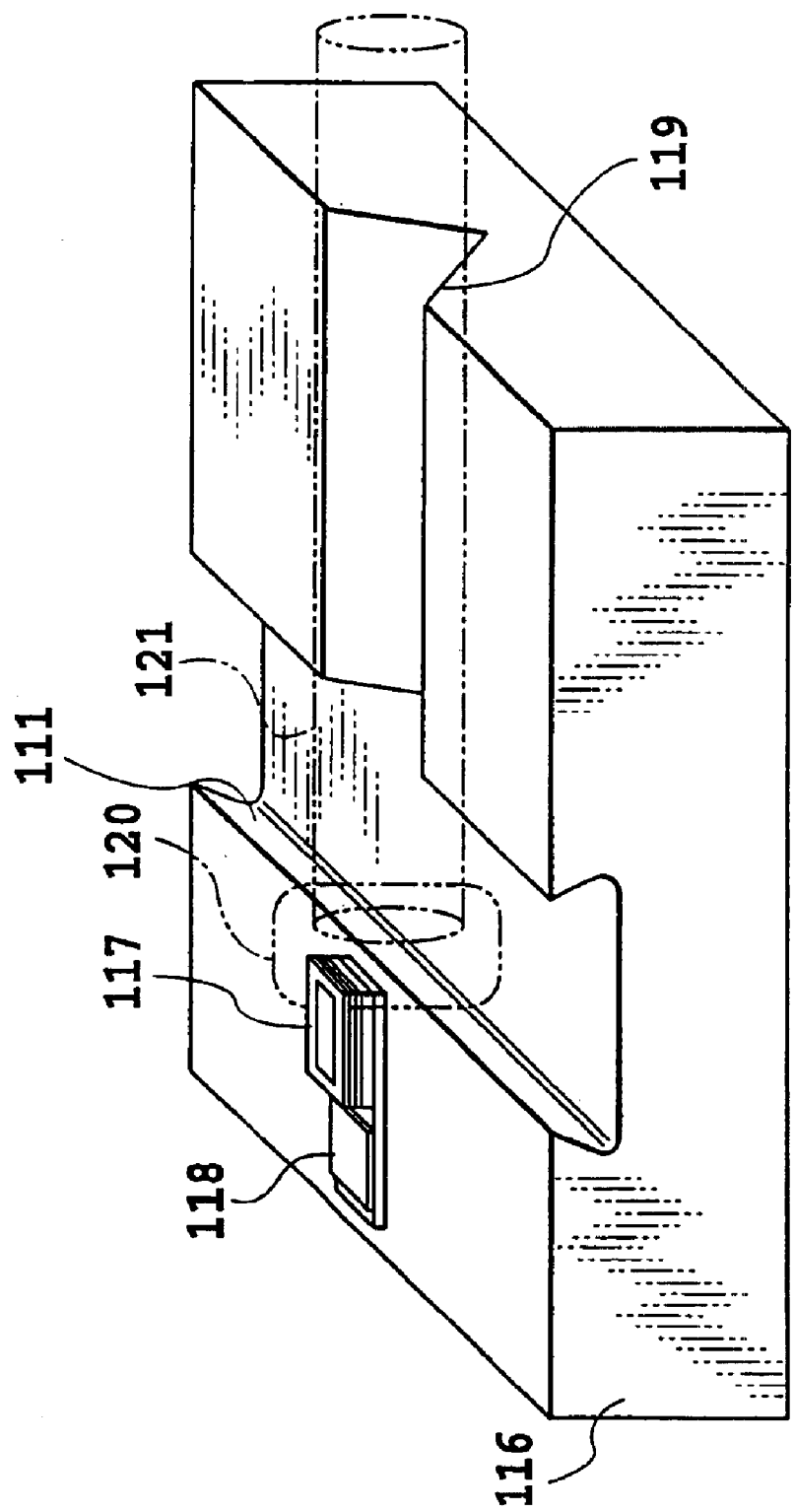
FIG. 19 is a perspective diagram showing a semiconductor photo-detector according to a tenth embodiment of the present invention.

FIG. 19 is a diagram for describing a tenth embodiment of the present invention. A sectional perspective diagram of photo-absorption region is the same as in FIG. 18. Numeral 111 indicates a light incident facet, 112 is a 0.2 µm thick p+-InGaAsP (1.2 µm composition) layer, 113 is a 1 µm thick p-InP layer, 114 is a 0.5 µm thick InGaAs photo-absorption layer, 115 is a 1 µm thick n-InP layer, 116 is a semi-insulating InP substrate, 117 is a p electrode, 118 is an n electrode, 119 is a V-shaped groove, 120 is polyimide, and 121 is a single mode optical fiber. A lead electrode and a pad electrode are omitted in this figure for simplicity since these parts are complicated in structure and intricate to be described. The device has a photo-absorption layer area of 30 µm×70 µm. The light incident facet 111 and the V-shaped groove 119 were simultaneously formed by wet etching with bromine-methanol using a silicon nitride film mask having a T-shaped window. At this moment, the light incident facet 111 and the V-shaped groove 119 were formed utilizing the property that the (111)A plane is formed in reverse-mesa shape as shown in the figure and the (1−1−111) and (111) planes perpendicular thereto are formed in forward mesa shape in wet etching of a (001) surface wafer with bromine-methanol. In this case, the V shape is fabricated with good precision in the plane direction and, therefore, the depth can also be controlled with good controllability by the window width of the mask. Naturally, the reverse-mesa part and the V-shaped groove part may be formed using another wet etching liquid or a dry etching method, or utilizing other crystal plane, or utilizing adhesion of the etching mask to control the angle. Further, the V-shaped groove part can be formed in a U shape or the like by controlling the etching condition and the mask shape.

The single mode fiber 121 is guided by the V-shaped groove 119 and disposed opposite to the light incident facet 111 as shown in the figure, and the space in between is buried with polyimide having a refractive index of 1.7. Further, an anti-reflection coating film is formed on the photo-detector and the fiber end surface.

Right above the main reaching area of refracted light is terminated with air, and the p electrode 117 is formed in outer peripheral part of the area. Incident light of wavelength 1.55 µm from the lateral side is refracted at the light incident facet and transmits at an angle of ø=17.1 degrees as shown in the figure relative to the upper surface. In this case, if the refractive index of the semiconductor is assumed as 3.17, total reflection occurs when ø is smaller than 71.6 degrees, and the present embodiment satisfies this condition. When light of wavelength 1.55 µm was introduced by the single mode fiber, a large responsivity value of more than 1.0 A/W was obtained at an applied reverse bias of 1.0V. In the case of prior art structure in which the p electrode is present on almost the entire surface of the upper surface, a value of only about 0.8 A/W was obtained.

Here, since the light incident position can be almost determined by the precision of the mask for forming the V-shaped groove guide, without positioning by mechanical movement of the fiber, high precision positioning was possible. Since, even when a tapered fiber is used in place of the single mode fiber to decrease the beam size, the photo-absorption part of the device can be small-sized to the same level as the focus beam size. Therefore, a device capable of making ultrafast response by size reduction can be realized with a high-coupling state with the fiber. With a device of a photo-absorption area of 10 µm×20 µm, high speed operation of more than a 3 dB bandwidth of 40 GHz was possible while maintaining high responsivity. Since, as shown above, the photo-absorption part and the fiber can be coupled with high precision without a lens system, a module could be easily fabricated.

In the present embodiment, the p electrode is formed in a ring shape, however, it is needless to say that although the overall reflectivity is slightly decreased, it may be formed in any structure such as a reticulated electrode shape, or the upper InP/InGaAsP layer remained as a high-concentration doped layer to decrease the sheet resistance sufficiently, or the p electrode be formed in only one side part. In the present embodiment, right above the reaching area of incident light is terminated with air, however, it may be any of inorganic substances such as $SiO_2$ or SiNx or organic substances such as polyimide or epoxy, which has an appropriately smaller refractive index than the semiconductor and satisfies the total reflection condition (ø<$\cos^{-1}(n_2/n_1)$; where $n_1$ is a refractive index of the semiconductor, and $n_2$ is a refractive index of the terminating substance). For example, when a polyimide of having a refractive index of 1.55 is used, ø may be smaller than 60.7 degrees.

FIG. 16 shows, as described above, a calculation result in InP of extension factor to absorption, layer thickness of effective absorption length relative to refractive index ($n_1$) of the substance between the device and fiber when light of wavelength 1.55 µm is incident at a mesa angle of 55 degrees. The extension factor can be substantially increased by using a material having a large $n_1$. In the present embodiment, polyimide having a refractive index of 1.7 is used, the extension factor in this case provides a 41% increase relative to air, as a result, the above increase in responsivity is obtained. It is needless to say that the substance between the device and fiber may be any one which has a good transmissivity to incident light and a relative index of more than 1, selected from organic substances such as various polyimides including fluorinated polyimides, various epoxies including epoxy resins, fluorinated epoxies, fluorinated epoxy acrylate resins, acrylics, metamorphic silicone resins, and inorganic substances such as chalcogenide glass having a refractive index of more than 2, or a liquid substance such as oil. By appropriately selecting such various substances, it is possible to change the refraction angle at the light incident facet of the photo-detector, even when using a refraction type semiconductor photo-detector cut from the same wafer having the same layer structure and the same mesa angle construction, and adjustment of responsivity according to the application is possible.

Further, as to the optical fiber, in the present embodiment, a single mode optical fiber or a tapered fiber is used, however, it is needless to say that one which is based on various organic substances such as a plastic fiber may be used.

In the present embodiment, the p-InP layer at the surface side is formed by a crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon. Yet further, the present embodiment is an example using semi-insulating InP as the substrate and an n-InP layer at the substrate side, however, a p-InP layer can be used by reversing the above p and n, and an n-InP or p-InP substrate can also be used for the fabrication.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 11

Figure 20:
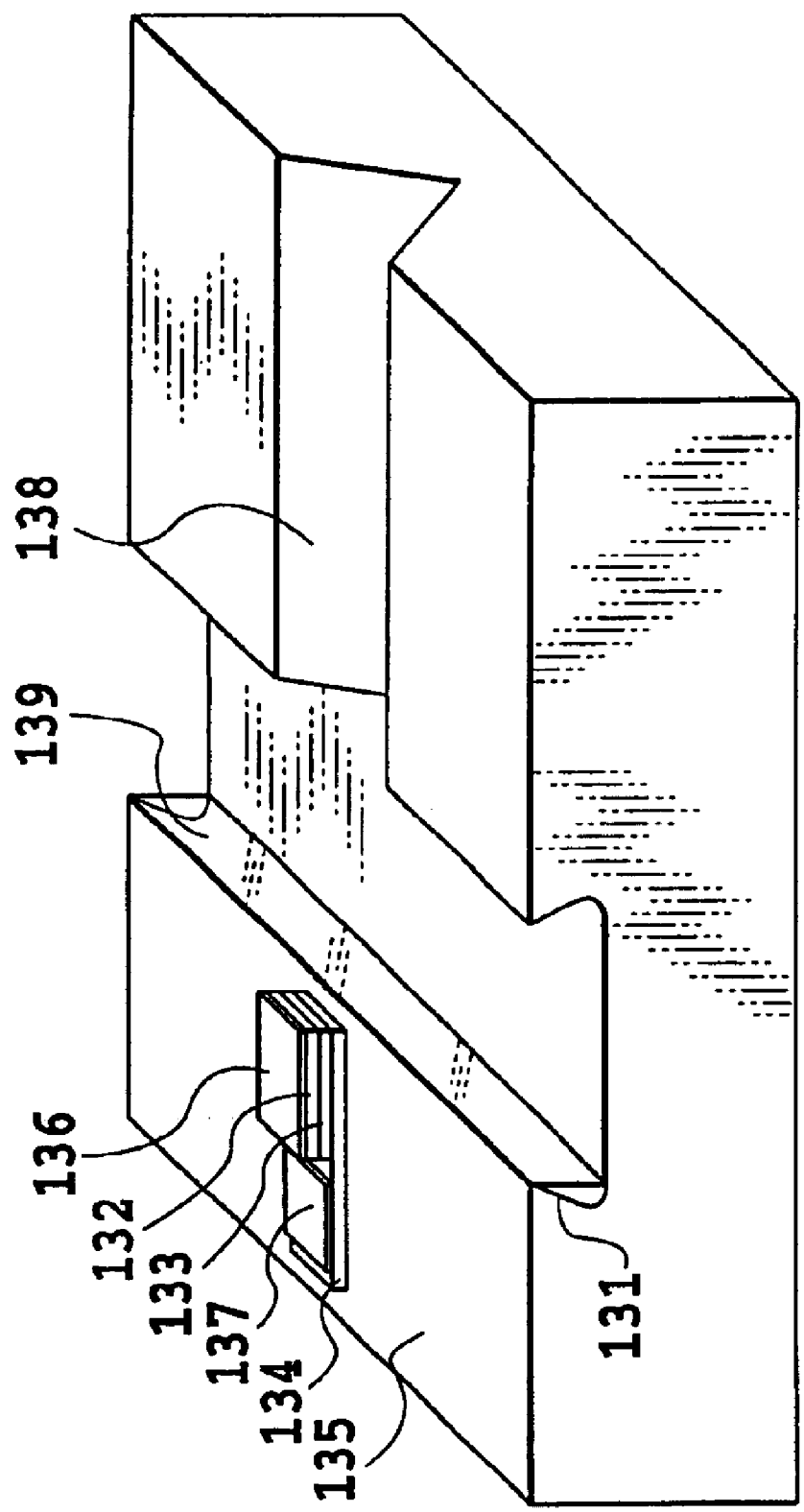
FIG. 20 is a perspective diagram showing a semiconductor photo-detector according to an eleventh embodiment of the present invention.

A refraction type semiconductor photo-detector according to an eleventh embodiment of the present invention is shown in FIG. 20.

As shown in the figure, on a semi-insulating InP substrate 135, a semiconductor multilayer structure as a photo-absorption part comprising a 1 μm thick n-InP layer 134, a 1 μm thick InGaAs photo-absorption layer 133, and a 1 μm thick p-InP layer 132 is stacked, and a p electrode 136 and an n electrode 137 are formed, further, a light incident facet 131 inwardly angled as it separates from the surface side, so that incident light transits the photo-absorption layer 133 diagonally with respect to the layer thickness direction, is formed, still further, a V-shaped groove 138 is formed opposing the light incident facet 131. The device has a photo-absorption layer area of 30 μm×50 μm.

The light incident facet 131 and its vicinity are buried in a photoresist 139 which is an organic substance.

The light incident facet 131 and the V-shaped groove 138 were simultaneously formed by wet etching with bromine-methanol using a silicon nitride film mask having a T-shaped window.

At this moment, the light incident facet 131 and the V-shaped groove 138 were formed utilizing the property that the (111)A plane is formed in reverse-mesa shape as shown in the figure and the (1–1–111) and (111) planes perpendicular thereto formed in forward mesa shape in wet etching of a (001) surface wafer with bromine-methanol.

In this case, the V shape is fabricated with good precision in the plane direction and, therefore, the depth can also be controlled with good controllability by the window width of the mask.

Naturally, the reverse-mesa part and the V-shaped groove 138 may be formed using another wet etching liquid or a dry etching method, or utilizing other crystal plane, or utilizing adhesion of the etching mask to control the angle.

Since the V-shaped groove 138 is automatically formed by the fact that the right and left forward mesa surfaces go down with the passage of etching time until base lines of both sides are in line with each other, the depth can also be controlled with good controllability by the mask window width, however, before both base lines fall in line, the groove is in a so-called U shape.

Therefore, by controlling the etching depth with time, a U-shaped groove can also be formed as necessary.

Further, U-shaped grooves of different shapes can be formed by changing to another etching liquid in the course of etching.

When, after forming an anti-reflection coating film on the light incident facet 131, the entire surface is coated with a photoresist and exposed by a exposure apparatus, since the reverse-mesa visor part is not exposed, the resist 139 as an organic substance is remained in a forward mesa shape from the visor part as shown in the figure by the resist phenomenon.

The forward mesa shape of the resist 139 can be controlled by controlling the exposure time or exposing the substrate diagonally.

In the present embodiment, the buried part of the resist 139 is formed by exposing the entire surface, however, alternatively, exposure may be performed using a mask to form the buried part of the resist 139 apart by a finite length from the tip of the light incident facet 131.

Even when the single mode fiber (not shown) is put on the V-shaped groove 138 to be guided to contact against, since the front edge of the fiber is stopped by the resist 139, the fiber tip will not hit against the light incident facet 131 of the device.

When, after the single mode fiber is fixed with epoxy or the like, only the resist part is selectively removed using an organic solvent, a photo-detector module as a photo-detection device can be fabricated.

Here, the light incident position in horizontal and vertical directions can be almost determined by precision of the mask for forming the V-shaped groove 138, and positioning in the optical axis direction is also possible by butting, high precision positioning was possible without positioning by delicate mechanical movement of the fiber.

For example, when light of wavelength 1.3 μm is introduced, a large responsivity value of more than 0.8 A/W was obtained at an applied reverse bias of 1.5V.

Further, since, even when a tapered fiber is used in place of the single mode fiber to decrease the beam size, high precision positioning is possible, the photo-absorption part of the device can be small-sized to the same level as the focus beam size.

Therefore, a device capable of making ultrafast response by size reduction can be realized with a high-coupling state with the fiber, and easy modular construction be achieved.

For example, with a device of a photo-absorption area of 10 μm×20 μm, fabrication of a module capable of making high speed operation of a 3 dB bandwidth of 40 GHz was possible while maintaining high responsivity.

In the present embodiment, the p-InP layer at the surface side is formed by crystal growth, however, alternatively, an undoped InP may be formed in crystal growth, and the conduction type of the main part at the surface side be determined by Zn diffusion or an ion implantation method and subsequent anneal.

Further, as the semiconductor photo-detector, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using semi-insulating InP as the substrate and an n-InP layer at the substrate side, however, a p-InP layer can be used by reversing the above p and n, and an n-InP or p-InP substrate can also be used for the fabrication.

Yet further, a uniform composition bulk is used here as the photo-absorption layer, however, it is needless to say that a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 12

Figure 21:
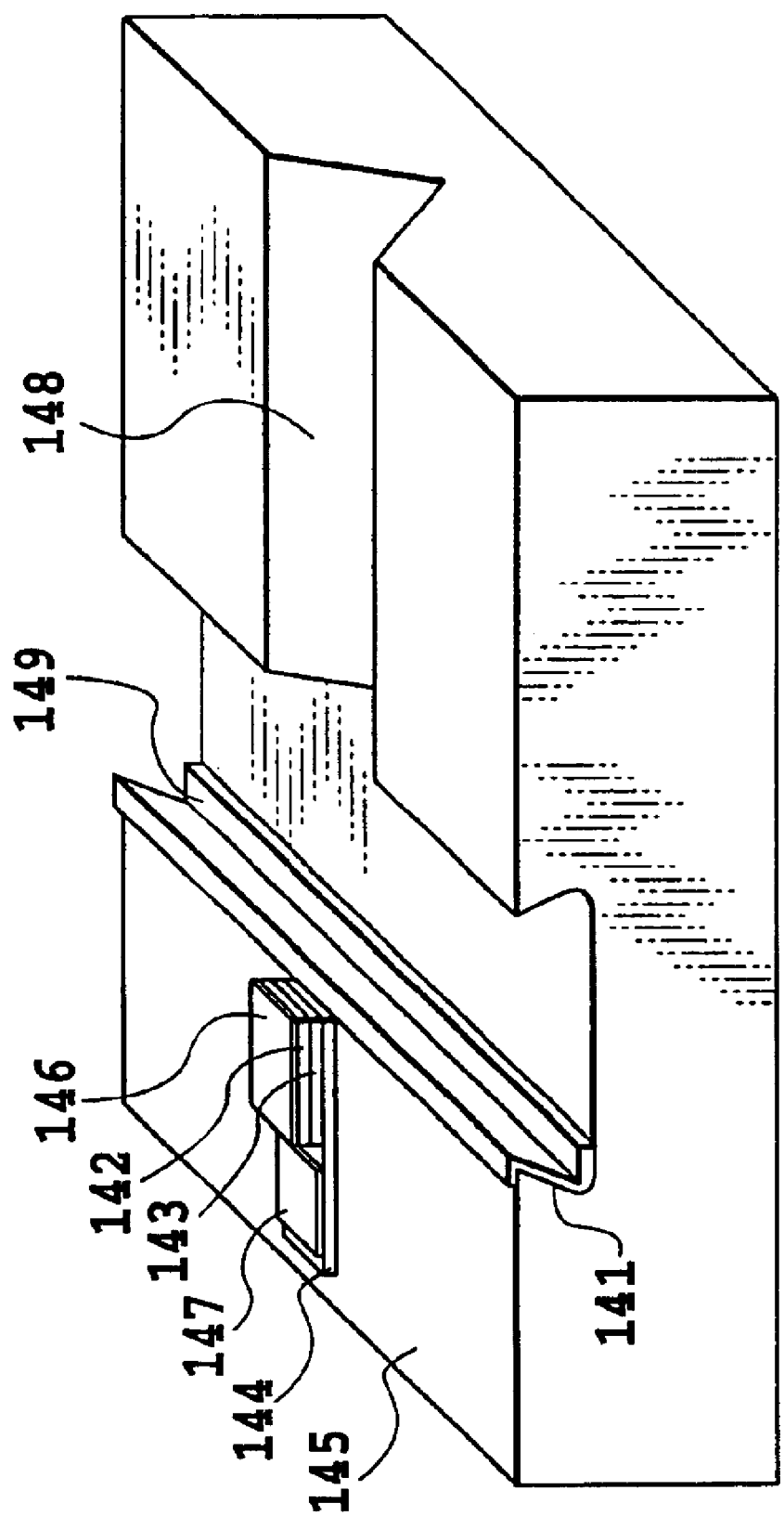
FIG. 21 is a perspective diagram showing a semiconductor photo-detector according to a twelfth embodiment of the present invention.

A refraction type semiconductor photo-detector according to a twelfth embodiment of the present invention is shown in FIG. 21.

As shown in the figure, on a semi-insulating InP substrate 145, a semiconductor multilayer structure as a photo-absorption part comprising a 1 μm thick n-InP layer 144, a 1 μm thick InGaAs photo-absorption layer 143, and a 1 μm thick p-InP layer 142 is stacked, and a p electrode 146 and an n electrode 147 are formed, further, a light incident facet 141 inwardly angled as it separates from the surface side, so that incident light transits the photo-absorption layer 143 diagonally with respect to the layer thickness direction, is formed, still further, a V-shaped groove 148 is formed opposing the light incident facet 141. The device has a photo-absorption layer area of 30 μm×70 μm.

The light incident facet 141 and its vicinity are buried in polyimide 149 which is an organic substance.

The light incident facet 141 and the V-shaped groove 148 were simultaneously formed by wet etching with bromine-methanol using a silicon nitride film mask having a T-shaped window.

At this moment, the light incident facet 141 and the V-shaped groove 148 were formed utilizing the property that the (111)A plane is formed in reverse-mesa shape as shown in the figure and the (1–1–111) and (111) planes perpendicular thereto are formed in forward mesa shape in wet etching of a (001) surface wafer with bromine-methanol.

In this case, the V shape is fabricated with good precision in the plane direction and, therefore, the depth can also be controlled with good controllability by the window width of the mask.

Naturally, the reverse-mesa part and the V-shaped groove 148 may be formed using another wet etching liquid or a dry etching method, or utilizing other crystal plane, or utilizing adhesion of the etching mask to control the angle.

Since the V-shaped groove 148 is automatically formed by the fact that the right and left forward mesa surfaces go down with the passage of etching time until base lines of both sides are in line with each other, the depth can also be controlled with good controllability by the mask window width, however, before both base lines fall in line, the groove is in a so-called U shape.

Therefore, by controlling the etching depth with time, a U-shaped groove can also be formed as necessary.

Further, U-shaped grooves of different shapes can be formed by changing to another etching liquid in the course of etching.

After forming an anti-reflection coating film on the light incident facet 141, polyimide 149 was coated on the entire surface by spin coating, and a resist coated thereon, exposure performed using a mask for covering the light incident facet 141 apart by a finite length from the tip part of the light incident facet 141, and development performed.

In this case, by using a substance which is etched with a resist developer as the polyimide, the polyimide 149 as an organic substance is remained in a mesa shape to the position apart by a finite length from the visor part as shown in the figure.

FIG. 21 is a schematic diagram showing the state after the resist is removed using acetone.

Even when the single mode fiber (not shown) is put on the V-shaped groove 148 to be guided to contact against, since the tip part edge of the fiber is stopped by the polyimide 149, the fiber tip will not hit against the light incident facet 141 of the device.

After butting of the single mode fiber, it was fixed including between the device and the fiber with polyimide (not shown) to fabricate a photo-absorption module as a photo-detection device.

Here, the light incident position in horizontal and vertical directions can be almost determined by precision of the mask for forming the V-shaped groove 148, and positioning in the optical axis direction is also possible by butting, high precision positioning was possible without positioning by delicate mechanical movement of the fiber.

For example, when light of wavelength 1.3 μm is introduced, a large responsivity value of more than 0.8 A/W was obtained at an applied reverse bias of 1.5V.

Further, since, also when a tapered fiber is used in place of the single mode fiber to decrease the beam size, high precision positioning is possible, the photo-absorption part of the device can be small-sized to the same level as the focus beam size.

Therefore, a device capable of making ultrafast response by size reduction can be realized with a high-coupling state with the fiber, and easy modular construction be achieved.

For example, with a device of a photo-absorption area of 10 μm×20 μm, fabrication of a module capable of making high speed operation of a 3 dB bandwidth of 40 GHz was possible while maintaining high responsivity.

In the present embodiment, polyimide 149 is patterned using a resist as a mask and developing with a resist developer, however, patterning of the polyimide 149 may be performed by forming a mask such as $SiO_2$ or a metal and other techniques such as reactive ion etching (RIE) by oxygen or the like or reactive ion beam etching (RIBE).

Further, a photo-detection device may be fabricated by coating another organic substance other than polyimide such as epoxy or the like followed by similar patterning, and fixing including between the device and fiber with the same substance.

In the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using semi-insulating InP as the substrate and an n-InP layer at the substrate side, however, a p-InP layer can be used by reversing the above p and n, and an n-InP or p-InP substrate can also be used for the fabrication.

Yet further, a uniform composition bulk is used here as the photo-absorption layer, however, a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, a material system other than InGaAsP/InP such as InGaAlAs/InGaAsP or AlGaAs/GaAs system or a material system including a strain may be used.

Embodiment 13

Figure 22:
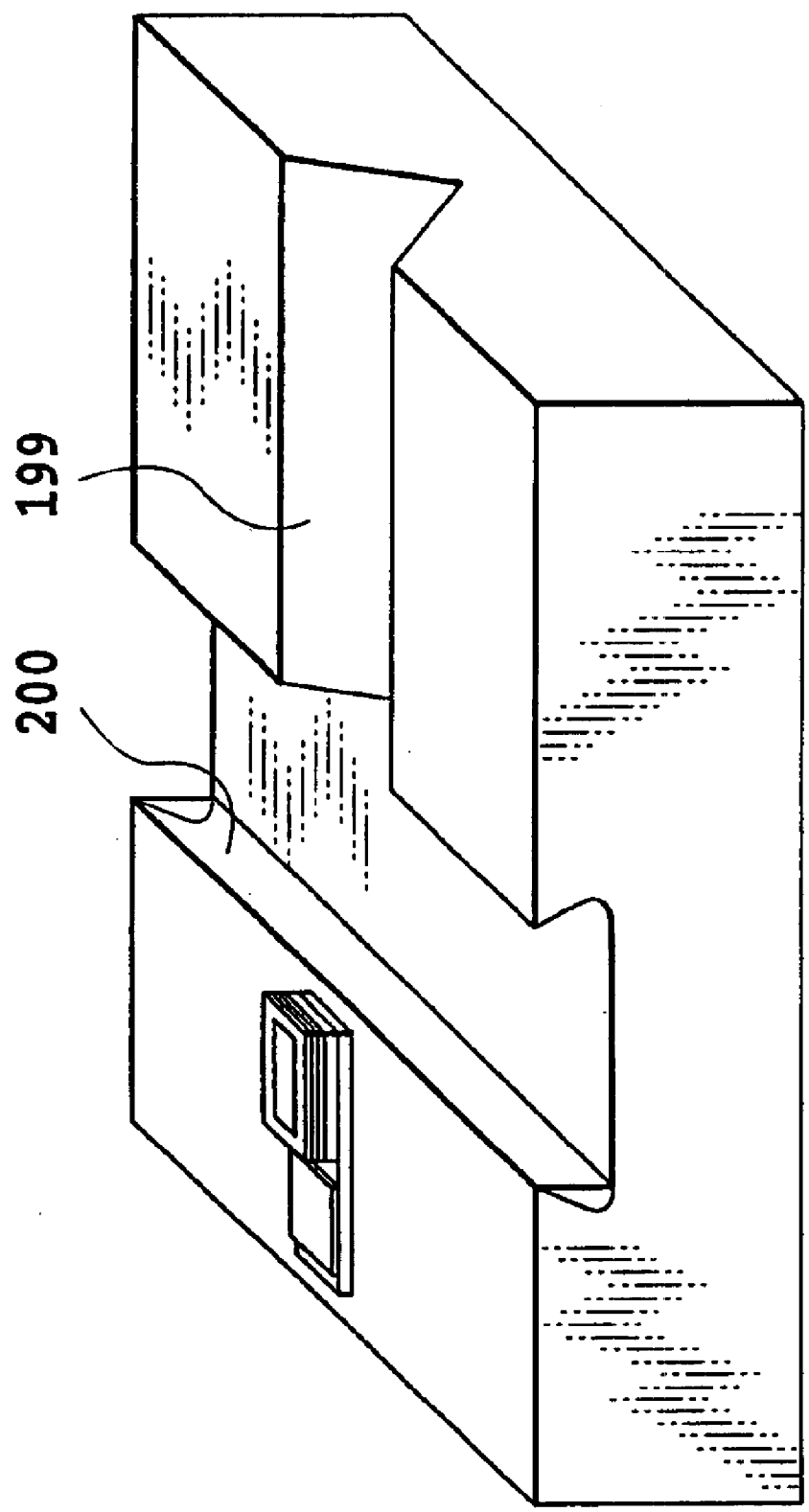
FIG. 22 is a perspective diagram showing a semiconductor photo-detector according to a thirteenth embodiment of the present invention.
Figure 23:
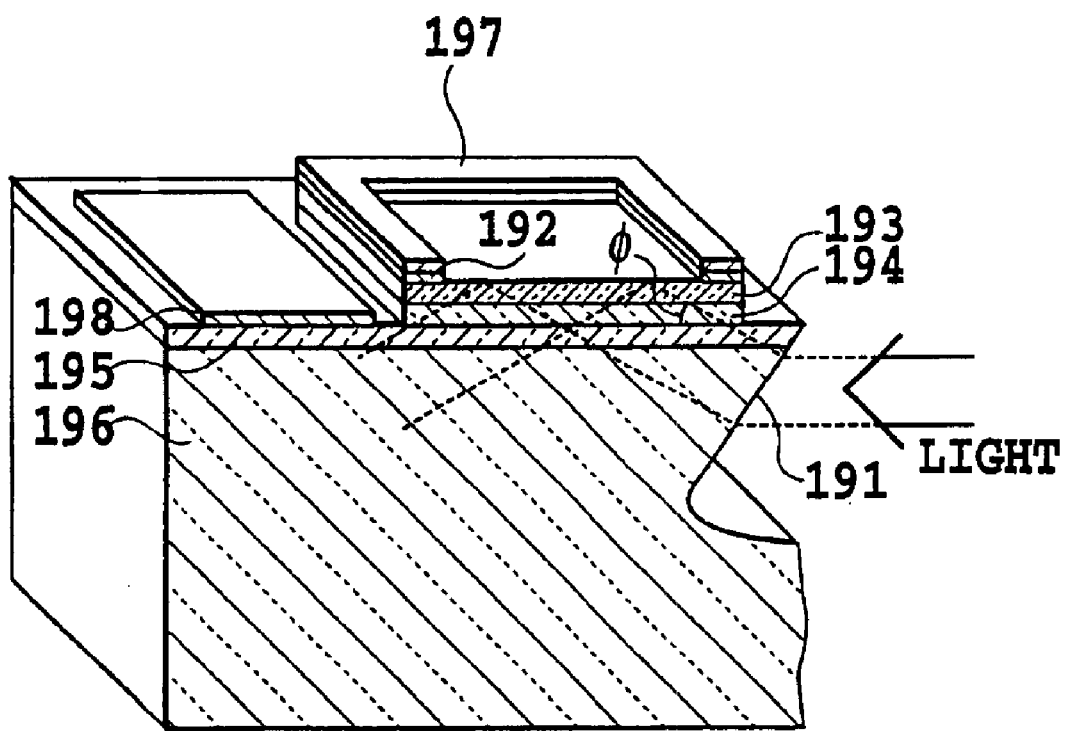
FIG. 23 is a sectional perspective diagram of a photo-absorption region of-the semiconductor photo-detector according to the thirteenth embodiment of the present invention.

FIG. 22 is a diagram for describing a thirteenth embodiment of the present invention. FIG. 23 is a sectional perspective diagram of the photo-absorption region. Numeral 191 indicates a light incident facet, 192 is a 0.2 μm thick p+-InGaAsP (1.2 μm composition) layer, 193 is a 1 μm thick p-InP layer, 194 is a 0.5 μm thick InGaAs photo-absorption layer, 195 is a 1 μm thick n-InP layer, 196 is a semi-insulating InP substrate, 197 is a p electrode, 198 is an n electrode, 199 is a V-shaped groove, and 200 is a photoresist. A lead electrode and a pad electrode are omitted in this figure for simplicity since these parts are complicated in structure and intricate to be described. The device has a photo-absorption layer area of 30 μm×50 μm.

The light incident facet 191 and the V-shaped groove 199 were simultaneously formed by wet etching with bromine-methanol using a silicon nitride film mask having a T-shaped window. At this moment, the light incident facet 191 and the V-shaped groove 199 were formed utilizing the property that the (111)A plane is formed in reverse-mesa shape as shown in the figure and the (1−1−111) and (111) planes perpendicular thereto are formed in forward mesa shape in wet etching of a (001) surface wafer with bromine-methanol. In this case, the V shape is fabricated with good precision in the plane direction and, therefore, the depth can also be controlled with good controllability by the window width of the mask. Naturally, the reverse-mesa part and the V-shaped groove part may be formed using another wet etching liquid or a dry etching method, or utilizing other crystal plane, or utilizing adhesion of the etching mask to control the angle. Since the V-shaped groove 199 is automatically formed by the fact that the right and left forward mesa bottom sides go down with the passage of etching time until base lines of both sides are in line with each other, the depth can also be controlled with good controllability by the mask window width, however, before both base sides fall in line, the groove is in a so-called U shape. Therefore, by controlling the etching depth with time, a U-shaped groove can also be formed as necessary. Further, U-shaped grooves of different shapes can be formed by changing to another etching liquid in the course of etching.

An anti-reflection coating film is formed on the light incident facet. Right above the main reaching area of refracted incident light is terminated with air, and the p electrode 197 is formed in outer peripheral part of the area. Incident light of wavelength 1.3 μm from the lateral side is refracted at the light incident facet and transits at an angle of ø=24.7 degrees as shown in the figure relative to the upper surface. In this case, if the refractive index of the semiconductor is assumed as 3.209, total reflection occurs when ø is smaller than 71.8 degrees, and the present embodiment satisfies this condition. In the present embodiment, the p electrode is formed in a ring shape, however, it is needless to say that although the overall reflectivity is slightly decreased, it may be formed in any structure such as a reticulated electrode shape, or the upper InP/InGaAsP layer remained as a high-concentration p doped layer to decrease the sheet resistance sufficiently, or the p electrode be formed in only one side part. In the present embodiment, right above the reaching area of incident light is terminated with air, however, it may be any of inorganic substances such as $SiO_2$ or SiNx or organic substances such as polyimide or epoxy, which has an appropriately smaller refractive index than the semiconductor and satisfies the total reflection condition ($ø<\cos^{-1}(n_2/n_1)$; where $n_1$ is a refractive index of the semiconductor, and $n_2$ is a refractive index of the terminating substance). For example, when a polyimide of having a refractive index of 1.55 is used, ø may be smaller than 61.1 degrees.

When a photoresist was coated on the entire surface, and the entire surface exposed by an exposure apparatus, since a reverse-mesa visor part is not exposed, the resist as an organic substance is remained in a forward mesa shape from the visor part by resist development. During the exposure, the forward mesa shape of the resist can be controlled by controlling the exposure time or exposing the substrate diagonally. In the present embodiment, the buried part of the resist is formed by exposing the entire surface, however, alternatively, exposure may be performed using a mask to form the buried part of the resist apart by a finite length from the tip part of the light incident facet. Even when the single mode fiber (not shown) is guided by the V-shaped groove part to contact against the photo-detector, since the tip part edge of the fiber is stopped by the resist part, the fiber tip will not hit against the light incident facet of the device. After fixing the fiber with epoxy or the like, only the resist part was selectively removed using an organic solvent to fabricate a photo-absorption module as a photo-detection device. Here, since the light incident position in horizontal and vertical directions can be almost determined by precision of the mask for forming the V-shaped groove guide, and positioning in the optical axis direction is also possible by butting, high precision positioning was possible without positioning by delicate mechanical movement of the fiber. When light of wavelength 1.3 μm was introduced, a large responsivity value of more than 0.9 A/W was obtained at an applied reverse bias of 1.5 V.

Further, since, when a tapered fiber is used in place of the single mode fiber to decrease the beam size, high precision positioning is similarly possible, the photo-absorption part of the device can be small-sized to the same level as the focus beam size. Therefore, a device capable of making ultrafast response by size reduction can be realized with a high-coupling state with the fiber, and easy modular construction be achieved.

For example, with a device of a photo-absorption area of 10 μm×20 μm, fabrication of a module capable of making high speed operation of a 3 dB bandwidth of 40 GHz was possible while maintaining high responsivity. In the present embodiment, the p-InP layer at the surface side is formed by crystal growth, however, alternatively, an undoped layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using semi-insulating InP as the substrate and an n-InP layer at the substrate side, however, a p-InP layer can be used by reversing the above p and n, and an n-InP or p-InP substrate can also be used for the fabrication.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 14

Figure 24:
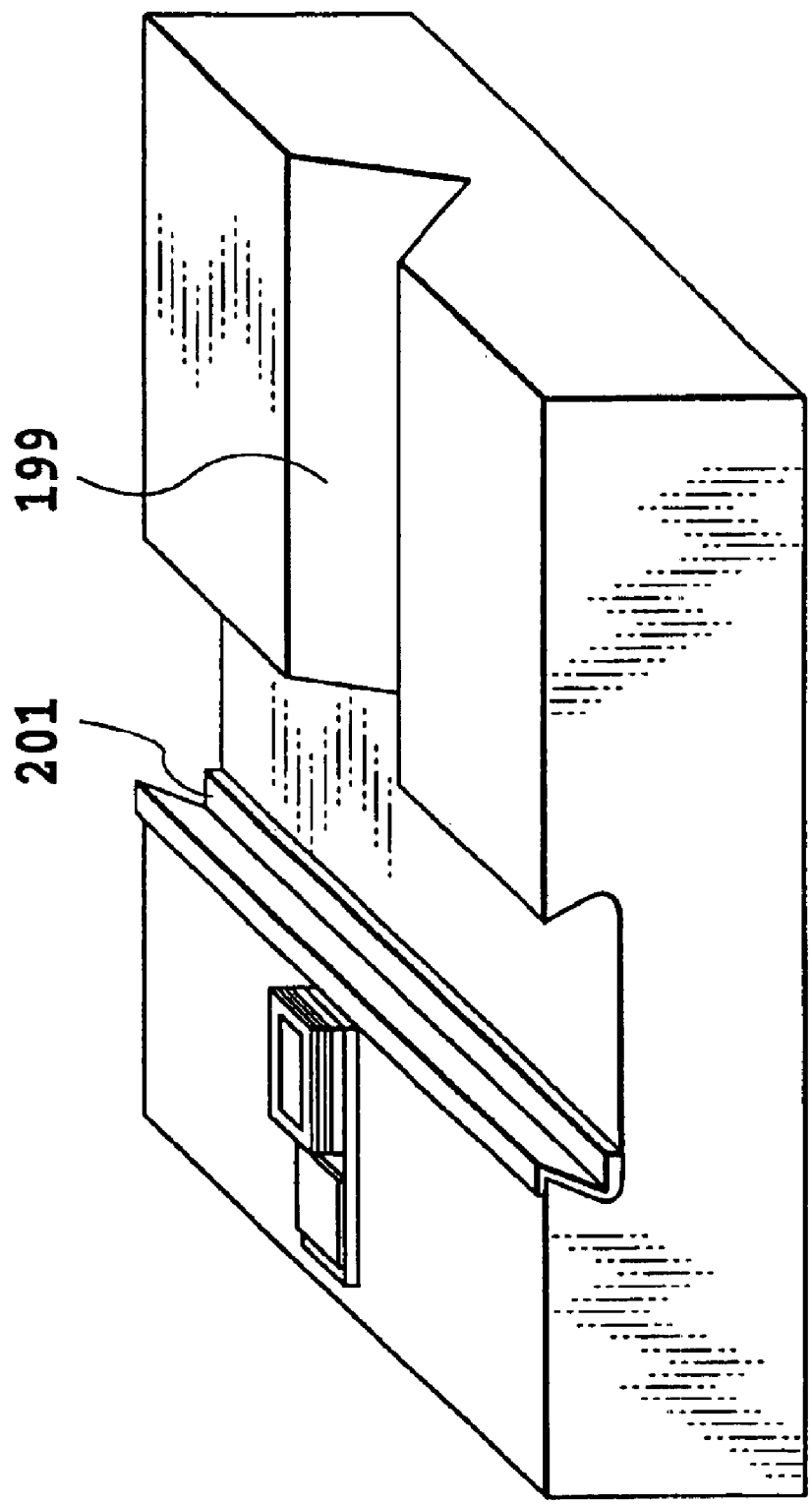
FIG. 24 is a perspective diagram showing a semiconductor photo-detector according to a fourteenth embodiment of the present invention.

FIG. 24 is a diagram for describing a fourteenth embodiment of the present invention. A sectional perspective diagram of photo-absorption region is the same as in FIG. 23. Numeral 191 indicates a light incident facet, 192 is a 0.2 μm thick p$^+$-InGaAsP (1.2 μm composition) layer, 193 is a 1 μm thick p-InP layer, 194 is a 0.5 μm thick InGaAs photo-absorption layer, 195 is a 1 μm thick n-InP layer, 196 is a semi-insulating InP substrate, 197 is a p electrode, 198 is an n electrode, 199 is a V-shaped groove, and 201 is polyimide. A lead electrode and a pad electrode are omitted in this figure for simplicity since these parts are complicated in structure and intricate to be described. The device has a photo-absorption layer area of 30 μm×70 μm.

The light incident facet and the V-shaped groove were simultaneously formed by wet etching with bromine-methanol using a silicon nitride film mask having a T-shaped window. At this moment, the light incident facet 191 and the V-shaped groove 199 were formed utilizing the property that the (111)A plane is formed in reverse-mesa shape as shown in the figure and the (1−1−111) and (111) planes perpendicular thereto are formed in forward mesa shape in wet etching of a (001) surface wafer with bromine-methanol. In this case, the V shape is fabricated with good precision in the plane direction and, therefore, the depth can also be controlled with good controllability by the window width of the mask. Naturally, the reverse-mesa part and the V-shaped groove part may be formed using another wet etching liquid or a dry etching method, or utilizing other crystal plane, or utilizing adhesion of the etching mask to control the angle. Since the V-shaped groove 199 is automatically formed by the fact that the right and left forward mesa bottom sides go down with the passage of etching time until base lines of both sides are in line with each other, the depth can also be controlled with good controllability by the mask window width, however, before both base sides fall in line, the groove is in a so-called U shape. Therefore, by controlling the etching depth with time, a U-shaped groove can also be formed as necessary. Further, U-shaped grooves of different shapes can be formed by changing to another etching liquid in the course of etching.

In finished state of the photo-detector, the space in between the photo-detector and the optical fiber is buried in with polyimide having a refractive index of 1.7.

An anti-reflection coating film is formed on the light incident facet. Right above the main reaching area of refracted incident light is terminated with air, and the p electrode is formed in outer peripheral part of the area. Incident light of wavelength 1.3 μm from the lateral side is refracted at the light incident facet and transits at an angle of ø=17.3 degrees relative to the upper surface as shown in the figure in the case that the space in between the photo-detector and the optical fiber is buried in with polyimide. In this case, if the refractive index of the semiconductor is assumed as 3.209, total reflection occurs when ø is smaller than 71.8 degrees, and the present embodiment satisfies this condition. In the present embodiment, the p electrode is formed in a ring shape, however, it is needless to say that although the overall reflectivity is slightly decreased, it may be formed in any structure such as a reticulated electrode shape, or the upper InP/InGaAsP layer be remained as a high-concentration p doped layer to sufficiently decrease the sheet resistance, or the p electrode be formed in only one side part. In the present embodiment, right above the reaching area of incident light is terminated with air, however, it may be any of inorganic substances such as $SiO_2$ or SiNx or organic substances such as polyimide or epoxy, which has an appropriately smaller refractive index than the semiconductor and satisfies the total reflection condition (ø<cos$^{-1}$(n$_2$/n$_1$); where n$_1$ is a refractive index of the semiconductor, and n$_2$ is a refractive index of the terminating substance). For example, when a polyimide of having a refractive index of 1.55 is used, ø may be smaller than 61.1 degrees.

After forming an anti-reflection coating film on the light incident facet, polyimide was coated on the entire surface by spin coating, and a resist coated thereon, exposure performed using a mask for covering the light incident facet apart by a finite length from the tip part of the light incident facet, and development performed. In this case, by using a substance which is etched with a resist developer as the polyimide, the polyimide as an organic substance is remained in a mesa shape to the position apart by a finite length from the visor part as shown in the figure. This figure is a schematic diagram showing the state after the resist is removed using acetone.

Even when the single mode fiber is put on the V-shaped groove 199 to be guided to contact against, since the tip part of the fiber is stopped by the polyimide 201, the fiber tip will not hit against the light incident facet 191 of the semiconductor device. After butting of the fiber, it was fixed including between the device and the fiber with polyimide (not shown) to fabricate a photo-absorption module as a photo-detection device. Here, the light incident position in horizontal and vertical directions can be almost determined by precision of the mask for forming the V-shaped groove guide, and positioning in the optical axis direction is also possible by butting, high precision positioning was possible without positioning by delicate mechanical movement of the fiber. When light of wavelength 1.3 μm was introduced, a large responsivity value of more than 0.9 A/W was obtained at an applied reverse bias of 1.5 V. Further, since, when a tapered fiber is used in place of the single mode fiber to decrease the beam size, high precision positioning is similarly possible, the photo-absorption part of the device can be small-sized to the same level as the focus beam size. Therefore, a device capable of making ultrafast response by size reduction can be realized with a high-coupling state with the fiber, and easy modular construction be achieved. With a device of a photo-absorption area of 10 μm×20 μm, fabrication of a module capable of making high speed operation of a 3 dB bandwidth of 40 GHz was possible while maintaining high responsivity.

In the present embodiment, polyimide is patterned using a resist as a mask and developing with a resist developer, however, patterning of the polyimide may be performed by forming a mask such as $SiO_2$ or a metal and other techniques such as reactive ion etching (RIE) by oxygen or the like or reactive ion beam etching (RIBE). Further, a photo-detection device may be fabricated by coating another organic substance other than polyimide such as epoxy or the like followed by similar patterning, and fixing including between the device and fiber with the same substance. Still further, it is needless to say that the substance between the device and fiber may be any one which has a good transmissivity to incident light and a relative index of more than 1, selected from organic substances such as various polyimides including fluorinated polyimides, various epoxies including epoxy resins, fluorinated epoxies, fluorinated epoxy acrylate resins, acrylics, metamorphic silicone resins, and inorganic substances such as chalcogenide glass having a refractive index of more than 2, or a liquid substance such as oil. By appropriately selecting such various substances, it is possible to change the refraction angle at the light incident facet of the photo-detector, even when using a refraction type semiconductor photo-detector cut from the same wafer having the same layer structure and the same mesa angle construction, and adjustment of responsivity according to the application is possible.

In the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using semi-insulating InP as the substrate and an n-InP layer at the substrate side, however, a p-InP layer can be used by reversing the above p and n, and an n-InP or p-InP substrate can also be used for the fabrication.

Yet further, it is needless to say that a material system other than InGaAsP/InP such as InGaAlAs/InGaAsP or AlGaAs/GaAs system or a material system including a strain may be used.

Embodiment 15

Figure 25:
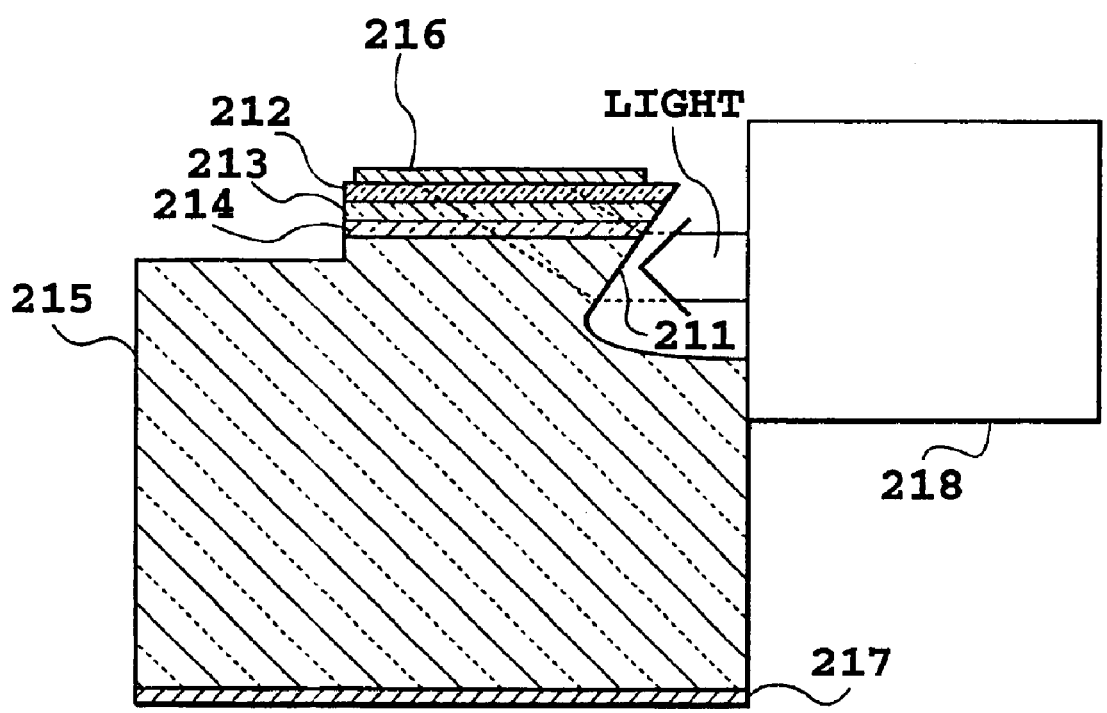
FIG. 25 is a perspective diagram showing a semiconductor photo-detector according to a fifteenth embodiment of the present invention.

A fifteenth embodiment of the present invention is shown in FIG. 25.

In the figure, numeral 211 indicates a light incident facet, 212 is a 1 μm thick p-InP layer, 213 is a 1 μm thick InGaAs photo-absorption layer, 214 is a 1 μm thick n-InP layer, 215 is an n-InP substrate, 216 is a p electrode, 217 is an n electrode, and 218 is a single mode optical fiber.

The device has a photo-absorption layer area of 30 μm×50 μm.

The light incident facet 211 was formed utilizing the property that the (111)A plane is formed in reverse-mesa shape as shown in the figure in wet etching of a (001) surface wafer with bromine-methanol.

Naturally, the reverse-mesa part may be formed using another wet etching liquid or a dry etching method, or utilizing other crystal plane, or utilizing adhesion of the etching mask to control the angle.

After forming the reverse-mesa part, the substrate is cleaved at a position 10 μm apart from the tip of the angled light incident facet 211.

When, after forming an anti-reflection coating film on the light incident facet, light of wavelength 1.3 μm was introduced, a large responsivity value of more than 0.8 A/W was obtained at an applied reverse bias of 1.5 V.

In this case, when the single mode fiber 218 was roughly brought close to the device, positioned in both horizontal and vertical directions, and finally the fiber end surface contacted against the device as shown in the figure, the fiber could be easily positioned.

Even when contacting against as shown in the figure, end surface of the fiber 218 will not contact the important light incident facet 211 to damage the facet 211, part of the fiber contacting the device is an outer peripheral part of clad which is not related to the part for guiding light, and there is no adverse effect on optical coupling.

Further, since, when a microlens holder with fiber provided with a focusing lens is used in place of the single mode fiber, the holder and the device can be positioned with good precision in the optical axis direction, high precision positioning is possible relatively easily even when the beam size is decreased using a lens, the photo-absorption part of the device can be small-sized to the same level as the focus beam size.

Therefore, a device capable of making ultrafast response by size reduction can be realized.

With a device of a photo-absorption area of 10 μm×20 μm, high speed operation of a 3 dB bandwidth of 40 GHz was possible while maintaining high responsivity.

As described above, since the photo-absorption part and the fiber can be easily coupled, and the distance from the fiber and the lens holder and the like to the light incident facet be determined almost precisely with precision of cleavage, a module with reduced deviation in characteristic could be easily fabricated.

In the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using n-InP as the substrate, however, a p-InP layer can be used by reversing the above p and n, or a semi-insulating InP substrate can also be used in fabrication by considering the leading method of the electrode.

Yet further, a uniform composition bulk is used here as the photo-absorption layer, however, it is needless to say that a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 16

Figure 26:
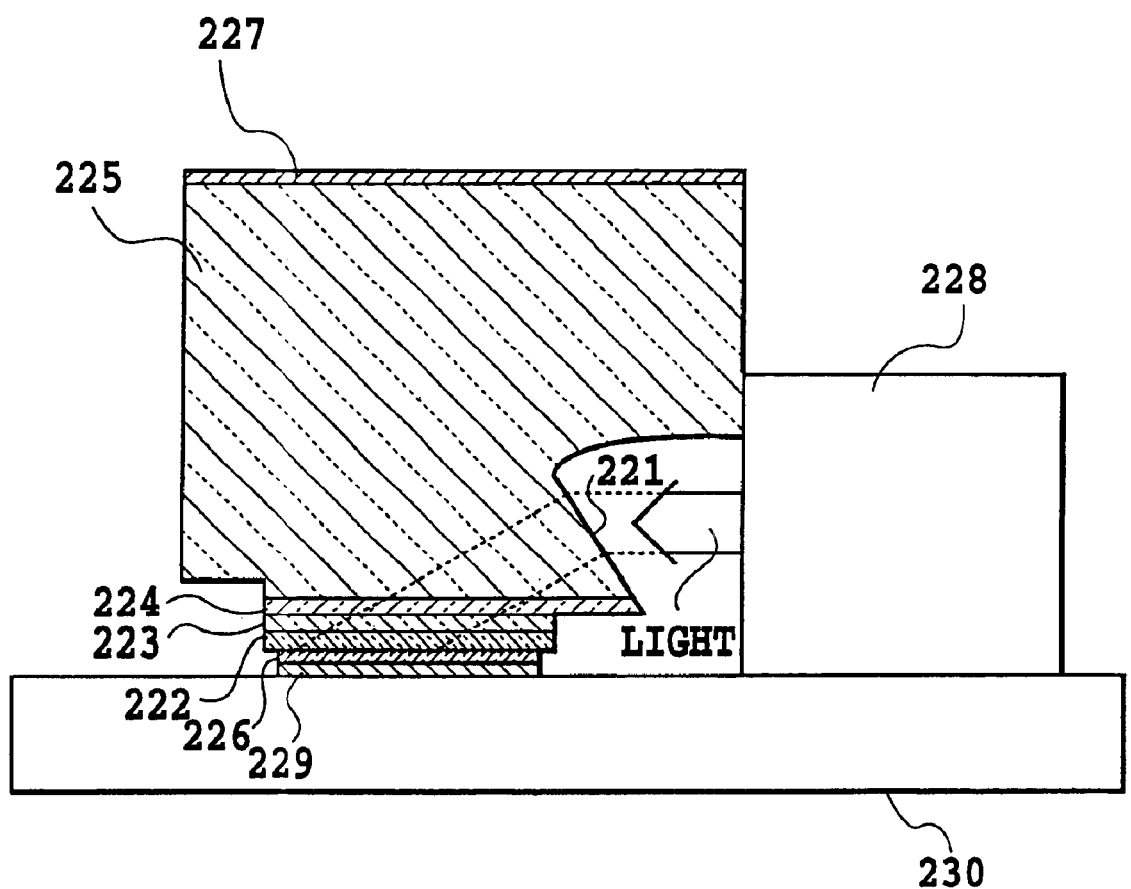
FIG. 26 is a perspective diagram showing a semiconductor photo-detector according to a sixteenth embodiment of the present invention.

A sixteenth embodiment of the present invention is shown in FIG. 26.

In the figure, numeral 221 indicates a light incident facet, 222 is a 1 μm thick p-InP layer, 223 is a 1 μm thick InGaAs photo-absorption layer, 224 is a 1 μm thick n-InP layer, 225 is an n-InP substrate, 226 is a p electrode, 227 is an n electrode, 228 is a single mode optical fiber, 229 is a solder bump metal, and 230 is a pedestal.

The device has a photo-absorption layer area of 30 μm×50 μm.

The light incident facet 221 was formed utilizing the property that the (111)A plane is formed in reverse-mesa shape as shown in the figure in wet etching of a (001) surface wafer with bromine-methanol.

Naturally, the reverse-mesa part may be formed using another wet etching liquid or a dry etching method, or utilizing other crystal plane, or utilizing adhesion of the etching mask to control the angle.

After forming the reverse-mesa part, the substrate is cleaved at a position 10 μm apart from the tip of the angled light incident facet 221.

After forming an anti-reflection coating film on the light incident facet, in the present embodiment, the device is mounted on the pedestal as shown in the figure using a solder bump metal.

When light of wavelength 1.3 μm was introduced by the single mode fiber 228, a large responsivity value of more than 0.8 A/W was obtained at an applied reverse bias of 1.5 V.

In this case, since optical axis positioning in the vertical direction can be adjusted in high precision by the thicknesses of the p electrode 226 and the bump metal 229, the fiber can be positioned very easily by roughly bringing the single mode fiber close the device along the pedestal, performing positioning only in the horizontal direction, and finally contacting the fiber end surface against the device as shown in the figure.

Even when contacting against as shown in the figure, end surface of the fiber 228 will not contact the important light incident facet 221 to damage the facet 221, part of the fiber contacting the device is an outer peripheral part of clad which is not related to the part for guiding light, and there is no adverse effect on optical coupling.

Further, since, when a microlens holder with fiber provided with a focusing lens is used in place of the single mode fiber, the holder and the device can be positioned with good precision in the optical axis direction, high precision positioning is possible relatively easily even when the beam size is decreased using a lens, the photo-absorption part of the device can be small-sized to the same level as the focus beam size.

Still further, in this case, it is needless to say that height adjustment in the vertical direction can be flexibly achieved by inserting an appropriate spacer between the electrode and the pedestal.

Therefore, a device capable of making ultrafast response by size reduction can be realized.

With a device of a photo-absorption area of 10 μm×20 μm, high speed operation of a 3 dB bandwidth of 40 GHz was possible while maintaining high responsivity.

As described above, since the photo-absorption part and the fiber can be easily coupled, and the distance from the fiber and the lens holder and the like to the light incident facet be determined almost precisely with precision of cleavage, a module with reduced deviation in characteristic could be easily fabricated.

In the present embodiment, the p electrode has a structure of directly contacting the pedestal, however, it is needless to say that a lead electrode from the p electrode may be provided to another part so that this part is contacted with the pedestal for performing electrical connection and height adjustment.

In the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using n-InP as the substrate, however, a p-InP layer can be used by reversing the above p and n, or a semi-insulating InP substrate can also be used in fabrication by considering the leading method of the electrode.

Yet further, a uniform composition bulk is used here as the photo-absorption layer, however, it is needless to say that a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Embodiment 17

Figure 27:
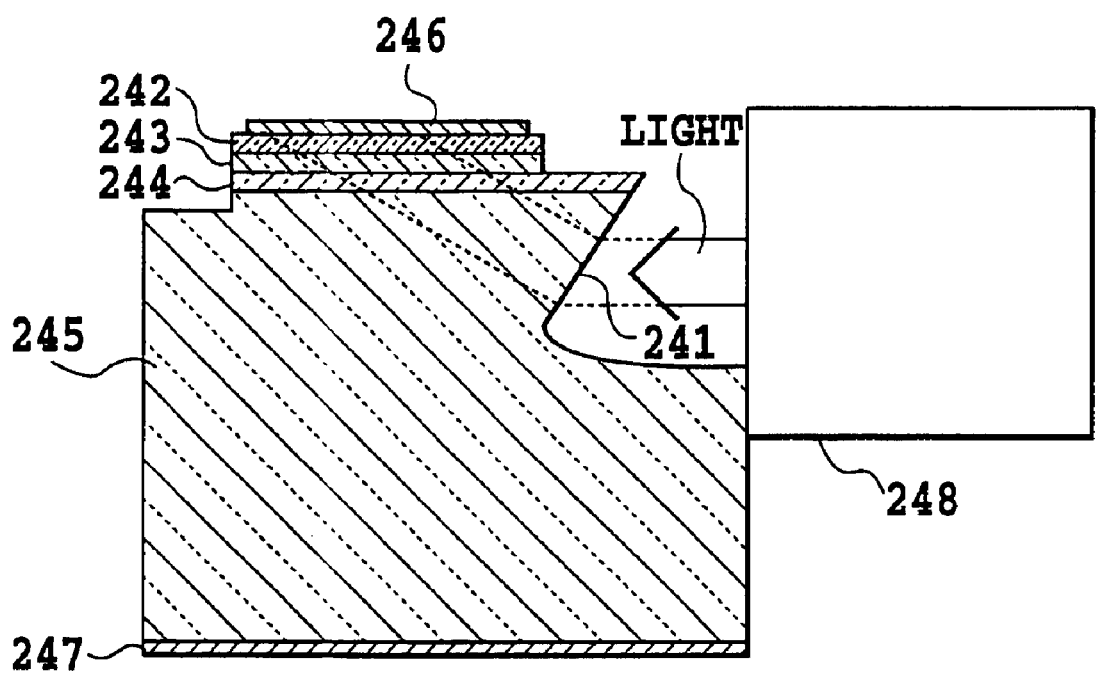
FIG. 27 is a perspective diagram showing a semiconductor photo-detector according to a seventeenth embodiment of the present invention.

FIG. 27 is a diagram for describing a seventeenth embodiment of the present invention. Numeral 241 indicates a light incident facet, 242 is a 1 μm thick p-InP layer, 243 is a 1 μm thick InGaAs photo-absorption layer, 244 is a 1 μm thick n-InP layer, 245 is an n-InP substrate, 246 is a p electrode, 247 is an n electrode, and 248 is a single mode optical fiber. The device has a photo-absorption layer area of 30 μm×50 μm. The light incident facet was formed utilizing the property that the (111)A plane is formed in reverse-mesa shape as shown in the figure in wet etching of a (001) surface wafer with bromine-methanol.

Since, in this case, reverse-mesa etching is performed on the n-InP layer 244 and the InP substrate 245 which are composed only of InP, a uniform angled light incident facet of good flatness can be formed with a good yield. Further, an etching mask is formed at a position 8 μm apart from the photo-absorption part including the photo-absorption layer, and deep reverse-mesa etching of about 30 μm is performed, in this case, side etching of about 3 μm occurs, however, the photo-absorption part does not contact the side etching part, therefore, abnormal side etching, etching irregularity or the like caused by relatively fast etching speed of the photo-absorption layer will not generate. In addition, uniform devices with equal mesa angle can be fabricated.

Naturally, the reverse-mesa part may be formed using another wet etching liquid or a dry etching method, or utilizing other crystal plane, or utilizing adhesion of the etching mask to control the angle. After forming the reverse-mesa part, the substrate is cleaved at a position 10 μm apart from the tip of the angled light incident facet. When, after forming an anti-reflection coating film on the light incident facet, light of wavelength 1.3 μm was introduced by the single mode fiber, a large responsivity value of more than 0.8 A/W was obtained at an applied reverse bias of 1.5 V. In this case, when the single mode fiber was roughly brought close to the device, positioned in both horizontal and vertical directions, and finally the fiber end surface contacted against the device as shown in the figure, the fiber could be easily positioned. Even when contacting against as shown in the figure, end surface of the fiber will not contact the important light incident facet to damage the facet, part of the fiber contacting the device is an outer peripheral part of clad which is not related to the part for guiding light, and there is no adverse effect on optical coupling.

Further, since, when a microlens holder with fiber provided with a focusing lens is used in place of the single mode fiber, the holder and the device can be positioned with good precision in the optical axis direction, high precision positioning is possible relatively easily even when the beam size is decreased using a lens, the photo-absorption part of the device can be small-sized to the same level as the focus beam size. Therefore, a device capable of making ultrafast response by size reduction can be realized. With a device of a photo-absorption area of 10 μm×20 μm, high speed operation of a 3 dB bandwidth of 40 GHz was possible while maintaining high responsivity. As described above, since the photo-absorption part and the fiber can be easily coupled, and the distance from the fiber and the lens holder and the like to the light incident facet be determined almost precisely with precision of cleavage, a module with reduced deviation in characteristic could be easily fabricated.

In the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon. Yet further, the present embodiment is an example using n-InP as the substrate, however, a p-InP layer can be used by reversing the above p and n, or a semi-insulating InP substrate can also be used in fabrication by considering the leading method of the electrode.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used. Yet further, it is needless to say that a material system other than InGaAsP/InP such as InGaAlAs/InGaAsP or AlGaAs/GaAs system or a material system including a strain may be used.

Embodiment 18

Figure 28:
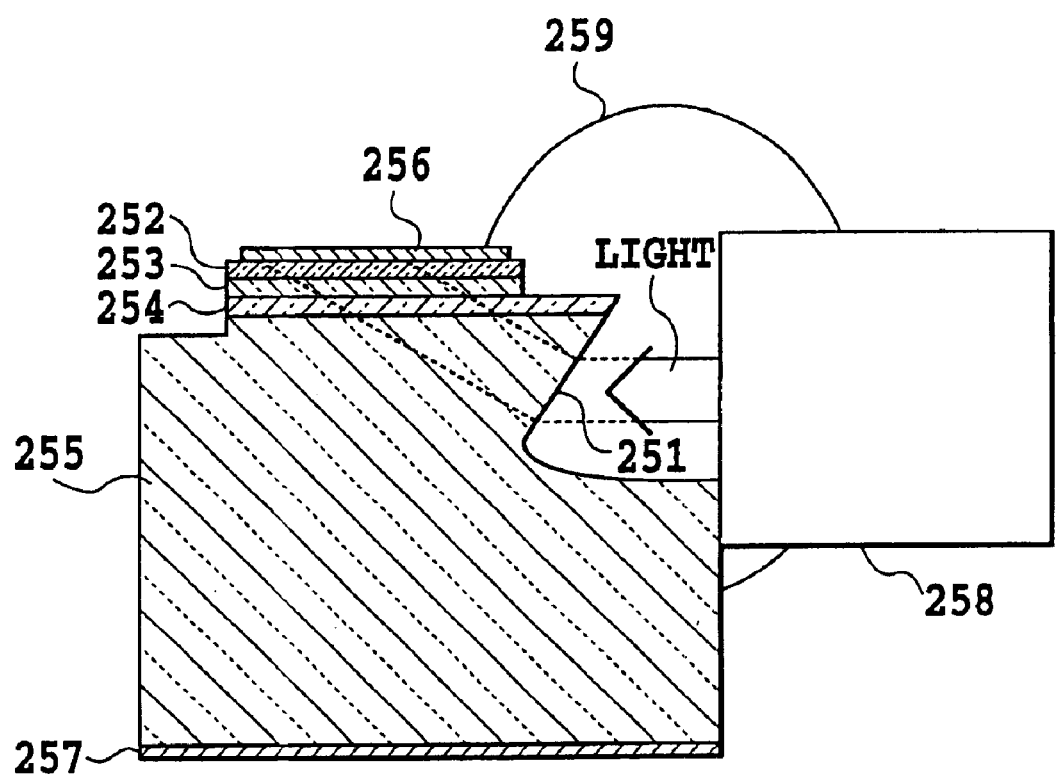
FIG. 28 is a perspective diagram showing a semiconductor photo-detector according to an eighteenth embodiment of the present invention.

FIG. 28 is a diagram for describing a eighteenth embodiment of the present invention. Numeral 251 indicates a light incident facet, 252 is a 1 μm thick p-InP layer, 253 is a 0.7 μm thick InGaAs photo-absorption layer, 254 is a 1 μm thick n-InP layer, 255 is an n-InP substrate, 256 is a p electrode, 257 is an n electrode, 258 is a single mode optical fiber, and 259 is polyimide. The device has a photo-absorption layer area of 30 μm×70 μm. The light incident facet 251 was formed utilizing the property that the (111)A plane is formed in reverse-mesa shape as shown in the figure in wet etching of a (001) surface wafer with bromine-methanol.

Since, in this case, reverse-mesa etching is performed on the n-InP layer 254 and the InP substrate 255 which are composed only of InP, a uniform angled light incident facet of good flatness can be formed with a good yield. Further, an etching mask is formed at a position 8 μm apart from the photo-absorption part including the photo-absorption layer, and deep reverse-mesa etching of about 30 μm is performed, in this case, side etching of about 3 μm occurs, however, the photo-absorption part does not contact the side etching part, therefore, abnormal side etching, etching irregularity or the like caused by relatively fast etching speed of the photo-absorption layer will not generate. In addition, uniform devices with equal mesa angle can be fabricated.

Naturally, the reverse-mesa part may be formed using another wet etching liquid or a dry etching method, or utilizing other crystal plane, or utilizing adhesion of the etching mask to control the angle. After forming the reverse-mesa part, the substrate is cleaved at a position 10 μm apart from the tip of the angled light incident facet. When the single mode fiber was roughly brought close to the device, positioned in both horizontal and vertical directions, and finally the fiber end surface contacted against the device as shown in the figure, the fiber could be easily positioned. Even when contacting against as shown in the figure, end surface of the fiber will not contact the important light incident facet to damage the facet, part of the fiber contacting the device is an outer peripheral part of clad which is not related to the part for guiding light, and there is no adverse effect on optical coupling. Further, since, when a microlens holder with fiber provided with a focusing lens is used in place of the single mode fiber, the holder and the device can be positioned with good precision in the optical axis direction, high precision positioning is possible relatively easily even when the beam size is decreased using a lens, the photo-absorption part of the device can be small-sized to the same level as the focus beam size. Therefore, a device capable of making ultrafast response by size reduction can be realized. As described above, since the photo-absorption part and the fiber can be easily coupled, and the distance from the fiber and the lens holder and the like to the light incident facet be determined almost precisely with precision of cleavage, a module with reduced deviation in characteristic could be easily fabricated.

Further, in the present embodiment, after the single mode fiber is disposed opposite to the light incident facet as shown in the figure, the space in between is buried in with polyimide having a refractive index of 1.7. Still further, an anti-reflection coating film is formed on the photo-detector and the fiber end surface. When light of wavelength 1.55 μm was introduced by the single mode fiber, a large responsivity value of 1.0 A/W was obtained at an applied reverse bias of 1.5 V. The layer structure of the photo-detector of the present embodiment is designed for enabling high speed operation. That is, the photo-absorption layer is as thin as 0.7 μm, so that the carrier transit time is reduced. Yet further, the refraction angle is the largest when the medium between the device and the fiber is air, therefore, a device length required for receiving refracted light can be reduced, and the device capacity determined by the device size can be reduced. In the prior art using air between the device and fiber, with a module having a reduced device size to 10 μm×20 μm, high speed operation of more than a 3 dB bandwidth of 40 GHz could be confirmed. However, in this module, the responsivity was 0.8 A/W. This is because absorption in the photo-absorption layer is insufficient. Since high speed and responsivity are basically in a trade-off relation, a decrease in responsivity associated with high speed is inevitable to some extent, however, according to the present invention, it is possible to change the responsivity over a wide range even when the absorption layer is decreased in thickness for high speed operation. However, the operation speed is decreased to some extent by increasing the device capacity associated with an increase in photo-detector length.

Figure 29:
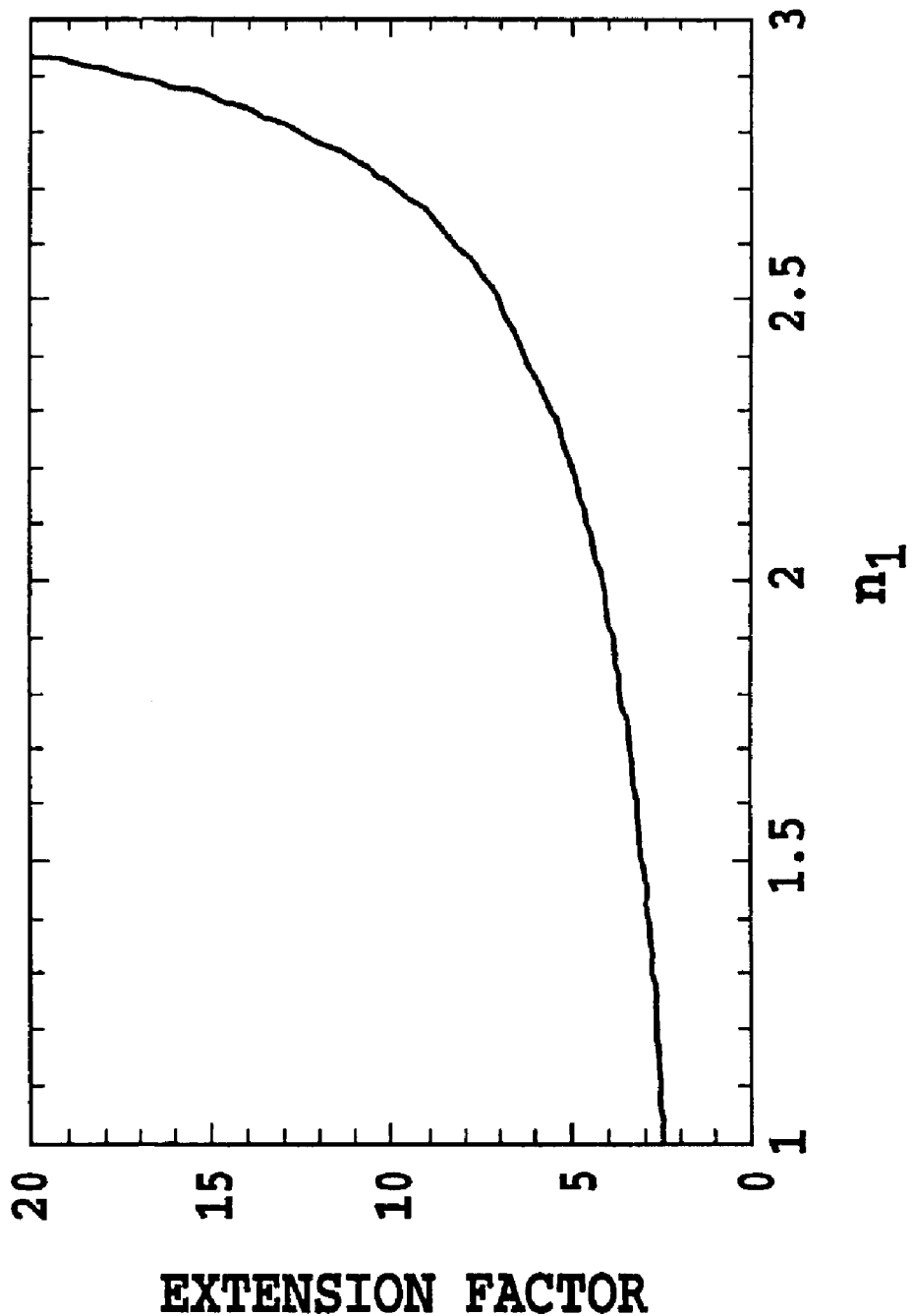
FIG. 29 is a graph showing a calculation result of extension factor to absorption layer thickness of effective absorption length relative to refractive index ($n_1$) of substance between the device and fiber when light of wavelength 1.55 μm is incident at a mesa angle of 55 degrees in a InP substrate of the semiconductor photo-detector in the eighteenth embodiment of the present invention.

FIG. 29 shows a calculation result in InP of extension factor to absorption layer thickness of effective absorption length relative to refractive index ($n_1$) of the substance between the device and fiber when light of wavelength 1.55 μm is incident at a mesa angle of 55 degrees. The extension factor can be substantially increased by using a material having a large $n_1$. In the present embodiment, polyimide having a refractive index of 1.7 is used, the extension factor in this case provides a 41% increase relative to air, as a result, the above increase in responsivity is obtained. It is needless to say that the substance between the device and fiber may be any one which has a good transmissivity to incident light and a relative index of more than 1, selected from organic substances such as various polyimides including fluorinated polyimides, various epoxies including epoxy resins, fluorinated epoxies, fluorinated epoxy acrylate resins, acrylics, metamorphic silicone resins, and inorganic substances such as chalcogenide glass having a refractive index of more than 2, or a liquid substance such as oil. By appropriately selecting such various substances, it is possible to change the refraction angle at the light incident facet of the photo-detector, even when using a refraction type semiconductor photo-detector cut from the same wafer having the same layer structure and the same mesa angle construction, and adjustment of responsivity according to the application is possible. As to the photo-detector, in the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon. Yet further, the present embodiment is an example using n-InP as the substrate, however, a p-InP layer can be used by reversing the above p and n, or a semi-insulating InP substrate can also be used in fabrication by considering the leading method of the electrode.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Yet further, as to the optical waveguide, a single mode optical fiber is used in the present embodiment, however, alternatively, a lensed fiber, a tapered fiber, a silica-based waveguide circuit such as Planar Lightwave Circuit (PLC) or the like may be used.

Yet further, it is needless to say that a hybrid integrated construction of mounting a photo-detector on PLC may be used. Yet further, it is needless to say that the waveguide is not only those based on various inorganic materials such as silica-based circuit but may be those based on various organic materials such as polymer waveguide or plastic fiber.

Embodiment 19

Figure 30:
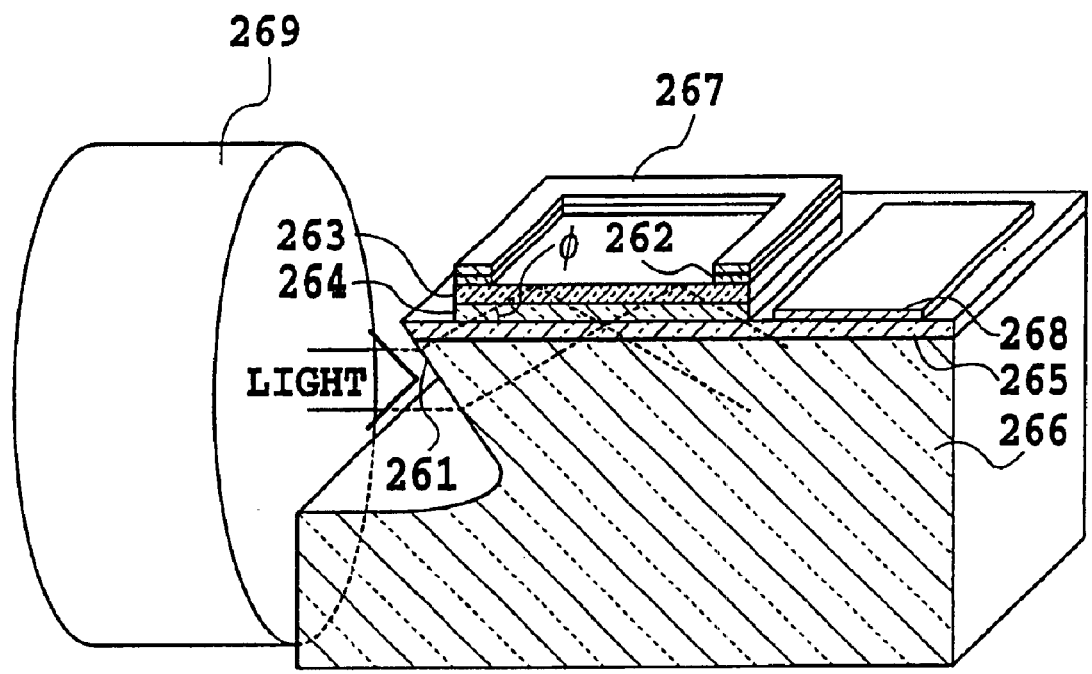
FIG. 30 is a perspective diagram showing a semiconductor photo-detector according to a nineteenth embodiment of the present invention.

FIG. 30 is a sectional perspective diagram for describing a nineteenth embodiment of the present invention. Numeral 261 indicates a light incident facet, 262 is a 0.2 μm thick p+-InGaAsP layer (1.2 μm composition), 263 is a 1 μm thick p-InP layer, 264 is a 0.5 μm thick InGaAs photo-absorption layer, 265 is a 1 μm thick n-InP layer, 266 is a semi-insulating InP substrate, 267 is a p electrode, 268 is an n electrode, and 269 is a single mode optical fiber. A lead electrode and a pad electrode are omitted in this figure for simplicity since these parts are complicated in structure and intricate to be described. The device has a photo-absorption layer area of 30 μm×50 μm. The light incident facet 261 was formed utilizing the property that the (111)A plane is formed in reverse-mesa shape of about 55 degrees as shown in the figure in wet etching of a (001) surface wafer with bromine-methanol.

Since, in this case, reverse-mesa etching is performed on the InP layer 265 and the InP substrate 266 which are composed only of InP, a uniform angled light incident facet of good flatness can be formed with a good yield. Further, an etching mask is formed at a position 8 μm apart from the photo-absorption part including the photo-absorption layer, and deep reverse-mesa etching of about 30 μm is performed, in this case, side etching of about 3 μm occurs, however, the photo-absorption part does not contact the side etching part, therefore, abnormal side etching, etching irregularity or the like caused by relatively fast etching speed of the photo-absorption layer will not generate. In addition, uniform devices with equal mesa angle can be fabricated.

Naturally, the reverse-mesa part may be formed using another wet etching liquid or a dry etching method, or utilizing other crystal plane, or utilizing adhesion of the etching mask to control the angle.

An anti-reflection coating film is formed on the light incident facet. Right above the main reaching area of refracted incident light is terminated with air, and the p electrode is formed in outer peripheral part of the area. Incident light of wavelength 1.55 μm from the lateral side is refracted at the light incident facet and transits at an angle of ø=17.1 degrees relative to the upper surface as shown in the figure. In this case, if the refractive index of the semiconductor is assumed as 3.17, total reflection occurs when ø is smaller than 71.6 degrees, and the present embodiment satisfies this condition.

In the present embodiment, the p electrode is formed in a ring shape, however, it is needless to say that although the overall reflectivity is slightly decreased, it may be formed in any structure such as a reticulated electrode shape, or the upper InP/InGaAsP layer be remained as a high-concentration p doped layer to sufficiently decrease the sheet resistance, or the p electrode be formed in only one side part. In the present embodiment, right above the reaching area of incident light is terminated with air, however, it may be any of inorganic substances such as $SiO_2$ or SiNx or organic substances such as polyimide or epoxy, which has an appropriately smaller refractive index than the semiconductor and satisfies the total reflection condition (ø<$\cos^{-1}(n_2/n_1)$; where $n_1$ is a refractive index of the semiconductor, and $n_2$ is a refractive index of the terminating substance). For example, when a polyimide of having a refractive index of 1.55 is used, ø may be smaller than 60.7 degrees.

After forming the reverse-mesa part, the substrate is cleaved at a position 10 μm apart from the tip of the angled light incident facet. When the single mode fiber 269 was roughly brought close to the device, positioned in both horizontal and vertical directions, and finally the fiber end surface contacted against the device as shown in the figure, the fiber could be easily positioned. Even when contacting against as shown in the figure, end surface of the fiber will not contact the important light incident facet to damage the facet, part of the fiber contacting the device is an outer peripheral part of clad which is not related to the part for guiding light, and there is no adverse effect on optical coupling. Further, since, when a microlens holder with fiber provided with a focusing lens is used in place of the single mode fiber, the holder and the device can be positioned with good precision in the optical axis direction, high precision positioning is possible relatively easily even when the beam size is decreased using a lens, the photo-absorption part of the device can be small-sized to the same level as the focus beam size. Therefore, a device capable of making ultrafast response by size reduction can be realized. As described above, since the photo-absorption part and the fiber can be easily coupled, and the distance from the fiber and the lens holder and the like to the light incident facet be determined almost precisely with precision of cleavage, a module with reduced deviation in characteristic could be easily fabricated.

When light of wavelength 1.55 μm was introduced using the single mode fiber 269, a large responsivity value of 0.9 A/W was obtained at an applied reverse bias of 1.5 V. The layer structure of the photo-detector of the present embodiment is designed for enabling high speed operation. That is, the photo-absorption layer is as thin as 0.5 μm, so that the carrier transit time is reduced. As to the photo-detector, in the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon. Yet further, the present embodiment is an example using n-InP as the substrate, however, a p-InP layer can be used by reversing the above p and n, or a semi-insulating InP substrate can also be used in fabrication by considering the leading method of the electrode.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Yet further, as to the optical waveguide, a single mode optical fiber is used in the present embodiment, however, alternatively, a lensed fiber, a tapered fiber, a silica-based waveguide circuit such as Planar Lightwave Circuit (PLC) or the like may be used.

Yet further, it is needless to say that a hybrid integrated construction of mounting a photo-detector on PLC may be used.

Yet further, it is needless to say that the waveguide is not only those based on various inorganic materials such as silica-based waveguide but may be those based on various organic materials such as polymer waveguide or plastic fiber.

Embodiment 20

Figure 31:
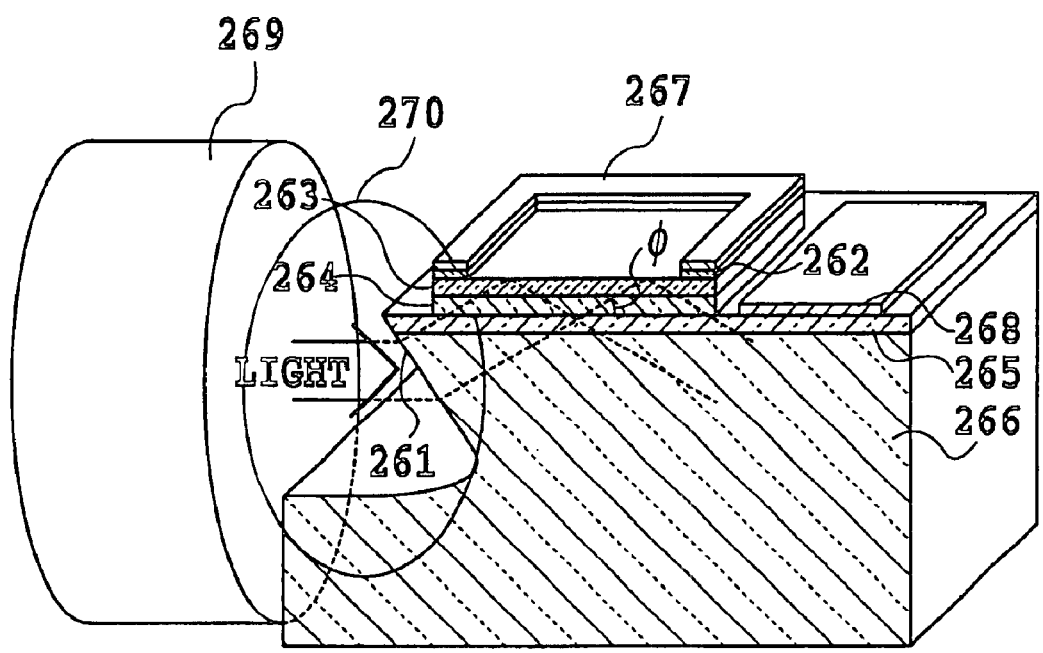
FIG. 31 is a perspective diagram showing a semiconductor photo-detector according to a twentieth embodiment of the present invention.

FIG. 31 is a sectional perspective diagram for describing a twentieth embodiment of the present invention. In the figure, same subject matters as in FIG. 30 are indicated with same reference numerals and description thereof is simplified. In the figure, numeral 270 indicates polyimide (refractive index 1.7). A lead electrode and a pad electrode are omitted in this figure for simplicity since these parts are complicated in structure and intricate to be described. The device has a photo-absorption layer area of 30 $\mu$m×70 $\mu$m. The light incident facet 261 was formed utilizing the property that the (111)A plane is formed in reverse-mesa shape of about 55 degrees as shown in the figure in wet etching of a (001) surface wafer with bromine-methanol.

Since, in this case, reverse-mesa etching is performed on the InP layer 265 and the InP substrate 266 which are composed only of InP, a uniform angled light incident facet 261 of good flatness can be formed with a good yield. Further, an etching mask is formed at a position 8 $\mu$m apart from the photo-absorption part including the photo-absorption layer, and deep reverse-mesa etching of about 30 $\mu$m is performed, in this case, side etching of about 3 $\mu$m occurs, however, the photo-absorption part does not contact the side etching part, therefore, abnormal side etching, etching irregularity or the like caused by relatively fast etching speed of the photo-absorption layer will not generate. In addition, uniform devices with equal mesa angle can be fabricated.

Naturally, the reverse-mesa part may be formed using another wet etching liquid or a dry etching method, or utilizing other crystal plane, or utilizing adhesion of the etching mask to control the angle.

An anti-reflection coating film is formed on the light incident facet. Right above the main reaching area of refracted incident light is terminated with air, and the p electrode 267 is formed in outer peripheral part of the area. Incident light of wavelength 1.55 $\mu$m from the lateral side is refracted at the light incident facet 261 and transits at an angle of ø=17.1 degrees relative to the upper surface as shown in the figure. In this case, if the refractive index of the semiconductor is assumed as 3.17, total reflection occurs when ø is smaller than 71.6 degrees, and the present embodiment satisfies this condition. In the present embodiment, the p electrode is formed in a ring shape, however, it is needless to say that although the overall reflectivity is slightly decreased, it may be formed in any structure such as a reticulated electrode shape, or the upper InP/InGaAsP layer be remained as a high-concentration p doped layer to sufficiently decrease the sheet resistance, or the p electrode be formed in only one side part. In the present embodiment, right above the reaching area of incident light is terminated with air, however, it may be any of inorganic substances such as $SiO_2$ or SiNx or organic substances such as polyimide or epoxy, which has an appropriately smaller refractive index than the semiconductor and satisfies the total reflection condition (ø<$\cos^{-1}(n_2/n_1)$; where $n_1$ is a refractive index of the semiconductor, and $n_2$ is a refractive index of the terminating substance). For example, when a polyimide of having a refractive index of 1.55 is used, ø may be smaller than 60.7 degrees.

After forming the reverse-mesa part, the substrate is cleaved at a position 10 $\mu$m apart from the tip of the angled light incident facet. When the single mode fiber 269 was roughly brought close to the device, positioned in both horizontal and vertical directions, and finally the fiber end surface contacted against the device as shown in the figure, the fiber could be easily positioned. Even when contacting against as shown in the figure, end surface of the fiber will not contact the important light incident facet to damage the facet, part of the fiber contacting the device is an outer peripheral part of clad which is not related to the part for guiding light, and there is no adverse effect on optical coupling. Further, since, when a microlens holder with fiber provided with a focusing lens is used in place of the single mode fiber, the holder and the device can be positioned with good precision in the optical axis direction, high precision positioning is possible relatively easily even when the beam size is decreased using a lens, the photo-absorption part of the device can be small-sized to the same level as the focus beam size. Therefore, a device capable of making ultrafast response by size reduction can be realized. As described above, since the photo-absorption part and the fiber can be easily coupled, and the distance from the fiber and the lens holder and the like to the light incident facet be determined almost precisely with precision of cleavage, a module with reduced deviation in characteristic could be easily fabricated.

Further, in the present embodiment, after the single mode fiber is disposed opposite to the light incident facet as shown in the figure, the space in between is buried in with polyimide having a refractive index of 1.7. Still further, an anti-reflection coating film is formed on the photo-detector and the fiber end surface. When light of wavelength 1.55 $\mu$m was introduced by the single mode fiber, a large responsivity value of 1.0 A/W was obtained at an applied reverse bias of 1.5 V. The layer structure of the photo-detector of the present embodiment is designed for enabling high speed operation. That is, the photo-absorption layer is as thin as 0.5 $\mu$m, so that the carrier transit time is reduced.

Yet further, the refraction angle is the largest when the medium between the device and the fiber is air, therefore, a device length required for receiving refracted light can be reduced, and the device capacity determined by the device size can be reduced. In the prior art using air between the device and fiber, with a module having a reduced device size to 10 $\mu$m×20 $\mu$m, high speed operation of more than a 3 dB bandwidth of 40 GHz could be confirmed. However, in this module, the responsivity was 0.8 A/W. This is because absorption in the photo-absorption layer is insufficient. Since high speed and responsivity are basically in a trade-off relation, a decrease in responsivity associated with high speed is inevitable to some extent, however, according to the present invention, it is possible to change the responsivity over a wide range even when the absorption layer is decreased in thickness for high speed operation. However, the operation speed is decreased to some extent by increasing the device capacitance associated with an increase in photo-detector length.

FIG. 29 shows a calculation result in InP of extension factor to absorption layer thickness of effective absorption length relative to refractive index ($n_1$) of the substance between the device and fiber when light of wavelength 1.55 $\mu$m is incident at a mesa angle of 55 degrees. The extension factor can be substantially increased by using a material having a large $n_1$. In the present embodiment, polyimide having a refractive index of 1.7 is used, the extension factor in this case provides a 41% increase relative to air, as a result, the above increase in responsivity is obtained. It is needless to say that the substance between the device and fiber may be any one which has a good transmissivity to incident light and a relative index of more than 1, selected from organic substances such as various polyimides including fluorinated polyimides, various epoxies including epoxy resins, fluorinated epoxies, fluorinated epoxy acrylate resins, acrylics, metamorphic silicone resins, and inorganic substances such as chalcogenide glass having a refractive index of more than 2, or a liquid substance such as oil. By appropriately selecting such various substances, it is possible to change the refraction angle at the light incident facet of the photo-detector, even when using a refraction type semiconductor photo-detector cut from the same wafer having the same layer structure and the same mesa angle construction, and adjustment of responsivity according to the application is possible.

As to the photo-detector, in the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon. Yet further, the present embodiment is an example using n-InP as the substrate, however, a p-InP layer can be used by reversing the above p and n, or a semi-insulating InP substrate can also be used in fabrication by considering the leading method of the electrode.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material system other than InGaAsP/InP such as InGaAlAs/InGaAsP or AlGaAs/GaAs system or a material system including a strain may be used.

Yet further, as to the optical waveguide, a single mode optical fiber is used in the present embodiment, however, alternatively, a lensed fiber, a tapered fiber, a silica-based waveguide circuit such as Planar Lightwave Circuit (PLC) or the like may be used.

Yet further, it is needless to say that a hybrid integrated construction of mounting a photo-detector on PLC may be used.

Yet further, it is needless to say that the waveguide is not only those based on various inorganic materials such as silica-based waveguide but may be those based on various organic materials such as polymer waveguide or plastic fiber.

Embodiment 21

Figure 32:
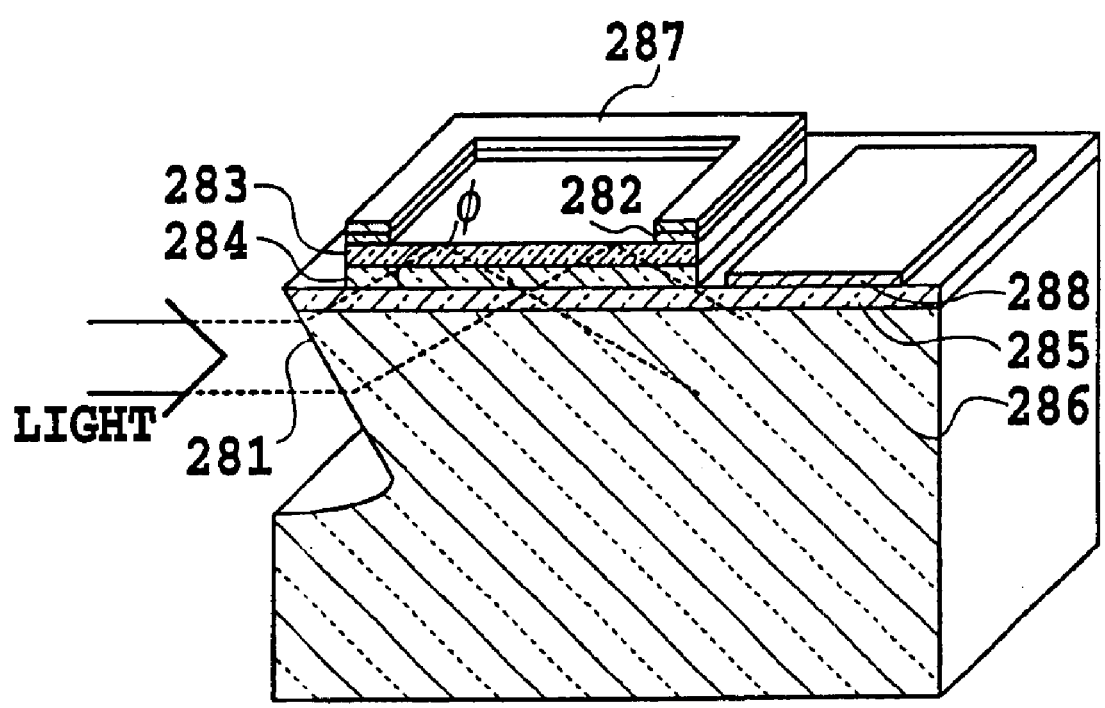
FIG. 32 is a perspective diagram showing a semiconductor photo-detector according to a twenty-first embodiment of the present invention.

A semiconductor photo-detector according to a twenty-first embodiment of the present invention is shown in FIG. 32.

In FIG. 32, a lead electrode and a pad electrode are omitted for simplicity since these parts are complicated in structure and intricate to be described.

This semiconductor photo-detector is a refraction type semiconductor photo-detector in which a photo-absorption part comprising a 1 $\mu$m thick n-InP layer 285, a 0.5 $\mu$m thick InGaAs photo-absorption layer 284, and a 1 $\mu$m thick p-InP layer 283 is successively stacked in this order on a semi-insulating InP substrate 286, and a light incident facet 281 which is inwardly angled as it separates from the surface side is provided on an end surface, so that incident light is refracted at the light incident facet 281 and transits the photo-absorption layer 284 diagonally with respect to the layer thickness direction. The device has a photo-absorption layer area of 30 $\mu$m×50 $\mu$m.

The light incident facet 281 was formed utilizing the property that the (111)A plane is formed in reverse-mesa shape of about 55 degrees as shown in the figure in wet etching of a (001) surface wafer with bromine-methanol.

Naturally, the reverse-mesa part may be formed using another wet etching liquid or a dry etching method, or utilizing other crystal plane, or utilizing adhesion of the etching mask to control the angle. An anti-reflection coating film is formed on the light incident facet 281.

Further, in the present embodiment, right above the main reaching area of refracted incident light in the upper layer of the photo-absorption layer 284 is terminated with air, and the p electrode 287 is formed in outer peripheral part of the area through the 0.2 $\mu$m thick $p^+$-InGaAsP (1.2 $\mu$m composition) layer 282.

Therefore, incident light of wavelength 1.3 $\mu$m from the lateral side is refracted at the light incident facet 281 and transits at an angle of φ=24.7 degrees relative to the upper surface as shown in the figure.

In this case, if the refractive index of the semiconductor is assumed as 3.209, total reflection occurs when ø is smaller than 71.8 degrees, and the present embodiment satisfies this condition.

When light of wavelength 1.3 $\mu$m was introduced by the single mode fiber, a large responsivity value of more than 0.9 A/W was obtained at an applied reverse bias of 1.0 V.

In the case of prior art structure in which the p electrode is present on almost the entire upper surface, a value of only about 0.7 A/W was obtained.

In the present embodiment, the p electrode 287 is formed in a ring shape, however, although the overall reflectivity is slightly decreased, it may be formed in any structure such as a reticulated electrode shape, or the upper InP/InGaAsP layer be remained as a high-concentration p doped layer to sufficiently decrease the sheet resistance, or the p electrode be formed in only one side part.

Further, when using a tapered fiber in place of the single mode fiber to reduce the device size (photo-absorption area 7 $\mu$m×20 $\mu$m, high speed operation of 3 dB band 50 GHz was possible while maintaining high responsivity.

In the present embodiment, right above the reaching area of incident light is terminated with air, however, it may be any of inorganic substances such as $SiO_2$ or SiNx or organic substances such as polyimide or epoxy, which has an appropriately smaller refractive index than the semiconductor and satisfies the total reflection condition ($\phi<\cos^{-1}(n_2/n_1)$; where $n_1$ is a refractive index of the semiconductor, and $n_2$ is a refractive index of the terminating substance).

For example, when a polyimide having a refractive index of 1.55 is used, ø may be smaller than 61.1 degrees.

In the present embodiment, the p-InP layer 283 at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using semi-insulating InP as the substrate and an n-InP layer at the substrate side, however, a p-InP layer can be used by reversing the above p and n, and an n-InP or p-InP substrate can also be used for the fabrication.

Yet further, a uniform composition bulk is used here as the photo-absorption layer, however, a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, a material system other than InGaAsP/InP such as InGaAlAs/InGaAsP or AlGaAs/GaAs system or a material system including a strain may be used.

Embodiment 22

Figure 33:
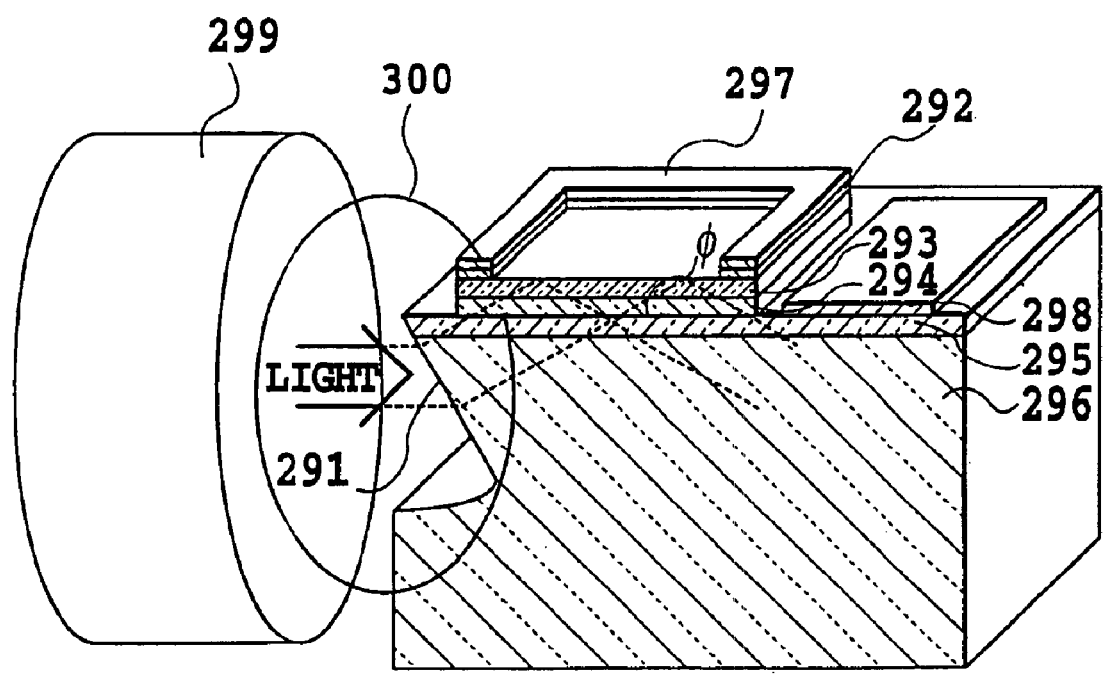
FIG. 33 is a perspective diagram showing a semiconductor photo-detector according to a twenty-second embodiment of the present invention.

FIG. 33 is a sectional perspective diagram for describing a twenty-second embodiment of the present invention. Numeral 291 indicates a light incident facet, 292 is a 0.2 μm thick p+-InGaAsP layer (1.2 μm composition), 293 is a 1 μm thick p-InP layer, 294 is a 0.5 μm thick InGaAs photo-absorption layer, 295 is a 1 μm thick n-InP layer, 296 is a semi-insulating InP substrate, 297 is a p electrode, 298 is an n electrode, 299 is a single mode optical fiber, and 300 is polyimide (refractive index 1.7). A lead electrode and a pad electrode are omitted in this figure for simplicity since these parts are complicated in structure and difficult to be described. The device has a photo-absorption layer area of 30 μm×70 μm. The light incident facet 291 was formed utilizing the property that the (111)A plane is formed in reverse-mesa shape of about 55 degrees as shown in the figure in wet etching of a (001) surface wafer with bromine-methanol.

Naturally, the reverse-mesa part may be formed using another wet etching liquid or a dry etching method, or utilizing other crystal plane, or utilizing adhesion of the etching mask to control the angle. An anti-reflection coating film is formed on the light incident facet. Right above the main reaching area of refracted incident light is terminated with air, and the p electrode 297 is formed in outer peripheral part of the area. Incident light of wavelength 1.55 μm from the lateral side is refracted at the light incident facet and transits at an angle of ø=17.1 degrees relative to the upper surface as shown in the figure. In this case, if the refractive index of the semiconductor is assumed as 3.17, total reflection occurs when ø is smaller than 71.6 degrees, and the present embodiment satisfies this condition.

In the present embodiment, the p electrode 297 is formed in a ring shape, however, it is needless to say that although the overall reflectivity is slightly decreased, it may be formed in any structure such as a reticulated electrode shape, or the upper InP/InGaAsP layer be remained as a high-concentration p doped layer to sufficiently decrease the sheet resistance, or the p electrode be formed in only one side part.

In the present embodiment, right above the reaching area of incident light is terminated with air, however, it may be any of inorganic substances such as $SiO_2$ or SiNx or organic substances such as polyimide or epoxy, which has an appropriately smaller refractive index than the semiconductor and satisfies the total reflection condition ($\phi<\cos^{31\ 1}(n_2/n_1)$; where $n_1$ is a refractive index of the semiconductor, and $n_2$ is a refractive index of the terminating substance). For example, when a polyimide having a refractive index of 1.55 is used, ø may be smaller than 60.7 degrees.

Further, in the present embodiment, after the single mode fiber is disposed opposite to the light incident facet as shown in the figure, the space in between is buried in with polyimide having a refractive index of 1.7. Still further, an anti-reflection coating film is formed on the photo-detector and the fiber end surface. When light of wavelength 1.55 μm was introduced by the single mode fiber, a large responsivity value of 1.0 A/W was obtained at an applied reverse bias of 1.5 V. The layer structure of the photo-detector of the present embodiment is designed for enabling high speed operation. That is, the photo-absorption layer is as thin as 0.5 μm, so that the carrier transit time is reduced. Yet further, the refraction angle is the largest when the medium between the device and the fiber is air, therefore, a device length required for receiving refracted light can be reduced, and the device capacity determined by the device size can be reduced. In the prior art using air between the device and fiber, with a module having a reduced device size to 10 μm×20 μm, high speed operation of more than a 3 dB bandwidth of 40 GHz could be confirmed. However, in this module, the responsivity was 0.8 A/W. This is because absorption in the photo-absorption layer is insufficient. Since high speed and responsivity are basically in a trade-off relation, a decrease in responsivity associated with high speed is inevitable to some extent, however, according to the present invention, it is possible to change the responsivity over a wide range even when the absorption layer is decreased in thickness for high speed operation. However, the operation speed is decreased to some extent by increasing the device capacitance associated with an increase in photo-detector length.

Figure 34:
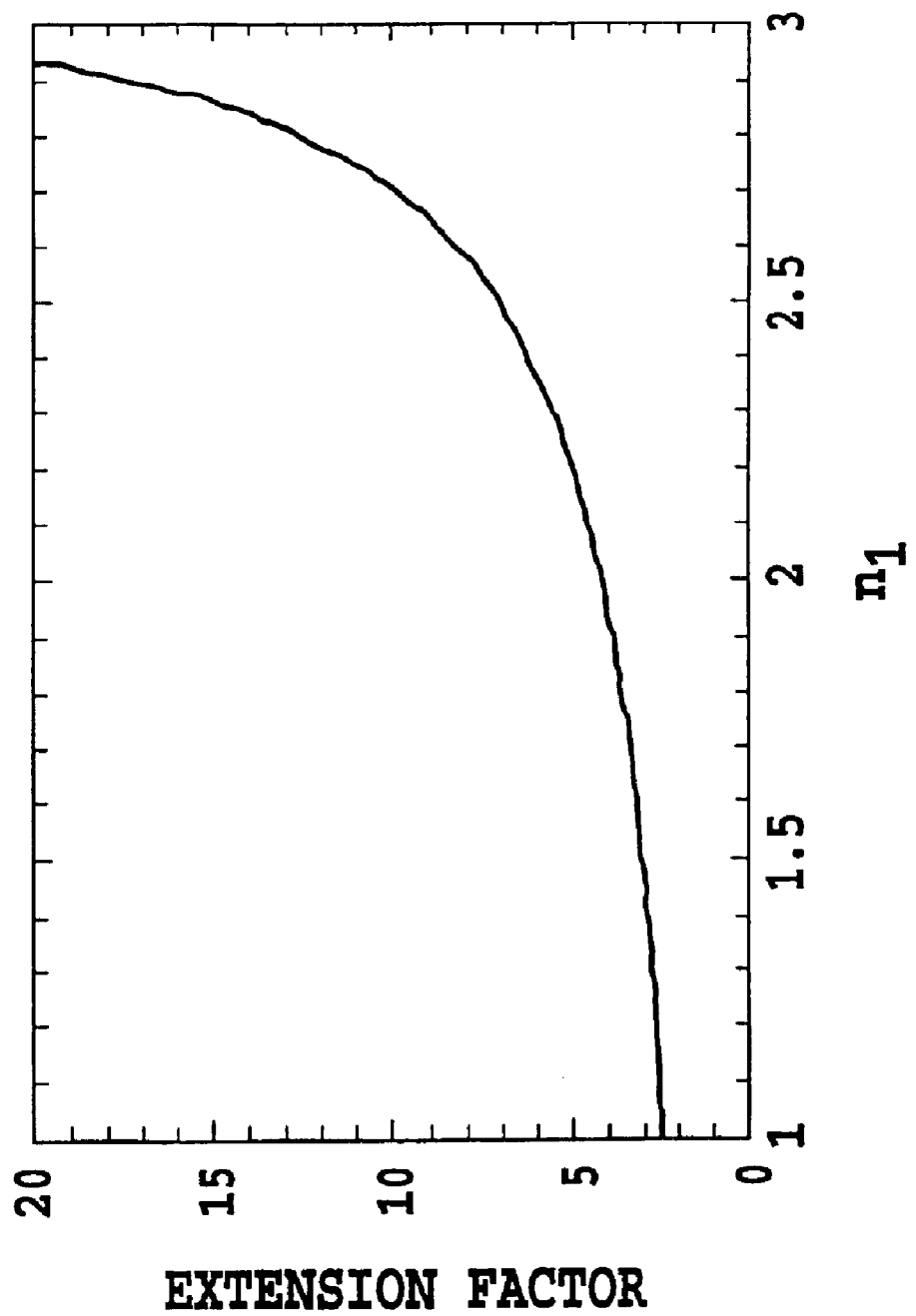
FIG. 34 is a graph showing a calculation result of extension factor to absorption layer thickness of effective absorption length relative to refractive index ($n_1$) of substance between the device and fiber when light of wavelength 1.55 μm is incident at a mesa angle of 55 degrees in a InP substrate of the semiconductor photo-detector in the twenty-second embodiment of the present invention.

FIG. 34 shows a calculation result in InP of extension factor to absorption layer thickness of effective absorption length relative to refractive index ($n_1$) of the substance between the device and fiber when light of wavelength 1.55 μm is incident at a mesa angle of 55 degrees. The extension factor can be substantially increased by using a material having a large $n_1$. In the present embodiment, polyimide having a refractive index of 1.7 is used, the extension factor in this case provides a 41% increase relative to air, as a result, the above increase in responsivity is obtained. It is needless to say that the substance between the device and fiber may be any one which has a good transmissivity to incident light and a relative index of more than 1, selected from organic substances such as various polyimides including fluorinated polyimides, various epoxies including epoxy resins, fluorinated epoxies, fluorinated epoxy acrylate resins, acrylics, metamorphic silicone resins, and inorganic substances such as chalcogenide glass having a refractive index of more than 2, or a liquid substance such as oil. By appropriately selecting such various substances, it is possible to change the refraction angle at the light incident facet of the photo-detector, even when using a refraction type semiconductor photo-detector cut from the same wafer having the same layer structure and the same mesa angle construction, and adjustment of responsivity according to the application is possible.

As to the photo-detector, in the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using n-InP as the substrate, however, a p-InP layer can be used by reversing the above p and n, or a semi-insulating InP substrate can also be used in fabrication by considering the leading method of the electrode. Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used. Yet further, it is needless to say that a material system other than InGaAsP/InP such as InGaAlAs/InGaAsP or AlGaAs/GaAs system or a material system including a strain may be used.

Yet further, as to the optical waveguide, a single mode optical fiber is used in the present embodiment, however, alternatively, a lensed fiber, a tapered fiber, a silica-based waveguide circuit such as Planar Lightwave Circuit (PLC) or the like may be used.

Yet further, it is needless to say that a hybrid integrated construction of mounting a photo-detector on PLC may be used.

Yet further, it is needless to say that the waveguide is not only those based on various inorganic materials such as silica-based waveguide but may be those based on various organic materials such as polymer waveguide or plastic fiber.

Embodiment 23

Figure 35:
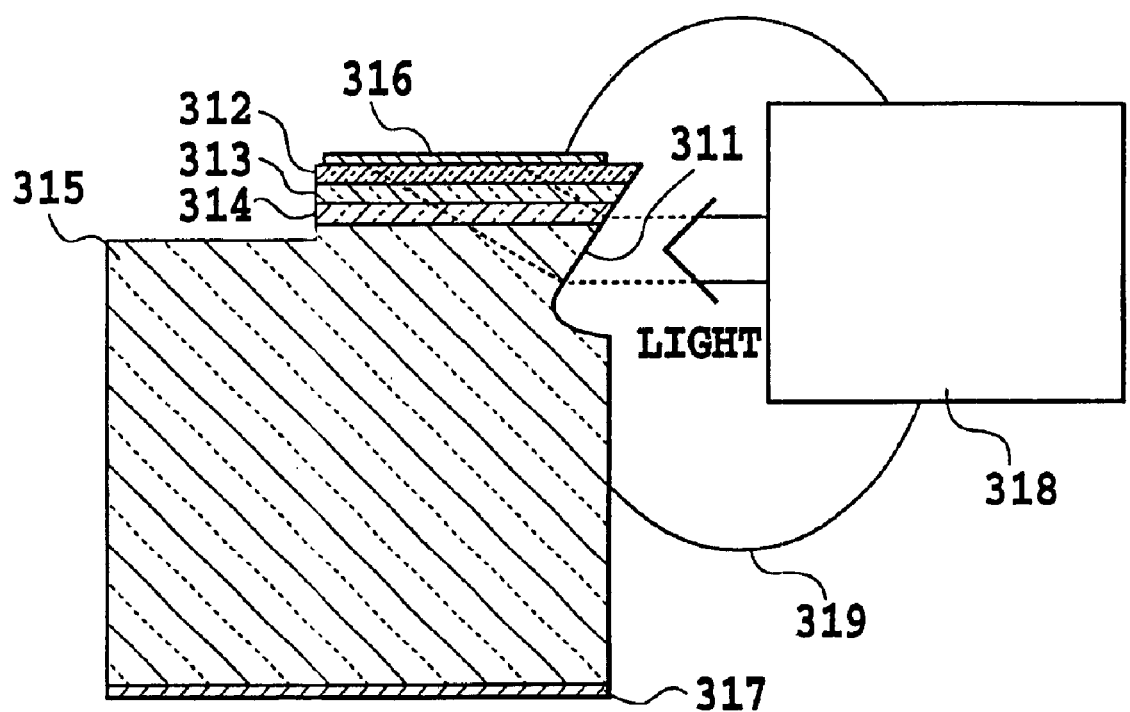
FIG. 35 is a perspective diagram showing a semiconductor photo-detection device according to a twenty-third embodiment of the present invention.

A semiconductor photo-detection device according to a twenty-third embodiment of the present invention is shown in FIG. 35.

In this semiconductor photo-detection device, as shown in FIG. 35, a light incident facet 311 of a refraction type semiconductor photo-detector and a single mode optical fiber 318 are disposed opposite to each other, and space in between is buried in with polyimide 319.

The refraction type semiconductor photo-detector has a structure in which a 1 $\mu$m thick p-InP layer 312, a 0.7 $\mu$m thick InGaAs photo-absorption layer 313, and a 1 $\mu$m thick n-InP layer 314 are stacked on an n-InP substrate 315 to form a semiconductor multilayer structure, and an end surface of which is provided with an inwardly angled light incident facet 311 so that incident light transits the photo-absorption layer diagonally. Further, a p electrode 316 and an n electrode 317 are provided on upper and lower surfaces of the device. The device has a photo-absorption layer area of 30 $\mu$m×70 $\mu$m.

The light incident facet 311 was formed utilizing the property that the (111)A plane is formed in reverse-mesa shape of about 55 degrees as shown in the figure in wet etching of a (001) surface wafer with bromine-methanol.

Naturally, the reverse-mesa part may be formed using another wet etching liquid or a dry etching method, or utilizing other crystal plane, or utilizing adhesion of the etching mask to control the angle.

Refractive index of polyimide 319 for filling between the single mode optical fiber 318 and the light incident facet 311 is greater than 1, which is about 1.7.

Further, an anti-reflection coating film is formed on the photo-detector and the fiber end surface.

When light of wavelength 1.55 $\mu$m was introduced by the single mode fiber 318, a large responsivity value of 1.0 A/W was obtained at an applied reverse bias of 1.5 V.

Still further, the layer structure of the photo-detector of the present embodiment is designed for enabling high speed operation.

That is, the photo-absorption layer is as thin as 0.7 $\mu$m, so that the carrier transit time is reduced.

Yet further, the refraction angle is the largest when the medium between the device and the fiber is air, therefore, a device length required for receiving refracted light can be reduced, and the device capacitance determined by the device size can be reduced.

In the prior art using air between the device and fiber, with a module having a reduced device size to 10 $\mu$m×20 $\mu$m, high speed operation of more than a 3 dB bandwidth of 40 GHz could be confirmed.

However, in this module, the responsivity was 0.8 A/W. This is because absorption in the photo-absorption layer 313 is insufficient.

Since high speed and responsivity are basically in a trade-off relation, a decrease in responsivity associated with high speed is inevitable to some extent, however, according to the present invention, it is possible to change the responsivity over a wide range even when the absorption layer is decreased in thickness for high speed operation.

However, the operation speed is decreased to some extent by increasing the device capacitance associated with an increase in photo-detector length.

Figure 36:
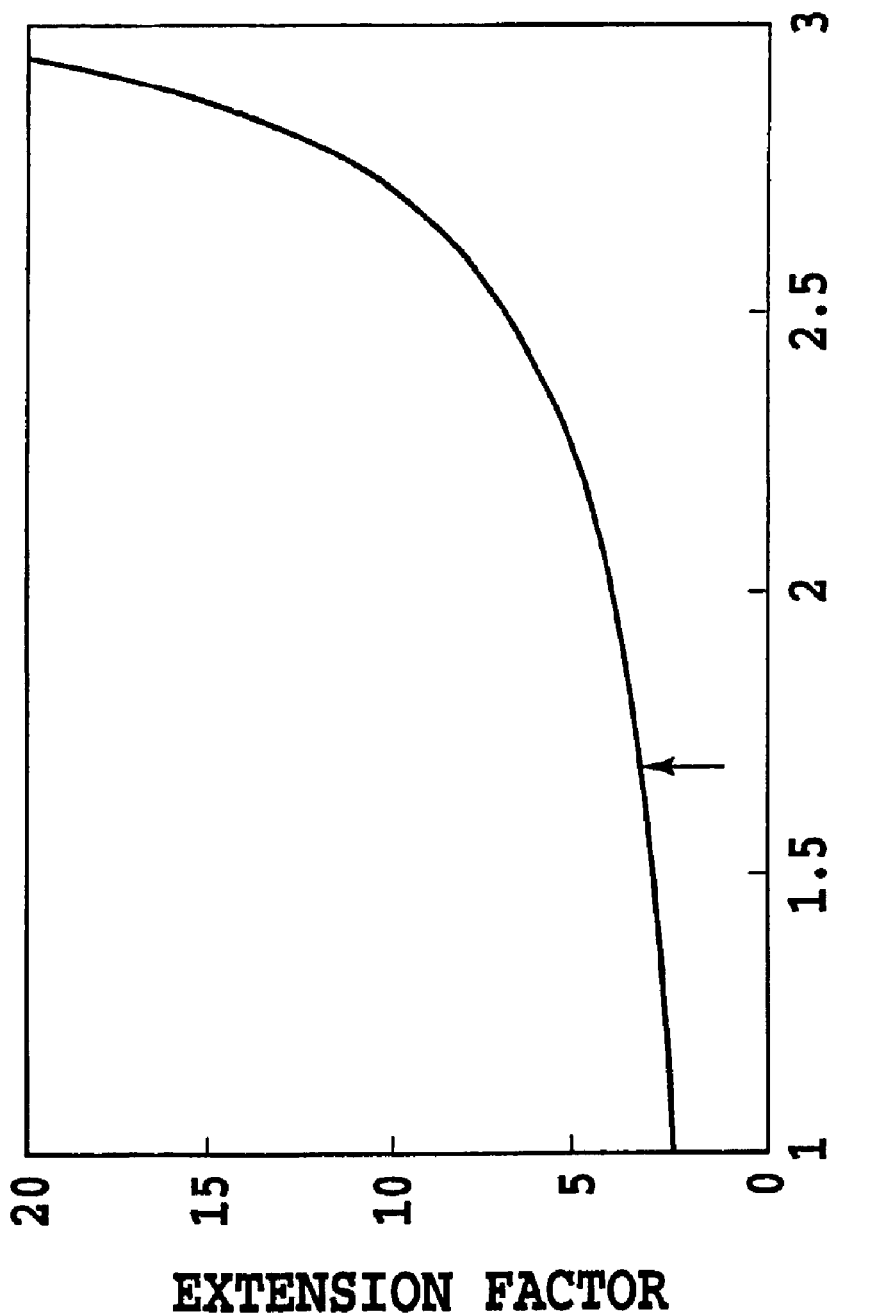
FIG. 36 is a graph showing a calculation result of extension factor to absorption layer thickness of effective absorption length relative to refractive index ($n_1$) of substance between the device and fiber when light of wavelength 1.55 μm is incident at a mesa angle of 55 degrees in a InP substrate of the semiconductor photo-detector in the twenty-third embodiment of the present invention.

FIG. 36 shows a calculation result in InP of extension factor to absorption layer thickness of effective absorption length relative to refractive index ($n_1$) of the substance between the device and fiber when light of wavelength 1.55 $\mu$m is incident at a mesa angle of 55 degrees.

Figure 37:
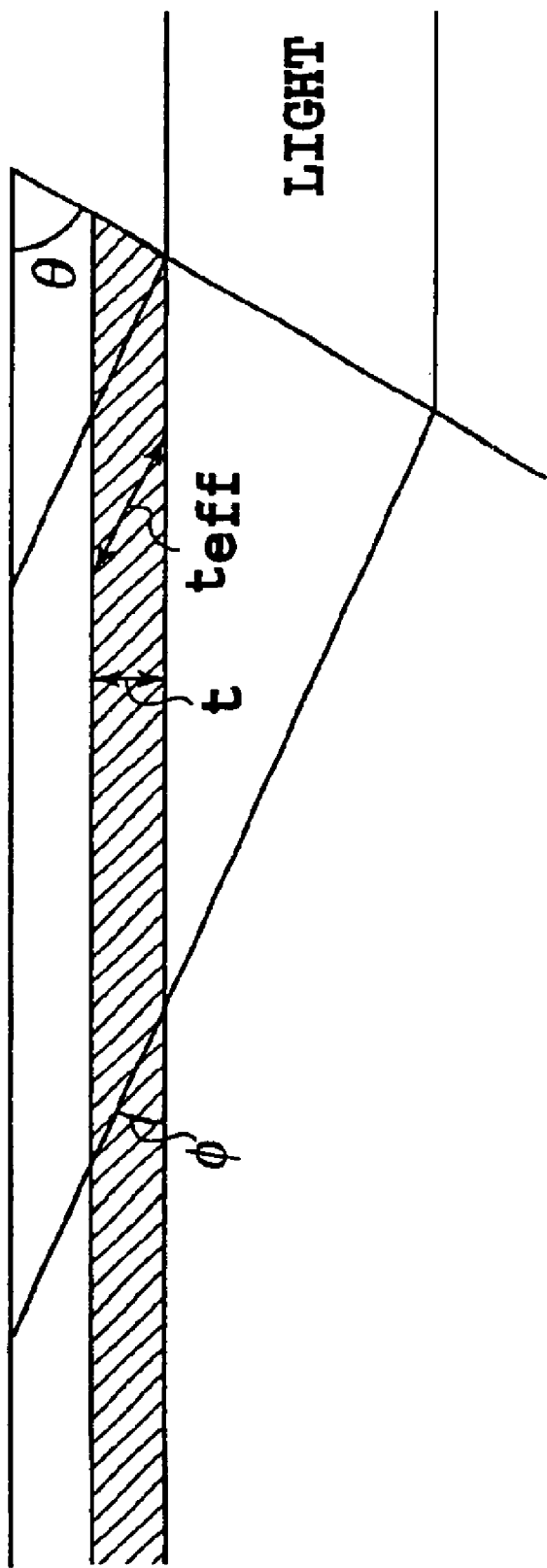
FIG. 37 is an enlarged diagram of the light incident facet part of the semiconductor photo-detection device according to the twenty-third embodiment of the present invention.

The extension factor, as shown in FIG. 37 which is an enlarged diagram of the light incident facet part, is given by 1/sin$\phi$ as an extension factor of an effective absorption length teff to an absorption layer thickness t, where $\phi$ is an angle of refracted light to the absorption layer.

Therefore, it can be seen that the extension factor can be substantially increased by using a material having a large $n_1$.

In the present embodiment, polyimide having a refractive index of 1.7 is used, the extension factor in this case provides a 41% increase relative to air, as a result, the above increase in responsivity is obtained.

The substance between the device and fiber may be any one which has a good transmissivity to incident light and a relative index of more than 1, selected from organic substances such as various polyimides including fluorinated polyimides, various epoxies including epoxy resins, fluorinated epoxies, fluorinated epoxy acrylate resins, acrylics, metamorphic silicone resins, and inorganic substances such as chalcogenide glass having a refractive index of more than 2, or a liquid substance such as oil.

By appropriately selecting such various substances, it is possible to change the refraction angle at the light incident facet of the photo-detector, even when using a refraction type semiconductor photo-detector cut from the same wafer having the same layer structure and the same mesa angle construction, and adjustment of responsivity according to the application is possible.

As to the photo-detector, in the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal.

Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using n-InP as the substrate, however, a p-InP layer can be used by reversing the above p and n, or a semi-insulating InP substrate can also be used in fabrication by considering the leading method of the electrode.

Yet further, a uniform composition bulk is used here as the photo-absorption layer, however, a SAGM (Separate-absorption-graded-multiplication) structure or a SAM-SL (Separate absorption and multiplication superlattice) structure (used in an avalanche photodiode) or a semiconductor layer of other superlattice structure or the like may be used.

Yet further, a material system other than InGaAsP/InP such as InGaAlAs/InGaAsP or AlGaAs/GaAs system or a material system including a strain may be used.

Yet further, as to the optical waveguide, a single mode optical fiber is used in the present embodiment, however, alternatively, a lensed fiber, a tapered fiber, a silica-based waveguide circuit such as Planar Lightwave Circuit (PLC) or the like may be used.

Yet further, a hybrid integrated construction of mounting a photo-detector on PLC may be used.

Yet further, the waveguide is not only those based on various inorganic materials such as silica-based waveguide but may be those based on various organic materials such as polymer waveguide or plastic fiber.

Embodiment 24

Figure 38:
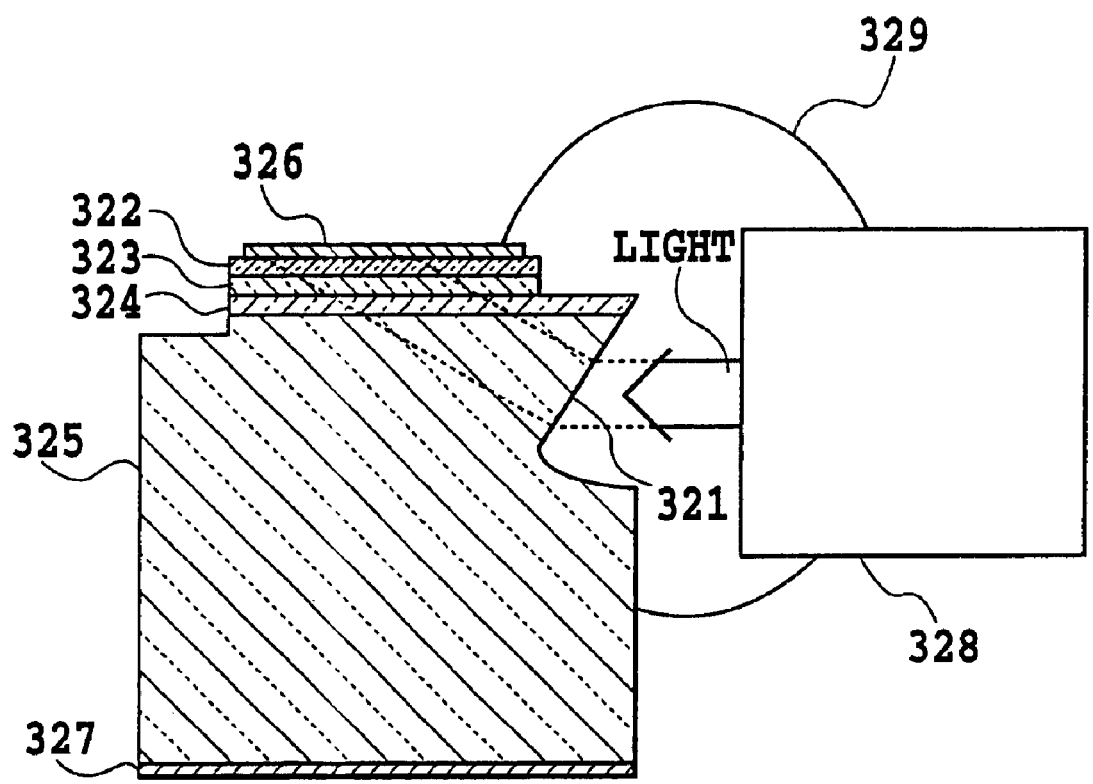
FIG. 38 is a perspective diagram showing a semiconductor photo-detection device according to a twenty-fourth embodiment of the present invention.

FIG. 38 is a diagram for describing a twenty-fourth embodiment of the present invention. Numeral 321 indicates a light incident facet, 322 is a 1 μthick p-InP layer, 323 is a 0.7 μm thick InGaAs layer, 324 is a 1 μm thick n-InP layer, 325 is an n-InP substrate, 326 is a p electrode, 327 is an n electrode, 328 is a single mode optical fiber, and 329 is polyimide. The device has a photo-absorption layer area of 30 μm×70 μm. The light incident facet was formed utilizing the property that the (111)A plane is formed in reverse-mesa shape of about 55 degrees as shown in the figure in wet etching of a (001) surface wafer with bromine-methanol.

Since, in this case, reverse-mesa etching is performed on the n-InP layer 324 and the InP substrate 325 which are composed only of InP, a uniform angled light incident facet of good flatness can be formed with a good yield. Further, an etching mask is formed at a position 8 μm apart from the photo-absorption part including the photo-absorption layer, and deep reverse-mesa etching of about 30 μm is performed, in this case, side etching of about 3 μm occurs, however, the photo-absorption part does not contact the side etching part, therefore, abnormal side etching, etching irregularity or the like caused by relatively fast etching speed of the photo-absorption layer will not generate. In addition, uniform devices with equal mesa angle can be fabricated.

Naturally, the reverse-mesa part may be formed using another wet etching liquid or a dry etching method, or utilizing other crystal plane, or utilizing adhesion of the etching mask to control the angle. After the single mode fiber is disposed opposite to the light incident facet as shown in the figure, the space in between is buried in with polyimide having a refractive index of 1.7.

Further, an anti-reflection coating film-is formed on the photo-detector and the fiber end surface. When light of wavelength 1.55 μm was introduced by the single mode fiber, a large responsivity value of 1.0 A/W was obtained at an applied reverse bias of 1.5 V.

Still further, the layer structure of the photo-detector of the present embodiment is designed for enabling high speed operation. That is, the photo-absorption layer is as thin as 0.7 μm, so that the carrier transit time is reduced.

Yet further, the refraction angle is the largest when the medium between the device and the fiber is air, therefore, a device length required for receiving refracted light can be reduced, and the device capacitance determined by the device size can be reduced. In the prior art using air between the device and fiber, with a module having a reduced device size to 10 μm×20 μm, high speed operation of more than a 3 dB bandwidth of 40 GHz could be confirmed. However, in this module, the responsivity was 0.8 A/W. This is because absorption in the photo-absorption layer is insufficient. Since high speed and responsivity are basically in a trade-off relation, a decrease in responsivity associated with high speed is inevitable, to some extent, however, according to the present invention, it is possible to change the responsivity over a wide range even when the absorption layer is decreased in thickness for high speed operation. However, the operation speed is decreased to some extent by increasing the device capacitance associated with an increase in photo-detector length.

FIG. 36 shows a calculation result in InP of extension factor to absorption layer thickness of effective absorption length relative to refractive index ($n_1$) of the substance between the device and fiber when, as described above, light of wavelength 1.55 μm is incident at a mesa angle of 55 degrees. The extension factor can be substantially increased by using a material having a large $n_1$. In the present embodiment, polyimide having a refractive index of 1.7 is used, the extension factor in this case provides a 41% increase relative to air, as a result, the above-described increase in responsivity is obtained. It is needless to say that the substance between the device and fiber may be any one which has a good transmissivity to incident light and a relative index of more than 1, selected from organic substances such as various polyimides including fluorinated polyimides, various epoxies including epoxy resins, fluorinated epoxies, fluorinated epoxy acrylate resins, acrylics, metamorphic silicone resins, and inorganic substances such as chalcogenide glass having a refractive index of more than 2, or a liquid substance such as oil. By appropriately selecting such various substances, it is possible to change the refraction angle at the light incident facet of the photo-detector, even when using a refraction type semiconductor photo-detector cut from the same wafer having the same layer structure and the same mesa angle construction, and adjustment of responsivity according to the application is possible.

As to the photo-detector, in the present embodiment, the p-InP layer at the surface side is formed by crystal growth, however, alternatively, an undoped InP layer may be formed in crystal growth, and the conduction type of the main part at the surface side be determined by Zn diffusion or an ion implantation method and subsequent anneal. Further, as the semiconductor photo-detector part, on a semiconductor layer having a first conduction type, a multilayer structure having a large schottky-barrier height opposing a schottky electrode which has a schottky-barrier higher than the schottky barrier between the photo-absorption layer and the schottky electrode may be constructed on the substrate, between the photo-absorption layer comprising an intrinsic or first conduction type semiconductor layer, a superlattice semiconductor layer, or a multiple quantum well semiconductor layer and the schottky electrode, and a semiconductor photo-detector may be constructed with the semiconductor layer of large schottky barrier height comprising $In_{1-x-y}Ga_xAl_yAs$ ($0 \leq x \leq 1$, $0 \leq y \leq 1$) or $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

Yet further, the present embodiment is an example using n-InP as the substrate, however, a p-InP layer can be used by reversing the above p and n, or a semi-insulating InP substrate can also be used in fabrication by considering the leading method of the electrode.

Yet further, a uniform composition bulk is used here as the photo-absorption layer, however, it is needless to say that a Separate-absorption-graded-multiplication (SAGM) structure or a Separate absorption and multiplication superlattice (SAM-SL) structure (used in an avalanche photodiode) or a semiconductor layer of other superlattice structure or the like may be used.

Yet further, it is needless to say that a material-system other than InGaAsP/InP such as InGaAlAs/InGaAsP or AlGaAs/GaAs system or a material system including a strain may be used.

Yet further, as to the optical waveguide, a single mode optical fiber is used in the present embodiment, however, alternatively, a lensed fiber, a tapered fiber, a silica-based waveguide circuit such as Planar Lightwave Circuit (PLC) or the like may be used.

Yet further, it is needless to say that a hybrid integrated construction of mounting a photo-detector on PLC may be used.

Yet further, it is needless to say that the waveguide is not only those based on various inorganic materials such as silica-based waveguide but may be those based on various organic materials such as polymer waveguide or plastic fiber.

The present invention has been described in detail with respect to preferred embodiments, and it will now be apparent from the foregoing to those skilled in the art that changes and modifications may be made without departing from the invention in its broader aspects, and it is the intention, therefore, in the appended Claims to cover all such changes and modifications as fall within the true spirit of the invention.

What is claimed is:

1. A semiconductor photo-detection device, comprising:
   a semiconductor photo-detector comprising:
      a first semiconductor layer having a first conduction type, a second semiconductor layer having a second conduction type, and a photo-absorption part comprising a photo-absorption layer sandwiched between said first semiconductor layer and said second semiconductor layer disposed on a substrate having a top surface and an end surface meeting at an edge;
      at least said photo-absorption layer being spaced from said edge of said substrate adjoining said end surface;
      a light incident facet on said end surface forming an acute angle with said top surface;
   an optical waveguide disposed opposing said light incident facet; and
   a solid or liquid interposed between said light incident facet and said optical waveguide;
   wherein incident light from said optical waveguide applied to said light incident facet is refracted at said light incident facet and transits said photo-absorption layer at an angle with respect to an orthogonal of said photo-absorption layer.

2. A semiconductor photo-detection device, comprising:
   a semiconductor photo-detector comprising:
      an intrinsic or a first conduction type semiconductor layer, a photo-absorption layer comprising a superlattice semiconductor layer or a multiple quantum well semiconductor layer, and a schottky electrode which are disposed on a substrate having a top surface and an end surface meeting at an edge;
      said photo-absorption layer being spaced from said edge of said substrate adjoining said end surface;
      a semiconductor multilayer structure of large schottky-barrier height having a schottky barrier higher in schottky banier height than a schottky barrier between said photo-absorption layer and said schottky electrode being formed between said photo-absorption layer and said schottky electrode; and
      a light incident facet on said end surface forming an acute angle with said top surface;
   an optical waveguide disposed opposing said light incident facet; and
   a solid or liquid interposed between said light incident facet and said optical waveguide;
   wherein incident light from said optical waveguide applied to said light incident facet is refracted at said light incident facet and transits said photo-absorption layer at an angle with respect to an orthogonal of said photo-absorption layer.

3. The semiconductor photo-detection device as claimed in claim 1, wherein said semiconductor layer of large schottky-barrier height comprises $In_{1-x-y}Ga_xAl_yAs$ ($0 \leq x \leq 1$, $0 \leq y \leq 1$).

4. The semiconductor photo-detection device as claimed in claim 2, wherein said semiconductor layer of large schottky-barrier height comprises $In_{1-x-y}Ga_xAl_yAs$ ($0 \leq x \leq 1$, $0 \leq y \leq 1$) and thin $In_{1-u}Ga_uAs_{1-v}P_v$ ($0 \leq u \leq 1$, $0 \leq v \leq 1$) disposed thereon.

5. The semiconductor photo-detection device as claimed in claim 2, wherein a compositionally graded or step-graded layer from the same composition as said photo-absorption layer to the same composition as said semiconductor layer of large schottky-barrier height is disposed between said photo-absorption layer and said semiconductor layer of large schottky-barrier height.

6. A semiconductor photo-detection device comprising:
a semiconductor photo-detector comprising:
a substrate having a top surface and an end surface meeting at an edge;
a photo-absorption part comprising a semiconductor multilayer structure including a photo-absorption layer provided on said top surface of said substrate and spaced from said edge;
a light incident facet on said end surface forming an acute angle with said top surface; and
a V- or U-shaped groove opposed to said light incident facet,
an optical waveguide disposed in said groove and opposing said light incident facet; and
a solid or liquid interposed between said light incident facet and said optical waveguide;
wherein incident light from said optical waveguide applied to said light incident facet is refracted at said light incident facet and transits said photo-absorption layer at an angle with respect to an orthogonal of said photo-absorption layer.

7. The semiconductor photo-detection device as claimed in claim 6, wherein said light incident facet and said V- or U-shaped groove are fabricated simultaneously by etching.

8. A semiconductor photo-detection device comprising:
a semiconductor photo-detector comprising:
a substrate having a top surface and an end surface meeting at an edge;
a photo-absorption part comprising a semiconductor multilayer structure including a photo-absorption layer provided on said top surface of said substrate;
a light incident facet on said end surface forming an acute angle with said top surface; and
said end surface including an abutting surface positioned below and spaced laterally from said light incident facet and said edge for receiving an optical waveguide to contribute to precisely positioning said optical waveguide;
a solid or liquid interposed between said light incident facet and said optical waveguide;
wherein said incident light from said optical waveguide applied to said light incident facet is refracted at said light incident facet and transits said photo-absorption layer at an angle with respect to an orthogonal of said photo-absorption layer.

9. A semiconductor photo-detection device comprising:
a semiconductor photo-detector comprising:
a substrate having a top surface and an end surface meeting at an edge;
a photo-absorption part comprising a semiconductor multilayer structure including a photo-absorption layer provided on said top surface of said substrate;
a light incident facet on said end surface forming an acute angle with said top surface; and
an upper layer over said photo-absorption layer in said photo-absorption part being terminated with a substance having a smaller refractive index than a semiconductor layer,
a solid or liquid interposed between said light incident facet and said optical waveguide;
wherein incident light from said optical waveguide applied to said light incident facet is refracted at said light incident facet and transits said photo-absorption layer at an angle with respect to an orthogonal of said photo-absorption layer such that said transit light is totally reflected by said smaller refractive index substance terminating said upper layer.

10. The semiconductor photo-detection device as claimed in claim 3, wherein a compositionally graded or step-graded layer from the same composition as said photo-absorption layer to the same composition as said semiconductor layer of large schottky-barrier height is disposed between said photo-absorption layer and said semiconductor layer of large schottky-barrier height.

11. The semiconductor photo-detection device as claimed in claim 4, wherein a compositionally graded or step-graded layer from the same composition as said photo-absorption layer to the same composition as said semiconductor layer of large schottky-barrier height is disposed between said photo-absorption layer and said semiconductor layer of large schottky-barrier height.

12. The semiconductor photo-detection device as claimed in claim 1, wherein said solid or liquid is an organic substance.

13. The semiconductor photo-detection device as claimed in claim 2, wherein said solid or liquid is an organic substance.

14. The semiconductor photo-detection device as claimed in claim 6, wherein said solid or liquid is an organic substance.

15. The semiconductor photo-detection device as claimed in claim 8, wherein said solid or liquid is an organic substance.

16. The semiconductor photo-detection device as claimed in claim 9, wherein said solid or liquid is an organic substance.

* * * * *